(12) United States Patent
Isobe et al.

(10) Patent No.: US 9,496,375 B2
(45) Date of Patent: Nov. 15, 2016

(54) METHOD FOR MANUFACTURING SEMICONDUCTOR DEVICE

(71) Applicant: SEMICONDUCTOR ENERGY LABORATORY CO., LTD., Atsugi-shi, Kanagawa-ken (JP)

(72) Inventors: Atsuo Isobe, Kanagawa (JP); Kunio Hosoya, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/831,972

(22) Filed: Aug. 21, 2015

(65) Prior Publication Data
US 2015/0380529 A1    Dec. 31, 2015

Related U.S. Application Data

(60) Continuation of application No. 14/578,578, filed on Dec. 22, 2014, now Pat. No. 9,117,662, which is a
(Continued)

(30) Foreign Application Priority Data

Feb. 7, 2012  (JP) ................. 2012-024010

(51) Int. Cl.
*H01L 21/336* (2006.01)
*H01L 29/66* (2006.01)
(Continued)

(52) U.S. Cl.
CPC ..... *H01L 29/66969* (2013.01); *H01L 21/0237* (2013.01); *H01L 21/02178* (2013.01);
(Continued)

(58) Field of Classification Search
CPC .................. H01L 21/02244; H01L 29/7869
See application file for complete search history.

(56) References Cited

U.S. PATENT DOCUMENTS

| 5,528,032 A | 6/1996 | Uchiyama |
| 5,731,856 A | 3/1998 | Kim et al. |

(Continued)

FOREIGN PATENT DOCUMENTS

| EP | 1737044 A | 12/2006 |
| EP | 2226847 A | 9/2010 |

(Continued)

OTHER PUBLICATIONS

Asakuma.N et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.

(Continued)

*Primary Examiner* — Zandra Smith
*Assistant Examiner* — Andre' C Stevenson
(74) *Attorney, Agent, or Firm* — Fish & Richardson P.C.

(57) ABSTRACT

To improve productivity of a transistor that includes an oxide semiconductor and has good electrical characteristics. In a top-gate transistor including a gate insulating film and a gate electrode over an oxide semiconductor film, a metal film is formed over the oxide semiconductor film, oxygen is added to the metal film to form a metal oxide film, and the metal oxide film is used as a gate insulating film. After an oxide insulating film is formed over the oxide semiconductor film, a metal film may be formed over the oxide insulating film. Oxygen is added to the metal film to form a metal oxide film and added also to the oxide semiconductor film or the oxide insulating film.

25 Claims, 23 Drawing Sheets

Related U.S. Application Data division of application No. 13/755,862, filed on Jan. 31, 2013, now Pat. No. 8,916,424.

(51) Int. Cl.

| | | |
|---|---|---|
| *H01L 21/02* | (2006.01) | |
| *H01L 21/441* | (2006.01) | |
| *H01L 29/51* | (2006.01) | |
| *H01L 29/417* | (2006.01) | |
| *H01L 29/786* | (2006.01) | |
| *H01L 27/12* | (2006.01) | |
| *H01L 21/383* | (2006.01) | |
| *H01L 21/425* | (2006.01) | |
| *H01L 21/4757* | (2006.01) | |
| *H01L 29/24* | (2006.01) | |
| *H01L 29/49* | (2006.01) | |
| *H01L 27/108* | (2006.01) | |
| *H01L 27/11* | (2006.01) | |
| *H01L 27/115* | (2006.01) | |

(52) U.S. Cl.
CPC ... *H01L 21/02244* (2013.01); *H01L 21/02565* (2013.01); *H01L 21/383* (2013.01); *H01L 21/425* (2013.01); *H01L 21/441* (2013.01); *H01L 21/47573* (2013.01); *H01L 27/1225* (2013.01); *H01L 29/24* (2013.01); *H01L 29/41733* (2013.01); *H01L 29/495* (2013.01); *H01L 29/4908* (2013.01); *H01L 29/517* (2013.01); *H01L 29/7869* (2013.01); *H01L 27/10873* (2013.01); *H01L 27/1108* (2013.01); *H01L 27/1156* (2013.01)

(56) References Cited

U.S. PATENT DOCUMENTS

| | | | |
|---|---|---|---|
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,015,550 B2 | 3/2006 | Sugimae et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 8,334,148 B2 * | 12/2012 | Jeong | H01L 27/228 257/E21.665 |
| 8,461,007 B2 | 6/2013 | Yamazaki | |
| 8,530,289 B2 | 9/2013 | Yamazaki | |
| 8,546,225 B2 | 10/2013 | Yamazaki | |
| 8,811,064 B2 | 8/2014 | Yamazaki et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0113972 A1 | 6/2003 | Hayashi et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0117074 A1 * | 5/2010 | Yamazaki | H01L 29/66742 257/43 |
| 2010/0224871 A1 | 9/2010 | Yamaguchi et al. | |
| 2011/0006349 A1 * | 1/2011 | Ota | H01L 21/26586 257/288 |
| 2011/0095288 A1 | 4/2011 | Morosawa et al. | |
| 2011/0212570 A1 | 9/2011 | Yamazaki et al. | |
| 2011/0303913 A1 | 12/2011 | Yamazaki et al. | |
| 2012/0001170 A1 | 1/2012 | Yamazaki | |
| 2012/0187397 A1 | 7/2012 | Yamazaki et al. | |
| 2012/0231580 A1 | 9/2012 | Yamazaki et al. | |
| 2012/0315730 A1 | 12/2012 | Koezuka et al. | |
| 2013/0092924 A1 | 4/2013 | Sasagawa et al. | |

(56) References Cited

U.S. PATENT DOCUMENTS

| | | | |
|---|---|---|---|
| 2013/0126862 A1 | 5/2013 | Yamazaki | |
| 2013/0146870 A1 | 6/2013 | Yamazaki | |
| 2013/0157422 A1 | 6/2013 | Yamazaki | |
| 2013/0161610 A1 | 6/2013 | Yamazaki | |
| 2013/0161611 A1 | 6/2013 | Yamazaki et al. | |
| 2013/0196468 A1 | 8/2013 | Yamazaki | |
| 2013/0330877 A1 | 12/2013 | Yamazaki | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 A | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| JP | 2010-016163 A | 1/2010 |
| WO | WO-2004/114391 | 12/2004 |

OTHER PUBLICATIONS

Asaoka.Y et al., "29.1: Polarizer-Free Reflective LCD Combined With Ultra Low-Power Driving Technology", SID Digest '09: SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back Plane", SID Digest '09: SID International Symposium Digest of Technical Pepers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Fung.T et al., "2-D Numerical Simulation of High Performance Amorphous In—Ga—Zn-O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09: SID International Symposium Digest of Technical Papers, May 31, 2009, pp. 1110-1112.

Godo.H et al., "Temperature Dependence of Characteristics and Electronic Structure For Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08: SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", J. Sco. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07: SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08: SID International Symposium Digest of Technical Papers, May 20, 2008, vol. 39, pp. 1277-1280.

Ikeda.T et al., "Full-Functional System Liquid Crystal Display Using Cg-Silicon Technology", SID Digest '04: SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08: SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09: SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09: SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07: SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and SC2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits, 2008, vol. 43, No. 1, pp. 292-299.

(56) References Cited

OTHER PUBLICATIONS

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06: Proceedings of the 13th International Display Workshops, Dec. 7, 2006, pp. 663-666.

Lee.J et al., "World's Largest (15-Inch) XGA AMLCD Panel Using IgZO Oxide TFT", SID Digest '08: SID International Symposium Digest of Technical Papers, May 20, 2008, vol. 39, pp. 625-628.

Lee.M et al., "15.4:Excellent Performance of Indium—Oxide-Based Thin-Film Transistors by DC Sputtering", SID Digest '09: SID International Symposium Digest of Technical Papers, May 31, 2009, pp. 191-193.

Li.C et al., "Modulated Structures of Homologous Compounds InMO3(ZnO)m (M=In, Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07: SID International Digest of Technical Papers, 2007, vol. 38, pp. 1673-1676.

Mo.Y et al., "Amorphous Oxide TFT Backplanes for Large Size AMOLED Displays", IDW '08: Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09: SID International Symposium Digest of Technical Papers, May 31, 2009, vol. 40, pp. 899-902.

Oba.F et al., "Defect energetics in ZnO: A hybrid Hartree-Fock density functional study", Phys. Rev. B. (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn—Oxide TFTs With a Novel Passivation Layer", SID Digest '09: SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Oxide TFTs and Their Application for Large size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08: SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn—Oxide TFTs", IDW '09: Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08: SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02: Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

* cited by examiner

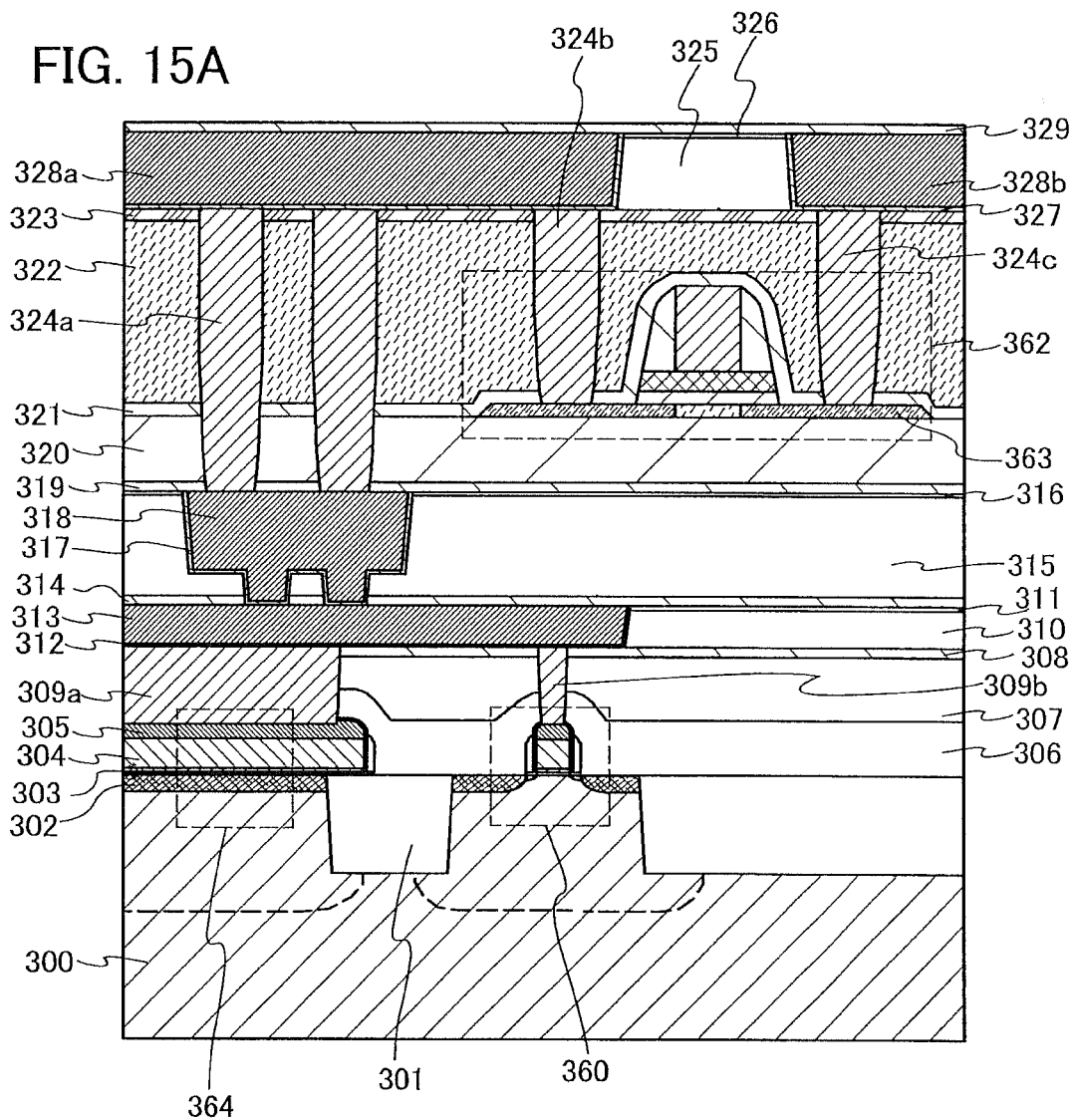

METHOD FOR MANUFACTURING SEMICONDUCTOR DEVICE

CROSS-REFERENCE TO RELATED APPLICATIONS

This application is a divisional of U.S. application Ser. No. 14/578,578, filed Dec. 22, 2014, now allowed, which is a divisional of U.S. application Ser. No. 13/755,862, filed Jan. 31, 2013, now U.S. Pat. No. 8,916,424, which claims the benefit of a foreign priority application filed in Japan as Serial No. 2012-024010 on Feb. 7, 2012, all of which are incorporated by reference.

BACKGROUND OF THE INVENTION

1. Field of the Invention

The present invention relates to a method for manufacturing a semiconductor device.

In this specification, a semiconductor device means all types of devices that can function by utilizing semiconductor characteristics, and an electro-optical device and a semiconductor integrated circuit are semiconductor devices.

2. Description of the Related Art

A transistor whose channel region includes a semiconductor thin film over an insulating surface is applied to a wide range of electronic devices such as an integrated circuit (IC) or an image display device (display device). A silicon-based semiconductor material is widely known as a material for a semiconductor thin film applicable to the transistor. In recent years, attention has been drawn to a technique by which a transistor whose channel region includes an oxide semiconductor instead of silicon to be applied to an electronic device or an optical device. For example, Patent Document 1 and Patent Document 2 disclose a technique by which a transistor is manufactured using zinc oxide or an In—Ga—Zn-based oxide as an oxide semiconductor to be used as a switching element of pixel or the like of an image display device.

It has been pointed out that by entry of impurities such as hydrogen, an electrically shallow donor level is formed and electrons to be carriers are generated in an oxide semiconductor. As a result, the threshold voltage of a transistor including an oxide semiconductor is shifted in the negative direction and the transistor becomes normally-on, so that leakage current in a state where voltage is not applied to the gate (that is, in the off state) is increased. Thus, the entry of hydrogen into an oxide semiconductor film is suppressed by providing an aluminum oxide film having a property of blocking hydrogen over the entire region of a substrate so as to cover a channel region in the oxide semiconductor film, a source electrode, and a drain electrode, so that generation of leakage current is suppressed (see Patent Document 3).

REFERENCE

Patent Document

[Patent Document 1] Japanese Published Patent Application No. 2007-123861

[Patent Document 2] Japanese Published Patent Application No. 2007-096055

[Patent Document 3] Japanese Published Patent Application No. 2010-016163

SUMMARY OF THE INVENTION

As described in Patent Document 3, in general, an aluminum oxide film can be formed by a sputtering method or an atomic layer deposition (ALD) method.

However, in the case where an aluminum oxide film is formed by a sputtering method, powder aluminum oxide is generated in a treatment chamber of a sputtering apparatus. Entry of the powder aluminum oxide into a deposited film causes reduction in yield.

In the case where an aluminum oxide film is formed by an atomic layer deposition method, a forming process and an oxidization process of an aluminum layer with an atomic-layer-level thickness are alternately performed, which results in extremely long deposition time and markedly low throughput.

In the case of forming a transistor including an oxide semiconductor, oxygen in an oxide semiconductor film is released from a side surface of the oxide semiconductor film by etching treatment for processing the oxide semiconductor film into a desired shape, exposure of the side surface of the oxide semiconductor film to a reduced-pressure atmosphere, or the like; consequently, oxygen vacancies are formed. Oxygen vacancies become a source for supplying carriers; thus, a region where the oxygen vacancies are formed in the oxide semiconductor film affects the electrical characteristics of the transistor. In particular, in the case where the region where oxygen vacancies are formed is located between a source and a drain, an unintended path of carriers, that is, a parasitic channel is generated. A parasitic channel region generated in a side surface of the oxide semiconductor film has a higher carrier concentration (smaller resistance) than a channel region in the oxide semiconductor film that is intentionally formed, which causes a negative shift in the threshold voltage of the parasitic channel region. Thus, in the case where the parasitic channel in the side surface and the channel in the film are formed, the transistor shows the same electrical characteristics as in the case where transistors are formed in parallel. A current-voltage curve that seems to be found by two current-voltage curves overlapping with each other is measured. The two current-voltage curves have different values in the threshold voltage. As a result, the threshold voltage of the whole transistor seems to be shifted in the negative direction. Further, leakage current flows when a voltage lower than the threshold voltage of the channel in the film is applied to a gate electrode.

Thus, an object of one embodiment of the present invention is to improve productivity of a transistor that includes an oxide semiconductor having good electrical characteristics.

One embodiment of the present invention is a method for manufacturing a top-gate transistor that includes a gate insulating film and a gate electrode over an oxide semiconductor film. The method includes the steps of forming a metal film over the oxide semiconductor film, adding oxygen to the metal film to form a metal oxide film, and using the metal oxide film as the gate insulating film. After an oxide insulating film is formed over the oxide semiconductor film, the metal film may be formed over the oxide insulating film. Oxygen can be added to the metal film to form a metal oxide film and added also to the oxide semiconductor film or the oxide insulating film that is in contact with the metal film.

According to another embodiment of the present invention, a protective film is provided over a top-gate transistor including an oxide semiconductor film. The protective film is formed in such a manner that a metal film is formed over the transistor, oxygen is added to the metal film to form a metal oxide film, and the metal oxide film is used as a protective film. After an oxide insulating film is formed over the transistor, the metal film may be formed over the oxide insulating film. Oxygen can be added to the metal film to form the metal oxide film and added also to the oxide insulating film that is in contact with the metal film.

Another embodiment of the present invention is a method for manufacturing a semiconductor device including the following steps: an oxide semiconductor film is formed over an oxide insulating film; the oxide semiconductor film is etched to form an island-shaped oxide semiconductor film; a metal film is formed over the island-shaped oxide semiconductor film; oxygen is added to the metal film to form a metal oxide film and added also to the island-shaped oxide semiconductor film; a gate electrode is formed over the metal oxide film; sidewalls are formed in contact with side surfaces of the gate electrode; part of a metal oxide film where the gate electrode and the sidewalls do not overlap is etched; an interlayer insulating film is formed over the gate electrode, the sidewalls, and the island-shaped oxide semiconductor film; and pair of contact plugs electrically connected to the island-shaped oxide semiconductor film through openings formed in the interlayer insulating film is formed.

Another embodiment of the present invention is a method for manufacturing a semiconductor device including the following steps: an oxide semiconductor film is formed over a first oxide insulating film; the oxide semiconductor film is etched to form an island-shaped oxide semiconductor film; a second oxide insulating film is formed over the island-shaped oxide semiconductor film; a metal film is formed over the second oxide insulating film; oxygen is added to the metal film to form a metal oxide film and added also to the second oxide insulating film; a gate electrode is formed over the metal oxide film; sidewalls are formed in contact with side surfaces of the gate electrode; part of a metal oxide film where the gate electrode and the sidewalls do not overlap is etched; an interlayer insulating film is formed over the gate electrode, the sidewalls, and the island-shaped oxide semiconductor film; and pair of contact plugs electrically connected to the island-shaped oxide semiconductor film through openings formed in the interlayer insulating film is formed.

Another embodiment of the present invention is a method for manufacturing a semiconductor device including the following steps: an oxide semiconductor film is formed over a first oxide insulating film; the oxide semiconductor film is etched to form an island-shaped oxide semiconductor film; an insulating film is formed over the island-shaped oxide semiconductor film; a gate electrode is formed over the insulating film; sidewalls are formed in contact with side surfaces of the gate electrode; part of the insulating film where the gate electrode and the sidewalls do not overlap is etched to form a gate insulating film; a second oxide insulating film is formed over the gate electrode, the sidewalls, and the island-shaped oxide semiconductor film; a metal film is formed over the second oxide insulating film; oxygen is added to the metal film to form a metal oxide film and added also to the second oxide insulating film; an interlayer insulating film is formed over the metal oxide film; and pair of contact plugs electrically connected to the island-shaped oxide semiconductor film through openings formed in the interlayer insulating film, the metal oxide film, and the second oxide insulating film is formed.

Another embodiment of the present invention is a method for manufacturing a semiconductor device including the following steps: an oxide semiconductor film is formed over a first oxide insulating film; the oxide semiconductor film is etched to form an island-shaped oxide semiconductor film; a second oxide insulating film is formed over the island-shaped oxide semiconductor film; a first metal film is formed over the second oxide insulating film; oxygen is added to the first metal film to form a first metal oxide film and added also to the second oxide insulating film; a gate electrode is formed over the first metal oxide film; sidewalls are formed in contact with side surfaces of the gate electrode; part of the first metal oxide film where the gate electrode and the sidewalls do not overlap is etched; a third oxide insulating film is formed to cover the gate electrode, the sidewalls, and the island-shaped oxide semiconductor film; a second metal film is formed over the third oxide insulating film; oxygen is added to the second metal film to form a second metal oxide film and added also to the third oxide insulating film; an interlayer insulating film is formed over the second metal oxide film; and pair of contact plugs electrically connected to the island-shaped oxide semiconductor film through openings formed in the interlayer insulating film, the second metal oxide film, and the third oxide insulating film is formed.

Another embodiment of the present invention is a method for manufacturing a semiconductor device including the following steps: an oxide semiconductor film is formed over a first oxide insulating film; the oxide semiconductor film is etched to form an island-shaped oxide semiconductor film; a first metal film is formed over the island-shaped oxide semiconductor film; oxygen is added to the first metal film to form a first metal oxide film and added also to the island-shaped oxide semiconductor film; a gate electrode is formed over the first metal oxide film; sidewalls are formed in contact with side surfaces of the gate electrode; part of the first metal oxide film where the gate electrode and the sidewalls do not overlap is etched; a second oxide insulating film is formed over the gate electrode, the sidewalls, and the island-shaped oxide semiconductor film; a second metal film is formed over the second oxide insulating film; oxygen is added to the second metal film to form a second metal oxide film and added also to the second oxide insulating film; an interlayer insulating film is formed over the second metal oxide film; and pair of contact plugs electrically connected to the island-shaped oxide semiconductor film through openings formed in the interlayer insulating film, the second metal oxide film, and the second oxide insulating film is formed.

By adding oxygen to the metal film by an ion implantation method, an ion doping method, a plasma immersion ion implantation method, plasma treatment, or the like, the metal film is oxidized, so that a metal oxide film can be formed. The oxygen addition treatment may be performed while heating is performed. In comparison with the case of forming a metal oxide film formed by deposition, forming a metal oxide film by adding oxygen to a metal film can suppress generation of powder contaminants and therefore can improve yield. Thus, forming a metal oxide film by adding oxygen to a metal film is suitable for mass production.

Further, a metal film is formed over the oxide semiconductor film, and oxygen can be added to the metal film and added also to the oxide semiconductor film.

The metal oxide film is used as a gate insulating film of a transistor including an oxide semiconductor film. Since oxygen can be added to a metal film and added also to the oxide semiconductor film, oxygen vacancies in the oxide semiconductor film can be reduced.

A metal film is formed over the oxide insulating film, so that oxygen can be added to the metal film and added also to the oxide insulating film or the oxide semiconductor film.

The oxide insulating film and the metal oxide film to which oxygen is added are used as a gate insulating film of a transistor including an oxide semiconductor film. That is, the oxide insulating film in contact with the oxide semiconductor film contains the oxygen. Further, the metal oxide film functions as an oxygen diffusion prevention film. Accordingly, oxygen in the oxide insulating film can be efficiently diffused into the oxide semiconductor film by heat treatment so that oxygen vacancies in the oxide semiconductor film can be reduced.

An oxide insulating film is formed over a top-gate transistor including an oxide semiconductor film and a metal film is formed over the oxide insulating film; after that, oxygen can be added to the metal film and added also to the oxide insulating film. That is, the oxide insulating film contains the oxygen. Further, the metal oxide film functions as an oxygen diffusion prevention film. Accordingly, the oxygen in the oxide insulating film can be efficiently diffused into the oxide semiconductor film by heat treatment so that oxygen vacancies in the oxide semiconductor film can be reduced. The metal oxide film also functions as a film for preventing entry of hydrogen, water, and the like; thus, entry of hydrogen, water, and the like from the outside to the oxide semiconductor film in the transistor can be suppressed. Therefore, leakage current of the transistor can be reduced.

In particular, oxygen vacancies in a side surface of the oxide semiconductor film are compensated by diffusion of the oxygen, so that generation of a parasitic channel can be suppressed. As a result, leakage current between the source electrode and the drain electrode flowing through the side surface of the oxide semiconductor film overlapping with the gate electrode can be reduced.

With one embodiment of the present invention, a transistor having small leakage current and having excellent electrical characteristics can be manufactured with high productivity.

BRIEF DESCRIPTION OF THE DRAWINGS

FIGS. 15A and 15B are a cross-sectional view and a circuit diagram illustrating a semiconductor device according to one embodiment of the present invention.

DETAILED DESCRIPTION OF THE INVENTION

Figure 1A:
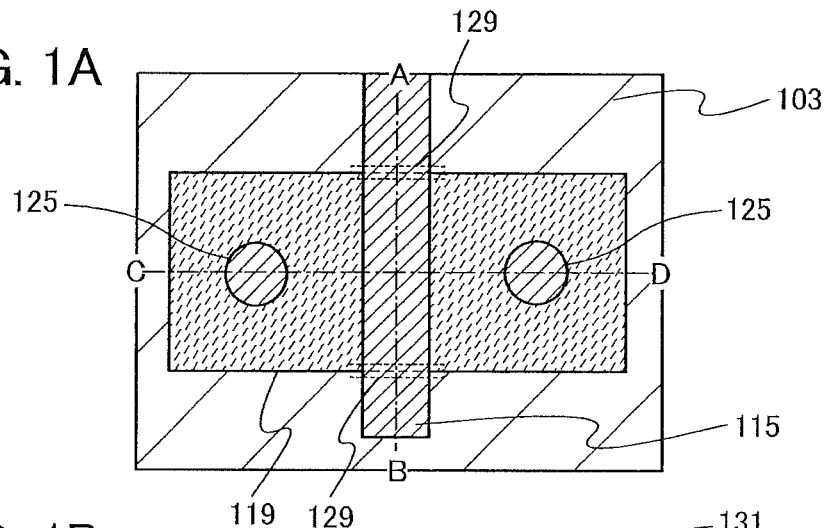
FIGS. 1A to 1C are a top view and cross-sectional views illustrating a semiconductor device according to one embodiment of the present invention.

Embodiments of the invention are described below with reference to the accompanying drawings. Note that the present invention is not limited to the description below, and it is easily understood by those skilled in the art that various changes and modifications can be made without departing from the spirit and scope of the present invention. Therefore, the invention should not be construed as being limited to the description in the following embodiments. Note that the same portions or portions having the same function in the structure of the present invention described below are denoted by the same reference numerals in common among different drawings and repetitive description thereof is omitted.

Note that in each drawing described in this specification, the size, the film thickness, or the region of each component is exaggerated for clarity in some cases. Therefore, embodiments of the present invention are not limited to such scales.

Note that terms such as "first", "second", and "third" in this specification are used in order to avoid confusion among components, and the terms do not limit the components numerically. Therefore, for example, the term "first" can be replaced with the term "second", "third", or the like as appropriate.

Embodiment 1

In this embodiment, a structure of a transistor having excellent electrical characteristics and a method for manufacturing the transistor with high productivity are described with reference to FIGS. 1A to 1C, FIGS. 2A to 2H, FIGS. 3A to 3F, and FIGS. 4A to 4H.

Figure 1B:
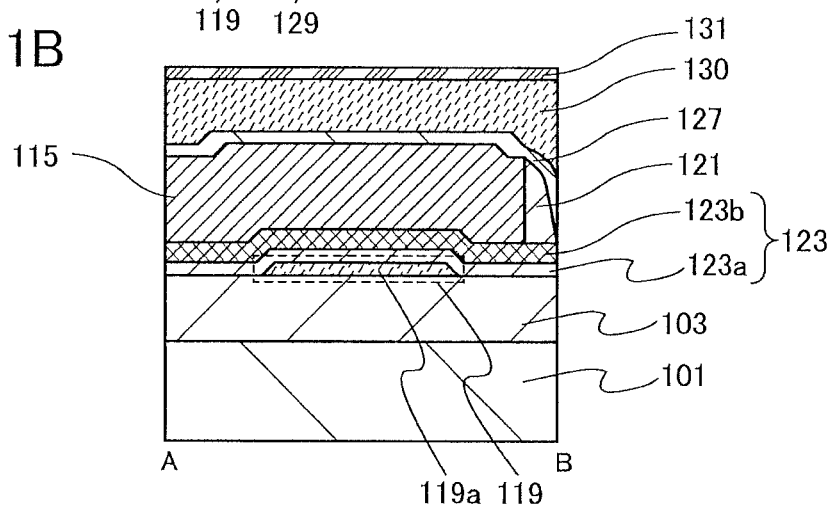
Figure 1C:
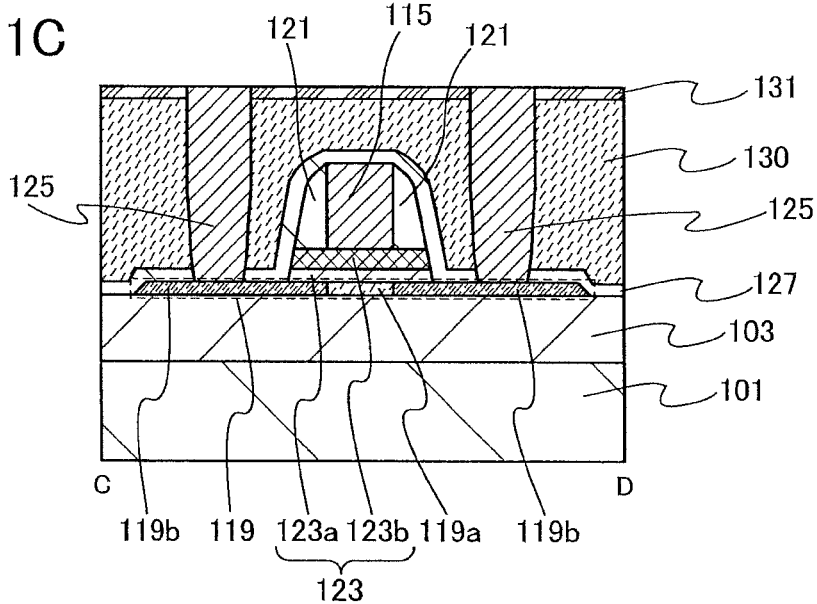

FIGS. 1A to 1C are a top view and cross-sectional views of a transistor described in this embodiment. FIG. 1A is a top view of the transistor described in this embodiment. FIG. 1B is a cross-sectional view in the channel width direction of the transistor taken along dashed-dotted line A-B in FIG. 1A. FIG. 1C is a cross-sectional view in the channel length direction of the transistor taken along dashed-dotted line C-D in FIG. 1A. Note that in FIG. 1A, illustration of some components of the transistor (e.g., a gate insulating film 123, sidewalls 121, an insulating film 127, and an interlayer insulating film 130) is omitted for clarity.

The transistor illustrated in FIGS. 1A to 1C includes an oxide insulating film 103 over a substrate 101, an oxide semiconductor film 119 over the oxide insulating film 103, a pair of contact plugs 125 that is electrically connected to the oxide semiconductor film 119 and functions as a source electrode and a drain electrode, the gate insulating film 123 in contact with at least part of the oxide semiconductor film 119, and a gate electrode 115 provided over the gate insulating film 123 to overlap with the oxide semiconductor film 119.

Further, the transistor includes the sidewalls 121 in contact with side surfaces of the gate electrode 115. The oxide semiconductor film 119 includes a first region 119a overlapping with the gate electrode 115 and a pair of second regions 119b between which the first region 119a is provided and which contains dopants. The second regions 119b have a lower resistance than a channel region. In the oxide semiconductor film 119, the first region 119a serves as a channel region. In the pair of second regions 119b containing the dopants, regions overlapping with the sidewalls 121 are offset regions, and regions not overlapping with the sidewalls 121 including regions in contact with the pair of contact plugs 125 serve as a source region and a drain region. The transistor includes the insulating film 127 over the oxide insulating film 103, the gate electrode 115, and the sidewalls 121, and the interlayer insulating film 130 and an interlayer insulating film 131 over the insulating film 127. Although not illustrated, a cap insulating film may be provided over the gate electrode 115. The pair of contact plugs 125 is embedded in openings formed in the insulating film 127 and the interlayer insulating films 130 and 131.

In the transistor illustrated in FIGS. 1A to 1C, the gate insulating film 123 has a stacked-layer structure of the oxide insulating film 123a in contact with the oxide semiconductor film 119 and the metal oxide film 123b in contact with the gate electrode 115. The metal oxide film 123b is formed using a metal oxide film formed by adding oxygen to a metal film.

There is no particular limitation on the property of a material and the like of the substrate 101 as long as the material has heat resistance enough to withstand at least heat treatment to be performed later. For example, a glass substrate, a ceramic substrate, a quartz substrate, a sapphire substrate, or the like may be used as the substrate 101. Alternatively, a single crystal semiconductor substrate or a polycrystalline semiconductor substrate made of silicon, silicon carbide, or the like, a compound semiconductor substrate made of silicon germanium or the like, an SOI substrate, or the like may be used as the substrate 101. Furthermore, any of these substrates further provided with a semiconductor element may be used as the substrate 101.

Still further alternatively, a flexible substrate may be used as the substrate 101, and the oxide insulating film 103 and the transistor may be provided directly on the flexible substrate. Alternatively, a separation layer may be provided between the substrate 101 and the oxide insulating film 103. The separation layer can be used when part or the whole of a semiconductor device formed over the separation layer is separated from the substrate 101 and transferred onto another substrate. In such a case, the semiconductor device can be transferred to a substrate having low heat resistance or a flexible substrate as well.

The oxide insulating film 103 is preferably formed using an oxide insulating film from which part of oxygen is released by heating. The oxide insulating film from which part of oxygen is released by heating is preferably an oxide insulating film that contains oxygen at a proportion exceeding the stoichiometric proportion. The oxide insulating film from which part of oxygen is released by heating can diffuse oxygen into the oxide semiconductor film by heating. Typical examples of the first oxide insulating film 103 are films of silicon oxide, silicon oxynitride, silicon nitride oxide, gallium oxide, hafnium oxide, yttrium oxide, aluminum oxide, aluminum oxynitride, and the like.

The thickness of the oxide insulating film 103 is greater than or equal to 50 nm, preferably greater than or equal to 200 nm and less than or equal to 1000 nm, more preferably greater than or equal to 300 nm and less than or equal to 500 nm. With use of the thick oxide insulating film 103, the amount of oxygen released from the oxide insulating film 103 can be increased, and the interface state at an interface between the oxide insulating film 103 and the oxide semiconductor film 119 to be formed later can be reduced.

Here, "to release part of oxygen by heating" means that the amount of released oxygen is greater than or equal to $1.0 \times 10^{18}$ atoms/cm$^3$, preferably greater than or equal to $3.0 \times 10^{20}$ atoms/cm$^3$ in thermal desorption spectroscopy (TDS) on an oxygen atom basis.

Here, a method for measuring the amount of released oxygen on an oxygen atom basis using TDS analysis is described.

The amount of released gas in TDS analysis is proportional to the integral value of a spectrum. Therefore, the amount of released gas can be calculated from the ratio of the integral value of a spectrum of the insulating film to the reference value of a standard sample. The reference value of a standard sample refers to the ratio of the density of a predetermined atom contained in a sample to the integral value of a spectrum.

For example, the number of the released oxygen molecules ($N_{O2}$) from an insulating film can be calculated according to Formula 1 using the TDS analysis results of a silicon wafer containing hydrogen at a predetermined density, which is the standard sample, and the TDS analysis results of the insulating film. Here, all spectra having a mass number of 32 that are obtained by the TDS analysis are assumed to originate from an oxygen molecule. CH$_3$OH can be given as a gas having a mass number of 32, but is not taken into consideration on the assumption that it is unlikely to be present. Further, an oxygen molecule including an oxygen atom having a mass number of 17 or 18, which is an isotope of an oxygen atom, is also not taken into consideration because the proportion of such a molecule in the natural world is minimal.

$$N_{O2} = N_{H2} / S_{H2} \times S_{O2} \times \alpha \qquad \text{(Formula 1)}$$

$N_{H2}$ is the value obtained by conversion of the number of hydrogen molecules released from the standard sample into density. $S_{H2}$ is an integral value of a spectrum of the standard sample that is analyzed by TDS. Here, the reference value of the standard sample is set to $N_{H2}/S_{H2}$. $S_{O2}$ is an integral value of a spectrum when the insulating film is analyzed by TDS. α is a coefficient affecting the intensity of the spectrum in the TDS analysis. For details of Formula 1, Japanese Published Patent Application No. H6-275697 is referred to. Note that the amount of released oxygen from the above insulating film is measured with a thermal desorption spectroscopy apparatus produced by ESCO Ltd., EMD-WA1000S/W using a silicon wafer containing hydrogen atoms at $1 \times 10^{16}$ atoms/cm$^2$ as the standard sample.

Further, in the TDS analysis, part of oxygen is detected as an oxygen atom. The ratio between oxygen molecules and oxygen atoms can be calculated from the ionization rate of oxygen molecules. Note that, since the above α is determined in consideration of the ionization rate of oxygen molecules, the number of the released oxygen atoms can also be estimated through the evaluation of the number of the released oxygen molecules.

Note that $N_{O2}$ is the number of the released oxygen molecules. The amount of released oxygen on an oxygen atom basis is twice the number of the released oxygen molecules.

In the above structure, the insulating film from which oxygen is released by heating may be oxygen-excess silicon oxide (SiO$_X$ (X>2)). In the oxygen-excess silicon oxide (SiO$_X$ (X>2)), the number of oxygen atoms per unit volume is more than twice the number of silicon atoms per unit volume. The number of silicon atoms and the number of oxygen atoms per unit volume are measured by Rutherford backscattering spectrometry.

By supplying oxygen from the oxide insulating film 103 to the oxide semiconductor film 119, the interface state at the interface between the oxide insulating film 103 and the oxide semiconductor film 119 can be reduced. As a result, capture of electric charge that may be generated due to operation of a transistor or the like at the interface between the oxide insulating film 103 and the oxide semiconductor film 119 can be suppressed. Thus, it is possible to provide a transistor with less electrical characteristic deterioration, in which negative shift of the threshold voltage can be reduced.

Further, electric charge may be generated owing to oxygen vacancies in the oxide semiconductor film 119 in some cases. In general, part of oxygen vacancies in the oxide semiconductor film serves as a donor to generate an electron that is a carrier. As a result, the threshold voltage of the transistor shifts in the negative direction. This tendency is remarkable in oxygen vacancies caused on the backchannel side. Note that the term "back channel" in this specification refers to the vicinity of an interface of the first region 119a in the oxide semiconductor region 119 on the oxide insulating film 103 side in FIG. 1B. By supplying sufficient oxygen from the oxide insulating film 103 to the oxide semiconductor film 119, oxygen vacancies in the oxide semiconductor film 119 that are a cause of negative shift of the threshold voltage can be compensated.

In other words, when oxygen vacancies are generated in the oxide semiconductor film 119, electric charge is captured at the interface between the oxide insulating film 103 and the oxide semiconductor film 119, whereby the electric charge affects the electrical characteristics of the transistor. However, by providing an insulating film from which oxygen is released by heating as the oxide insulating film 103, the interface state between the oxide semiconductor film 119 and the oxide insulating film 103 and oxygen vacancies in the oxide semiconductor film 119 can be reduced, and an influence of the capture of electric charge at the interface between the oxide semiconductor film 119 and the oxide insulating film 103 can be made small.

The oxide semiconductor film 119 preferably contains at least indium (In) or zinc (Zn). Alternatively, the oxide semiconductor film 119 preferably contains both In and Zn. In order to reduce variation in electrical characteristics of the transistor including the oxide semiconductor film, the oxide semiconductor film 119 preferably contains one or more of stabilizers in addition to In and/or Zn.

As a stabilizer, gallium (Ga), tin (Sn), hafnium (Hf), aluminum (Al), zirconium (Zr), and the like can be given.

As another stabilizer, lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) can be given.

As the oxide semiconductor, for example, any of the following can be used: indium oxide; tin oxide; zinc oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; and a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Note that here, for example, an "In—Ga—Zn-based oxide" means an oxide containing In, Ga, and Zn as its main component and there is no particular limitation on the ratio of In:Ga:Zn. The In—Ga—Z-based oxide may contain another metal element in addition to In, Ga, and Zn.

Alternatively, a material represented by a chemical formula, InMO$_3$(ZnO)$_m$ (m>0, in is not an integer) may be used as an oxide semiconductor. Note that M represents one or more metal elements selected from Ga, Fe, Mn, and Co. Alternatively, as the oxide semiconductor, a material expressed by a chemical formula, In$_2$SnO$_5$(ZnO)$_n$ (n>0, n is an integer) may be used.

For example, an In—Ga—Zn-based oxide with an atomic ratio of In:Ga:Zn=1:1:1 (=1/3:1/3:1/3), 2:2:1 (=2/5:2/5:1/5), or 3:1:2 (=1/2:1/6:1/3), or an oxide with an atomic ratio close to the above atomic ratios can be used. Alternatively, an In—Sn—Zn-based oxide with an atomic ratio of In:Sn:Zn=1:1:1 (=1/3:1/3:1/3), 2:1:3 (=1/3:1/6:1/2), or 2:1:5 (=1/4:1/8:5/8), or an oxide with an atomic ratio close to the above atomic ratios may be used.

However, without limitation to the materials given above, a material with an appropriate composition may be used depending on needed electrical characteristics (e.g., mobility, threshold voltage, and variation). In order to obtain the needed semiconductor characteristics, it is preferable that the carrier concentration, the impurity concentration, the defect density, the atomic ratio between a metal element and oxygen, the interatomic distance, the density, and the like be set to appropriate values.

For example, high mobility can be obtained relatively easily in the case of using an In—Sn—Zn-based oxide. However, the mobility can be increased by reducing the defect density in the bulk also in the case of using the In—Ga—Zn-based oxide.

Further, the energy gap of a metal oxide that can form the oxide semiconductor film 119 is greater than or equal to 2 eV, preferably greater than or equal to 2.5 eV, more preferably greater than or equal to 3 eV. In this manner, the off-state current of a transistor can be reduced by using an oxide semiconductor having a wide energy gap.

An oxide semiconductor film may be in a non-single-crystal state, for example. The non-single-crystal state is, for example, structured by at least one of c-axis aligned crystal (CAAC), polycrystal, microcrystal, and an amorphous part. The density of defect states of an amorphous part is higher than those of microcrystal and CAAC. The density of defect states of microcrystal is higher than that of CAAC. Note that an oxide semiconductor including CAAC is referred to as a CAAC-OS (c-axis aligned crystalline oxide semiconductor).

For example, an oxide semiconductor film may include a CAAC-OS. In the CAAC-OS, for example, c-axes are aligned, and a-axes and/or b-axes are not macroscopically aligned.

For example, an oxide semiconductor film may include microcrystal. Note that an oxide semiconductor including microcrystal is referred to as a microcrystalline oxide semiconductor. A microcrystalline oxide semiconductor film includes microcrystal (also referred to as nanocrystal) with a size greater than or equal to 1 nm and less than 10 nm, for example. Alternatively, a microcrystalline oxide semiconductor film, for example, includes a crystal-amorphous mixed phase structure where crystal parts (each of which is greater than or equal to 1 nm and less than 10 nm) are distributed.

For example, an oxide semiconductor film may include an amorphous part. Note that an oxide semiconductor including an amorphous part is referred to as an amorphous oxide semiconductor. An amorphous oxide semiconductor film, for example, has disordered atomic arrangement and no crystalline component. Alternatively, an amorphous oxide semiconductor film is, for example, absolutely amorphous and has no crystal part.

Note that an oxide semiconductor film may be a mixed film including any of a CAAC-OS, a microcrystalline oxide semiconductor, and an amorphous oxide semiconductor. The mixed film, for example, includes a region of an amorphous oxide semiconductor, a region of a microcrystalline oxide semiconductor, and a region of a CAAC-OS. Further, the mixed film may have a stacked structure including a region of an amorphous oxide semiconductor, a region of a microcrystalline oxide semiconductor, and a region of a CAAC-OS, for example.

Note that an oxide semiconductor film may be in a single-crystal state, for example.

An oxide semiconductor film preferably includes a plurality of crystal parts. In each of the crystal parts, a c-axis is preferably aligned in a direction parallel to a normal vector of a surface where the oxide semiconductor film is formed or a normal vector of a surface of the oxide semiconductor film. Note that, among crystal parts, the directions of the a-axis and the b-axis of one crystal part may be different from those of another crystal part. An example of such an oxide semiconductor film is a CAAC-OS film.

The CAAC-OS film is not absolutely amorphous. The CAAC-OS film, for example, includes an oxide semiconductor with a crystal-amorphous mixed phase structure where crystal parts and amorphous parts are intermingled. Note that in most cases, the crystal part fits inside a cube whose one side is less than 100 nm. In an image obtained with a transmission electron microscope (TEM), a boundary between an amorphous part and a crystal part and a boundary between crystal parts in the CAAC-OS film are not clearly detected. Further, with the TEM, a grain boundary in the CAAC-OS film is not clearly found. Thus, in the CAAC-OS film, a reduction in electron mobility due to the grain boundary is suppressed.

In each of the crystal parts included in the CAAC-OS film, for example, a c-axis is aligned in a direction parallel to a normal vector of a surface where the CAAC-OS film is formed or a normal vector of a surface of the CAAC-OS film. Further, in each of the crystal parts, metal atoms are arranged in a triangular or hexagonal configuration when seen from the direction perpendicular to the a-b plane, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a term "perpendicular" includes a range from 80° to 100°, preferably from 85° to 95°. In addition, a term "parallel" includes a range from −10° to 10°, preferably from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that the film deposition is accompanied with the formation of the crystal parts or followed by the formation of the crystal parts through crystallization treatment such as heat treatment. Hence, the c-axes of the crystal parts are aligned in the direction parallel to a normal vector of the surface where the CAAC-OS film is formed or a normal vector of the surface of the CAAC-OS film.

In a transistor using the CAAC-OS film, change in electric characteristics due to irradiation with visible light or ultraviolet light is small. Thus, the transistor has high reliability.

A CAAC-OS film is formed by a sputtering method with a polycrystalline oxide semiconductor sputtering target, for example. When ions collide with the sputtering target, a crystal region included in the sputtering target may be separated from the target along an a-b plane; in other words, a sputtered particle having a plane parallel to an a-b plane (flat-plate-like sputtered particle or pellet-like sputtered particle) may flake off from the sputtering target. In that case, the flat-plate-like sputtered particles reach the substrate while maintaining their crystal states, whereby the CAAC-OS film can be deposited.

For the deposition of the CAAC-OS film, the following conditions are preferably used.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in the deposition chamber may be reduced. Furthermore, the concentration of impurities in a deposition gas may be reduced. Specifically, a deposition gas whose dew point is −80° C. or lower, preferably −100° C. or lower is used.

By increasing the substrate heating temperature during the deposition, migration of a sputtered particle is likely to occur after the sputtered particle reaches the substrate. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like sputtered particle reaches the substrate, migration occurs on the substrate, so that a flat plane of the flat-plate-like sputtered particle is attached to the substrate.

Furthermore, it is preferable that the proportion of oxygen in the deposition gas be increased and the power be optimized in order to reduce plasma damage at the deposition. The proportion of oxygen in the deposition gas is 30 vol. % or higher, preferably 100 vol. %.

As an example of the sputtering target, an In—Ga—Zn—O compound target is described below.

The In—Ga—Zn—O compound target, which is polycrystalline, is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. Note that X, Y, and Z are each a given positive number. Here, the predetermined molar ratio of $InO_X$ powder:$GaO_Y$ powder:$ZnO_Z$ powder is, for example, 2:2:1, 8:4:3, 3:1:1, 1:1:1, 4:2:3, or 3:1:2. The kinds of powder and the molar ratio for mixing powder may be determined as appropriate depending on the desired sputtering target.

Further, the oxide semiconductor film 119 may have a structure in which a plurality of oxide semiconductor films is stacked. For example, the oxide semiconductor film 119 may have a stacked-layer structure of a first oxide semiconductor film and a second oxide semiconductor film that are formed using metal oxides with different compositions. For example, the first oxide semiconductor film may be formed using any of a two-component metal oxide, a three-component metal oxide, and a four-component metal oxide, and the second oxide semiconductor film may be formed using any of these that is different from the oxide for the first oxide semiconductor film.

Further, the constituent elements of the first oxide semiconductor film and the second oxide semiconductor film are made to be the same and the composition of the constituent elements of the first oxide semiconductor film and the second oxide semiconductor film may be made to be different. For example, the first oxide semiconductor film may have an atomic ratio of In:Ga:Zn=1:1:1 and the second oxide semiconductor film may have an atomic ratio of In:Ga:Zn=3:1:2. Alternatively, the first oxide semiconductor film may have an atomic ratio of In:Ga:Zn=1:3:2, and the second oxide semiconductor film may have an atomic ratio of In:Ga:Zn=2:1:3.

At this time, one of the first oxide semiconductor film and the second oxide semiconductor film that is closer to a gate electrode (on a channel side) preferably contains In and Ga at a proportion of In>Ga. The other that is farther from the gate electrode (on a back channel side) preferably contains In and Ga at a proportion of In≤Ga.

In an oxide semiconductor, the s orbital of heavy metal mainly contributes to carrier transfer, and when the In content in the oxide semiconductor is increased, overlap of the s orbital is likely to be increased. Therefore, an oxide having a composition of In>Ga has higher mobility than an oxide having a composition of In≤Ga. Further, in Ga, the formation energy of oxygen vacancies is larger and thus oxygen vacancies are less likely to occur, than in In; therefore, the oxide having a composition of In≤Ga has more stable characteristics than the oxide having a composition of In>Ga.

An oxide semiconductor containing In and Ga at a proportion of In>Ga is used on a channel side, and an oxide semiconductor containing In and Ga at a proportion of In≤Ga is used on a back channel side, so that field-effect mobility and reliability of a transistor can be further improved.

Oxide semiconductors that differ in crystallinity may be applied to the first oxide semiconductor film and the second oxide semiconductor film. That is, the first oxide semiconductor film and the second oxide semiconductor film may be formed by combining a single crystal oxide semiconductor, a polycrystalline oxide semiconductor, an amorphous oxide semiconductor, and a CAAC-OS as appropriate. An amorphous oxide semiconductor is applied to at least one of the first oxide semiconductor film and the second oxide semiconductor film, so that internal stress or external stress of the oxide semiconductor film 119 is relieved, variation in characteristics of a transistor is reduced, and reliability of the transistor can be further improved.

On the other hand, an amorphous oxide semiconductor tends to become an n-type (have a low resistance) because the amorphous oxide semiconductor tends to absorb impurities serving as donor, such as hydrogen and water, and oxygen vacancies tend to be formed in the amorphous oxide semiconductor by hydrogen. Accordingly, an oxide semiconductor having crystallinity, such as a CAAC-OS, is preferably applied to the oxide semiconductor film on the channel side.

The thickness of the oxide semiconductor film 119 is greater than or equal to 1 nm and less than or equal to 50 nm, preferably greater than or equal to 1 nm and less than or equal to 30 nm, more preferably greater than or equal to 1 nm and less than or equal to 10 nm, still more preferably greater than or equal to 3 nm and less than or equal to 7 nm. The thickness of the oxide semiconductor film 119 is in the above range, whereby the shift of the threshold voltage of the transistor in the negative direction can be suppressed in the case where the channel length of the transistor is reduced.

The concentration of alkali metals or alkaline earth metals in the oxide semiconductor film 119 is preferably lower than or equal to $1 \times 10^{18}$ atoms/cm$^3$, more preferably lower than or equal to $2 \times 10^{16}$ atoms/cm$^3$. When alkali metals or alkaline earth metals are bonded to an oxide semiconductor, some of the alkali metals or the alkaline earth metals generate carriers and cause an increase in the off-state current of the transistor.

Nitrogen may be contained in the first region 119a in the oxide semiconductor film 119 at a concentration of lower than or equal to $5 \times 10^{18}$ atoms/cm$^3$.

Further, the concentration of hydrogen in the first region 119a in the oxide semiconductor film 119 is preferably lower than $5 \times 10^{18}$ atoms/cm$^3$, more preferably lower than or equal to $1 \times 10^{18}$ atoms/cm$^3$, still more preferably lower than or equal to 5×10$^{17}$ atoms/cm$^3$, still more preferably lower than or equal to 1×10$^{16}$ atoms/cm$^3$. By a bond of an oxide semiconductor and hydrogen, part of contained hydrogen serves as a donor to generate electrons as carriers. For that reason, by a reduction in the concentration of hydrogen in the first region 119a in the oxide semiconductor film 119, a negative shift of the threshold voltage can be reduced.

The pair of second regions 119b contains, as dopants, at least one of boron, nitrogen, phosphorus, and arsenic. Alternatively, the pair of second regions 119b contains, as dopants, at least one of helium, neon, argon, krypton, and xenon. Still alternatively, the pair of second regions 119b may contain, as dopants, at least one of boron, nitrogen, phosphorus, and arsenic and at least one of helium, neon, argon, krypton, and xenon in appropriate combination.

The concentration of the dopants contained in the pair of second regions 119b is higher than or equal to 5×10$^{18}$ atoms/cm$^3$ and lower than or equal to 1×10$^{22}$ atoms/cm$^3$, preferably higher than or equal to 5×10$^{18}$ atoms/cm$^3$ and lower than 5×10$^{19}$ atoms/cm$^3$.

Since the pair of second regions 119b contains the dopants, the carrier density or the number of defects can be increased. Therefore, the conductivity can be higher than that of the first region 119a that does not contain the dopants. An excessive increase in the dopant concentration causes inhibition of carrier movement by the dopants, which leads to lower conductivity of the pair of second regions 119b containing the dopants.

The pair of second regions 119b containing the dopants preferably has a conductivity higher than or equal to 0.1 S/cm and lower than or equal to 1000 S/cm, preferably higher than or equal to 10 S/cm and lower than or equal to 1000 S/cm. The source-drain breakdown voltage can be increased by providing the second regions 119b.

In the oxide semiconductor film 119, the first region 119a and the second regions 119b may have the same crystal structure. For example, the first region 119a and the second regions 119b may have a single crystal structure, a polycrystalline structure, or an amorphous structure. Further, the first region 119a and the second regions 119b may be formed using a CAAC-OS.

Alternatively, in the oxide semiconductor film 119, the first region 119a and the second regions 119b may have different crystal structures. For example, the first region 119a may have a single crystal structure or a polycrystalline structure, and the second regions 119b may have an amorphous structure. Alternatively, the first region 119a may include a CAAC-OS, and the second regions 119b may have an amorphous structure. Hydrogen is easily diffused into an oxide semiconductor having an amorphous structure; thus, hydrogen in the first region 119a is diffused into the second regions 119b, so that the hydrogen concentration in the first region 119a, which is to be a channel region, can be reduced and the second regions 119b become an n-type (have a low resistance).

The gate insulating film 123 has a stacked-layer structure of the oxide insulating film 123a in contact with the oxide semiconductor film 119 and the metal oxide film 123b in contact with the gate electrode 115. The metal oxide film 123b is faulted using a metal oxide film formed by adding oxygen to a metal film.

The oxide insulating film 123a may be formed with a single layer or a stack including one or more of silicon oxide, silicon oxynitride, a Ga—Zn-based metal oxide, and the like.

The oxide insulating film 123a may be an oxide insulating film from which oxygen is released by heating, such as a film applicable to the oxide insulating film 103. By using a film from which oxygen is released by heating as the gate insulating film 123, oxygen vacancies caused in the oxide semiconductor film 119 can be compensated by heat treatment performed later and deterioration of electrical characteristics of the transistor can be suppressed.

The metal oxide film 123b may be formed to have a single-layer structure or a stacked-layer structure using, for example, aluminum oxide, aluminum oxynitride, gallium oxide, gallium oxynitride, yttrium oxide, yttrium oxynitride, hafnium oxide, and hafnium oxynitride.

The metal oxide film has a blocking effect against oxygen, hydrogen, water, and the like; thus, the diffusion of oxygen contained in the oxide insulating film 103, the oxide semiconductor film 119, and the oxide insulating film 123a into the outside can be suppressed.

In the case where a high-k material such as hafnium oxide, hafnium oxynitride, yttrium oxide, or yttrium oxynitride is used for the metal oxide film 123b, gate leakage of the transistor can be reduced.

The thickness of the gate insulating film 123 is preferably greater than or equal to 5 nm and less than or equal to 300 nm, more preferably greater than or equal to 10 nm and less than or equal to 50 nm, still more preferably greater than or equal to 10 nm and less than or equal to 30 nm.

The gate electrode 115 can be formed using a metal element selected from aluminum, chromium, copper, tantalum, titanium, molybdenum, and tungsten; an alloy containing any of these metal elements as a component; an alloy film containing these metal elements in combination; or the like. Further, one or more metal elements selected from manganese or zirconium may be used. Furthermore, the gate electrode 115 may have a single-layer structure or a stacked-layer structure of two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given. Alternatively, a film, an alloy film, or a nitride film that contains aluminum and one or more elements selected from titanium, tantalum, tungsten, molybdenum, chromium, neodymium, and scandium may be used.

The gate electrode 115 can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked-layer structure formed using the above light-transmitting conductive material and the above metal element.

Further, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, a film of a metal nitride (such as InN or ZnN), or the like is preferably provided between the gate electrode 115 and the gate insulating film 123. These films each have a work function of 5 eV or higher, preferably 5.5 eV or higher; thus, the threshold voltage of the transistor can be positive. Accordingly, a so-called normally-off switching element can be obtained. For example, in the case of using an In—Ga—Zn—O film containing nitrogen, an In—Ga—Zn—O film having a nitrogen concentration higher than at least the oxide semiconductor film 119, specifically, an In—Ga—Zn—O film having a nitrogen concentration of 7 at. % or higher is used.

Although not illustrated, a cap insulating film may be provided over a top surface of the gate electrode 115. The cap insulating film functions as a hard mask in formation of the gate electrode 115 to protect the top surface of the gate electrode 115. The cap insulating film may be formed with a single layer or a stack including one or more of silicon oxide, silicon oxynitride, silicon nitride oxide, silicon nitride, aluminum oxide, aluminum oxynitride, aluminum nitride oxide, aluminum nitride, and the like. An insulating film having a lower etching rate than the sidewalls 121 is selected, so that the cap insulating film functions as an etching protective film for suppressing reduction in the film thickness of the gate electrode 115 in formation of the sidewalls 121 in a later step.

The sidewalls 121 may be formed with a single layer or a stack using one or more of silicon oxide, silicon oxynitride, silicon nitride oxide, silicon nitride, aluminum oxide, aluminum oxynitride, aluminum nitride oxide, aluminum nitride, and the like. The sidewalls 121 may be formed using an oxide insulating film from which part of oxygen is released by heating in a manner similar to that of the oxide insulating film 103.

The insulating film 127 may be formed with a single layer or a stack including one or more of silicon oxide, silicon oxynitride, silicon nitride oxide, silicon nitride, aluminum oxide, aluminum oxynitride, aluminum nitride oxide, aluminum nitride, and the like. The insulating film 127 may have a stacked-layer structure, and an insulating film in contact with the oxide semiconductor film 119 may be formed using an oxide insulating film from which part of oxygen is released by heating in a manner similar to the insulating film 103. An insulating film that can prevent diffusion of oxygen into the outside, such as an aluminum oxide film or an aluminum oxynitride film is stacked over the insulating film on the side in contact with the oxide semiconductor film 119, so that oxygen released from the insulating film on the side in contact with the oxide semiconductor film 119 can be supplied to the oxide semiconductor film. In addition, by using an oxide insulating film that prevents entry of hydrogen, water, and the like from the outside as the insulating film 127, entry of hydrogen, water, and the like from the outside to the oxide semiconductor film can be reduced, and oxygen vacancies in the oxide semiconductor film can be reduced. Typical examples of the oxide insulating film that prevents entry of hydrogen, water, and the like from the outside are films of silicon nitride, silicon nitride oxide, aluminum nitride, aluminum nitride oxide, aluminum oxide, aluminum oxynitride, and the like.

The pair of contact plugs 125 is used for electrically connecting the regions 119b in the oxide semiconductor film to a wiring formed above the interlayer insulating film 131. The contact plugs 125 need to be formed as a connecting member with a high aspect ratio because the interlayer insulating film 130 is thick.

The contact plugs (also referred to as connecting conductive portions, embedded plugs, or simply plugs) 125 each have a columnar or wall shape. The contact plugs 125 are each formed by embedding a conductive material in an opening (via) provided in the interlayer insulating film. As the conductive material, a conductive material with high embeddability such as tungsten or polysilicon can be used.

Although not illustrated, a side surface and a bottom surface of the material can be covered with a barrier film (a diffusion prevention film) of a titanium film, a titanium nitride film, a stack of these films, or the like. In this case, the barrier film is regarded as part of the contact plug.

Figure 23A:
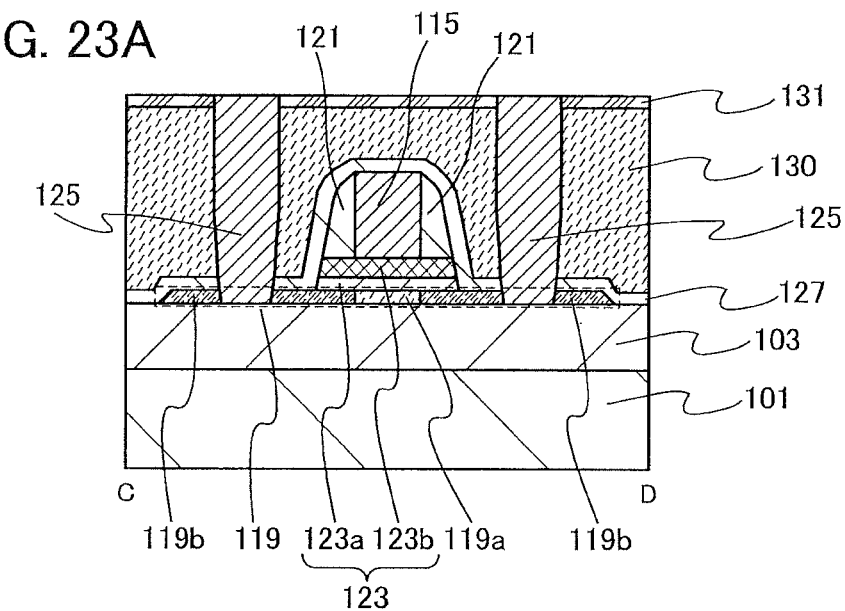
FIGS. 23A and 23B are cross-sectional views each illustrating a semiconductor device according to one embodiment of the present invention.
Figure 23B:
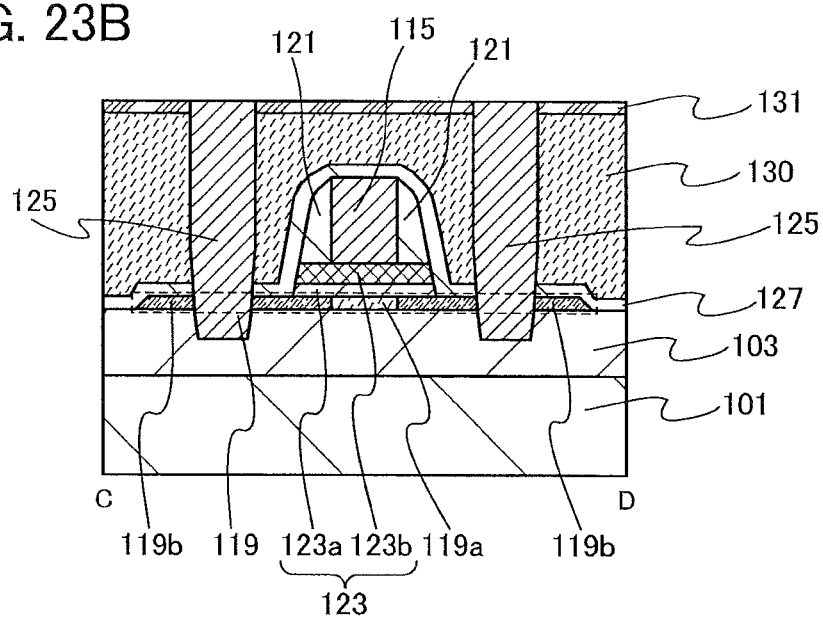

In FIG. 1C, bottom surfaces of the contact plugs 125 are connected to a top surface of the oxide semiconductor film 119. However, the connection of the contact plugs 125 to the oxide semiconductor film 119 is not limited to this connection structure. For example, as illustrated in FIG. 23A, the contact plugs 125 may penetrate the oxide semiconductor film 119, and the bottom surfaces of the contact plugs 125 may be in contact with a top surface of the oxide insulating film 103. In this case, the connection of the contact plugs 125 to the oxide semiconductor film 119 is made at side surfaces of the contact plugs 125. This allows the oxide semiconductor film 119 and the contact plugs 125 to have better electrical contact. Furthermore, as illustrated in FIG. 23B, the contact plugs 125 may also exist in the oxide insulating film 103.

Note that one contact plug is used for electrical connection between each of the regions 119b in the oxide semiconductor film and the wiring formed above the interlayer insulating film 131 in FIG. 1C. However, in order to decrease the contact resistance between the contact plug and the oxide semiconductor film 119 or the wiring, a plurality of contact plugs arranged side by side may be used or a contact plug with a large diameter may be used.

The contact plugs 125 are formed with use of a mask, and thus can be formed in any desired position. Even in the case where the contact plugs 125 are formed near side surfaces of the gate electrode 115 due to processing variation, the semiconductor device can be formed without losing the function of the transistor as long as the contact plugs 125 are in contact with the sidewalls 121. Alternatively, when the contact plugs are provided in contact with the sidewalls 121, element miniaturization can be achieved.

Next, a method for manufacturing the transistor in FIGS. 1A to 1C is described with reference to FIGS. 2A to 2H, FIGS. 3A to 3F, and FIGS. 4A to 4H. Note that manufacturing steps of cross section A-B (in the channel width direction of the transistor) in FIG. 1B are illustrated in FIGS. 2A, 2C, 2E, and 2G, FIGS. 3A, 3C, and 3E, and FIGS. 4A, 4C, 4E, and 4G, whereas manufacturing steps of cross section C-D (in the channel length direction of the transistor) in FIG. 1C are illustrated in FIGS. 2B, 2D, 2F, and 2H, FIGS. 3B, 3D, and 3F and FIGS. 4B, 4D, 4F, and 4H.

Figure 2A:
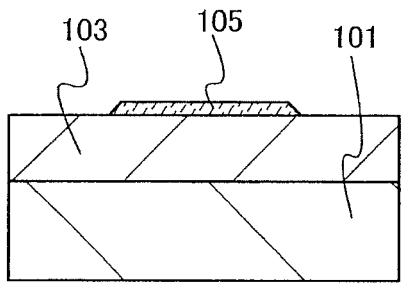
FIGS. 2A to 2H are cross-sectional views illustrating a method for manufacturing the semiconductor device, according to one embodiment of the present invention.
Figure 2B:
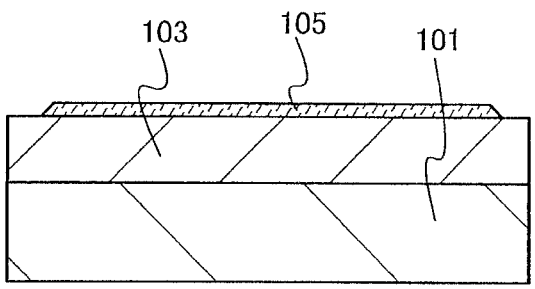

As illustrated in FIGS. 2A and 2B, the oxide insulating film 103 is formed over the substrate 101.

Note that before the oxide insulating film 103 is formed, hydrogen or water contained in the substrate is preferably released by heat treatment or plasma treatment. Consequently, in heat treatment performed later, diffusion of hydrogen or water into the oxide insulating film and the oxide semiconductor film can be prevented. The heat treatment is performed at a temperature of higher than or equal to 100° C. and lower than the strain point of the substrate under an inert atmosphere, a reduced-pressure atmosphere, or a dry air atmosphere. Further, for the plasma treatment, rare gas, oxygen, nitrogen, or nitrogen oxide (e.g., nitrous oxide, nitrogen monoxide, or nitrogen dioxide) is used.

The oxide insulating film 103 is formed by a sputtering method, a CVD method, or the like.

When an oxide insulating film from which part of oxygen is released by heating is formed by a sputtering method as the oxide insulating film 103, the amount of oxygen in a deposition gas is preferably large, and oxygen, a mixed gas of oxygen and a rare gas, or the like can be used. Typically, the oxygen concentration of a deposition gas is preferably from 6% to 100%.

In the case where a silicon oxide film is formed as a typical example of an oxide insulating film from which part of oxygen is released by heating, the silicon oxide film is preferably formed by an RF sputtering method under the following conditions: quartz (preferably synthetic quartz) is used as a target; the substrate temperature is from 30° C. to 450° C. (preferably from 70° C. to 200° C.); the distance between the substrate and the target (the T-S distance) is from 20 mm to 400 mm (preferably from 40 mm to 200 mm); the pressure is from 0.1 Pa to 4 Pa (preferably from 0.2 Pa to 1.2 Pa), the high-frequency power is from 0.5 kW to 12 kW (preferably from 1 kW to 5 kW); and the proportion of oxygen in the deposition gas ($O_2/(O_2+Ar)$) is from 1% to 100% (preferably from 6% to 100%). Note that a silicon target may be used as the target instead of the quartz (preferably synthetic quartz) target. In addition, oxygen alone may be used as the deposition gas.

In the case where an oxide insulating film is formed by a CVD method as the oxide insulating film 103, hydrogen or water derived from a source gas is sometimes mixed in the oxide insulating film. Thus, after the oxide insulating film is formed by a CVD method, heat treatment is preferably performed as dehydrogenation or dehydration.

The temperature of the heat treatment is preferably a temperature at which hydrogen or water is released from the oxide insulating film. Typically, the temperature is higher than or equal to 150° C. and lower than the strain point of the substrate, preferably higher than or equal to 250° C. and lower than or equal to 450° C., more preferably higher than or equal to 300° C. and lower than or equal to 450° C.

An electric furnace, a rapid thermal annealing (RTA) apparatus, or the like can be used for the heat treatment. With use of an RTA apparatus, heat treatment at a temperature higher than or equal to the strain point of the substrate can be performed only for a short time. Thus, time during which hydrogen or water is released from the oxide insulating film can be shortened.

The heat treatment may be performed under an atmosphere of nitrogen, oxygen, ultra-dry air (air in which the water content is 20 ppm or lower, preferably 1 ppm or lower, more preferably 10 ppb or lower), or a rare gas (argon, helium, or the like). It is preferable that water, hydrogen, or the like is not contained in the atmosphere of nitrogen, oxygen, ultra-dry air, or a rare gas. It is also preferable that the purity of nitrogen, oxygen, or the rare gas that is introduced into a heat treatment apparatus be set to be 6N (99.9999%) or higher, preferably 7N (99.99999%) or higher (that is, the impurity concentration is 1 ppm or lower, preferably 0.1 ppm or lower). Note that the heat treatment may be performed in vacuum.

By the heat treatment, dehydrogenation or dehydration can be performed on the oxide insulating film and thus, diffusion of hydrogen or water to the oxide semiconductor film can be suppressed.

In the case of adding oxygen to the oxide insulating film formed by a CVD method, the amount of oxygen released by heating can be increased. As the method for adding oxygen to the oxide insulating film, an ion implantation method, an ion doping method, a plasma immersion ion implantation method, plasma treatment, or the like can be used.

The heat treatment for dehydration or dehydrogenation may be performed plural times, and may also serve as another heat treatment.

The surface of the oxide insulating film 103 is preferably flat because the oxide semiconductor film formed later can be prevented from being disconnected.

Next, an oxide semiconductor film 105 is formed over the oxide insulating film 103.

The oxide semiconductor film 105 can be formed as follows. An oxide semiconductor film is formed over the oxide insulating film 103 by a sputtering method, a coating method, a pulsed laser deposition method, a laser ablation method, or the like. A mask is formed over the oxide semiconductor film. Part of the oxide semiconductor film is etched with use of the mask, so that the oxide semiconductor film 105 that is separated into an island shape can be formed. Alternatively, by using a printing method for forming the oxide semiconductor film 105, the oxide semiconductor film 105 that is separated into an island shape can be formed directly.

Here, the oxide semiconductor film 105 is formed by a sputtering method in such a manner that an oxide semiconductor film with a thickness of greater than or equal to 1 nm and less than or equal to 50 nm, preferably greater than or equal to 3 nm and less than or equal to 30 nm is formed, a mask is formed over the oxide semiconductor film, and part of the oxide semiconductor film is selectively etched.

For example, in the case where the oxide semiconductor film is formed by a sputtering method at a substrate temperature higher than or equal to 150° C. and lower than or equal to 750° C., preferably higher than or equal to 150° C. and lower than or equal to 450° C., more preferably higher than or equal to 200° C. and lower than or equal to 350° C., the amount of hydrogen or water entering the oxide semiconductor film can be reduced and the oxide semiconductor film can be a CAAC-OS film.

In order to improve the orientation of the crystal parts in the CAAC-OS, planarity of the surface of the oxide insulating film 103 serving as a base insulating film of the oxide semiconductor film is preferably improved. Typically, an average surface roughness ($R_a$) of the oxide insulating film 103 is preferably greater than or equal to 0.1 nm and less than 0.5 nm. In this specification and the like, as the average surface roughness ($R_a$), center line average roughness ($R_a$) that is defined by JISB0601:2001 (ISO 4287:1997) is used. As planarization treatment, one or more can be selected from chemical mechanical polishing (CMP) treatment, dry etching treatment, plasma treatment (reverse sputtering), and the like. The plasma treatment is the one in which minute unevenness of the surface is reduced by introducing an inert gas such as an argon gas into a vacuum chamber and applying an electric field so that a surface to be processed serves as a cathode.

Here, a sputtering apparatus used for forming the oxide semiconductor film is described in detail below.

The leakage rate of a treatment chamber in which the oxide semiconductor film is formed is preferably lower than or equal to $1\times10^{-10}$ Pa·m$^3$/sec., whereby entry of impurities into the film formed by a sputtering method can be decreased.

Evacuation of the treatment chamber in the sputtering apparatus is preferably performed with a rough vacuum pump such as a dry pump and a high vacuum pump such as a sputter ion pump, a turbo molecular pump, or a cryopump in appropriate combination. The turbo molecular pump has an outstanding capability in evacuating a large-sized molecule, whereas it has a low capability in evacuating hydrogen and water. Further, a combination with a sputter ion pump having a high capability in evacuating hydrogen or a cryopump having a high capability in evacuating water is effective.

An adsorbate present on the inner wall of the treatment chamber does not affect the pressure in the treatment chamber because it is adsorbed on the inner wall, but the adsorbate leads to release of gas at the time of the evacuation of the treatment chamber. Therefore, although the leakage rate and the evacuation rate do not have a correlation, it is important that the adsorbate present in the treatment chamber be desorbed as much as possible and evacuation be performed in advance with use of a pump having high evacuation capability. Note that the treatment chamber may be subjected to baking for promoting desorption of the adsorbate. By the baking, the rate of desorption of the adsorbate can be increased about tenfold. The baking may be performed at a temperature higher than or equal to 100° C. and lower than or equal to 450° C. At this time, when the adsorbate is removed while an inert gas is introduced, the rate of desorption of water or the like, which is difficult to desorb only by evacuation, can be further increased.

As described above, in the process for forming the oxide semiconductor film and preferably also in the process for forming the oxide insulating film, entry of impurities is suppressed as much as possible through control of the pressure of the treatment chamber, leakage rate of the treatment chamber, and the like, whereby entry of impurities including hydrogen contained in the oxide semiconductor film can be reduced. In addition, diffusion of impurities such as hydrogen and water from the oxide insulating film to the oxide semiconductor film can be reduced.

Hydrogen contained in the oxide semiconductor reacts with oxygen bonded to a metal atom to produce water, and a defect is formed in a lattice from which oxygen is released (or a portion from which oxygen is released). Thus, the impurities containing hydrogen are reduced as much as possible in the formation step of the oxide semiconductor film, whereby defects in the oxide semiconductor film can be reduced. Therefore, when a channel region is formed in an oxide semiconductor film that is purified by removing impurities as much as possible, the transistor can have higher reliability.

A power supply device for generating plasma in a sputtering method can be an RF power supply device, an AC power supply device, a DC power supply device, or the like as appropriate.

As a sputtering gas, a rare gas (typically argon) atmosphere, an oxygen atmosphere, or a mixed gas of a rare gas and oxygen is used as appropriate. In the case of using the mixed gas of a rare gas and oxygen, the proportion of oxygen is preferably higher than that of a rare gas. It is preferable that a high-purity gas from which impurities containing hydrogen are removed be used as a sputtering gas.

Note that before the oxide semiconductor film is formed by a sputtering apparatus, a dummy substrate may be put into the sputtering apparatus, and an oxide semiconductor film may be formed over the dummy substrate, so that hydrogen, water, and the like attached to the target surface or a deposition shield may be removed.

By forming the oxide insulating film 103 and the oxide semiconductor film successively without exposure to the air, impurities such as hydrogen and water in the air can be prevented from entering the interface between the oxide insulating film 103 and the oxide semiconductor film, which is preferable. For example, the oxide insulating film 103 is formed in a first treatment chamber of a multi-chamber sputtering apparatus. Next, the substrate 101 over which the oxide insulating film 103 is formed is heated in a preheating chamber, and impurities such as hydrogen and water contained in the substrate 101 and the oxide insulating film 103 are released. Note that the heating temperature at this time is preferably in a temperature range in which oxygen is not released from the oxide insulating film 103. Next, the oxide semiconductor film is formed in a second treatment chamber, so that the oxide insulating film and the oxide semiconductor film can be formed successively without exposure to the air.

In this case, a glass substrate is used as the substrate. First, in a preheating chamber of a multi-chamber sputtering apparatus, the substrate is heated so that moisture or the like contained in the substrate is released. Next, in a first treatment chamber, a silicon oxide film with a thickness of 300 nm is formed as the oxide insulating film 103 without exposure to the air. Then, in a second treatment chamber, an oxide semiconductor film (In—Ga—Zn-based oxide film) with a thickness of 20 nm is formed. Subsequently, a mask is formed over the oxide semiconductor film by a photolithography process, and the oxide semiconductor film is dry-etched with use of the mask to form the oxide semiconductor film 105.

Next, heat treatment is preferably performed on the substrate 101. By the heat treatment, dehydrogenation or dehydration of the oxide semiconductor film 105 can be performed.

Further, part of the oxygen contained in the oxide insulating film 103 can be diffused into the oxide semiconductor film 105 and a vicinity of the interface between the oxide insulating film 103 and the oxide semiconductor film 105.

The temperature of the heat treatment is typically higher than or equal to 150° C. and lower than the strain point of the substrate, preferably higher than or equal to 250° C. and lower than or equal to 450° C., more preferably higher than or equal to 300° C. and lower than or equal to 450° C.

An electric furnace, an RTA apparatus, or the like can be used for the heat treatment. With use of an RTA apparatus, heat treatment at a temperature higher than or equal to the strain point of the substrate can be performed only for a short time. Thus, the time during which hydrogen or water is released from the oxide semiconductor film and the time during which oxygen is diffused from the oxide insulating film 103 into the oxide semiconductor film 105 can be shortened.

The heat treatment is performed under an inert gas atmosphere containing nitrogen or a rare gas such as helium, neon, argon, xenon, or krypton. Alternatively, the heat treatment may be performed under an inert gas atmosphere first, and then under an oxygen atmosphere. It is preferable that the above inert gas atmosphere and the above oxygen atmosphere do not contain hydrogen, water, and the like. The treatment time is 3 minutes to 24 hours.

The oxide semiconductor film 105 may be formed as follows. An oxide semiconductor film is formed over the oxide insulating film 103, and the heat treatment for dehydrogenation or dehydration is performed. After that, part of the oxide semiconductor film is etched to form the oxide semiconductor film 105 that is subjected to element isolation. With such steps, since the oxide insulating film 103 is completely covered with the oxide semiconductor film in the heat treatment for dehydrogenation or dehydration, the oxygen contained in the oxide insulating film 103 can be efficiently diffused into the oxide semiconductor film.

The heat treatment for dehydrogenation or dehydration may be performed after an oxide insulating film 107 to be formed later is formed. As a result, the number of the heat treatment steps can be reduced and water or hydrogen can be released from the oxide semiconductor film 105 and the oxide insulating film 107.

The heat treatment for dehydration or dehydrogenation may be performed plural times, and may also serve as another heat treatment.

Figure 2C:
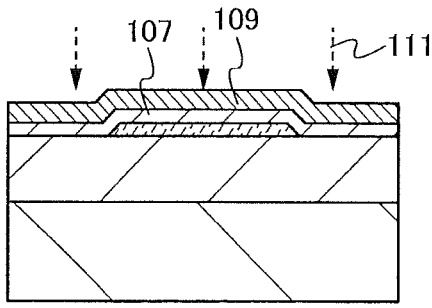
Figure 2D:
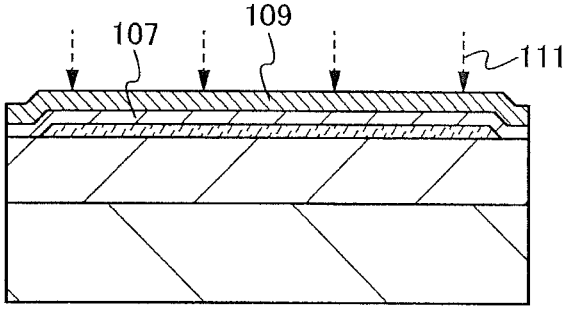

Next, as illustrated in FIGS. 2C and 2D, after the oxide insulating film 107 is formed over the oxide insulating film 103 and the oxide semiconductor film 105, a metal film 109 is formed over the oxide insulating film 107.

Since the oxide insulating film 107 becomes the oxide insulating film 123a later, the materials given for the oxide insulating film 123a in FIGS. 1A to 1C can be used as appropriate. The oxide insulating film 107 is formed by a sputtering method, a CVD method, or the like.

Since the oxide insulating film 107 is formed before the metal film 109 is formed, the oxide semiconductor film 105 is not directly in contact with the metal film 109, so that reaction of the oxide semiconductor film 105 to the metal film can be reduced. Accordingly, quality change of a region to be a channel region later in the oxide semiconductor film 105 can be prevented.

As the metal film 109, a metal film having a blocking effect against oxygen, hydrogen, water, and the like in the state of being oxidized is preferably used. Typical examples of the metal film are films of aluminum, gallium, yttrium, and hafnium. The metal film 109 is formed by a sputtering method, an evaporation method, or the like.

The thickness of the metal film 109 is preferably greater than or equal to 5 nm and less than or equal to 30 nm, more preferably greater than or equal to 10 nm and less than or equal to 20 nm. By setting the thickness of the metal film 109 to the above thickness, in later oxygen-adding treatment, the metal film 109 can be oxidized and oxygen can be added to the oxide insulating film 107.

Figure 2E:
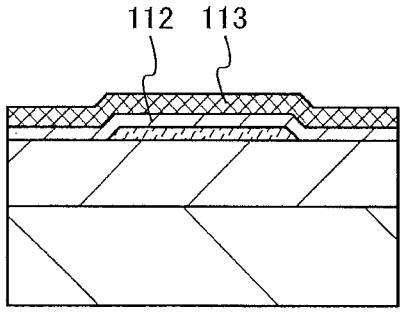
Figure 2F:
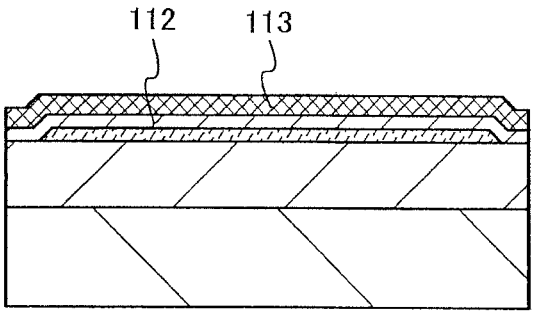

Next, oxygen 111 is added to the metal film 109 to oxidize the metal film 109 and oxygen is added to the oxide insulating film 107, so that an oxide insulating film 112 and a metal oxide film 113 to which oxygen is added are formed as illustrated in FIGS. 2E and 2F. At this time, the metal oxide film 113 is a metal oxide film or a metal oxynitride film corresponding to the metal film 109. For example, in the case where aluminum is used for the metal film 109, an aluminum oxide film or an aluminum oxynitride film is formed as the metal oxide film 113.

The oxide insulating film 112 to which oxygen is added is preferably an oxide insulating film containing oxygen satisfying the stoichiometric proportion or an oxide insulating film containing oxygen that is more than oxygen satisfying the stoichiometric proportion.

The metal oxide film 113 is preferably a metal oxide film containing oxygen satisfying the stoichiometric proportion or a metal oxide film containing oxygen that is more than oxygen satisfying the stoichiometric proportion.

As a method for adding oxygen to the oxide insulating film 107 and the metal film 109, an ion implantation method, an ion doping method, a plasma immersion ion implantation method, plasma treatment, or the like can be used. Note that for the ion implantation method, a gas cluster ion beam may be used. The oxygen 111 may be added to the entire area of the substrate 101 at a time. Alternatively, a linear ion beam may be used for adding the oxygen. In the case of using a linear ion beam, relative movement (scanning) of the substrate or the ion beam enables the oxygen 111 to be added to the entire surfaces of the oxide insulating film 107 and the metal film 109. The oxygen-adding treatment may be performed while heat treatment is performed.

Typical examples of the oxygen 111 added to the oxide insulating film 107 and the metal film 109 are an oxygen radical, ozone, an oxygen atom, and an oxygen ion. The oxygen 111 can be generated by a gas containing oxygen. Typical examples of the gas containing oxygen are an oxygen gas, a dinitrogen monoxide gas, a nitrous oxide gas, an ozone gas, water vapor, and a mixed gas of oxygen and hydrogen. With the gas containing oxygen, an inert gas such as a nitrogen gas or a rare gas may be introduced.

In the case where oxygen is added by an ion implantation method, the dose of the oxygen 111 is preferably greater than or equal to $1\times10^{13}$ ions/cm$^2$ and less than or equal to $5\times10^{16}$ ions/cm$^2$. With such a dose, a metal oxide film containing oxygen satisfying the stoichiometric proportion or a metal oxide film containing oxygen that is more than oxygen satisfying the stoichiometric proportion can be formed.

Oxygen addition by plasma treatment is performed by adding oxygen in oxygen plasma to the metal film and the oxide insulating film 107. For the oxygen addition by plasma treatment, a plasma treatment apparatus such as a plasma CVD apparatus or a dry etching apparatus can be used. In the case where a plasma treatment apparatus is used, the metal film 109 is oxidized and part of oxygen is added to the oxide insulating film 107; thus, a support base or an electrode on which the substrate 101 is mounted is preferably biased. As a result, the oxygen 111 having energy, typically an oxygen ion, can be drawn on the substrate 101 side, and the amount of oxygen added to the oxide insulating film 112 and the metal oxide film 113 can be further increased.

Further, in the case where oxygen is added by plasma treatment, by making oxygen excited by a microwave to generate high density oxygen plasma, the amount of oxygen added to the oxide insulating film 112 to which oxygen is added can be increased and the dense metal oxide film 113 can be formed. Note that in the case where oxygen is made to be excited by a microwave to generate high density oxygen plasma, the oxygen-adding treatment is preferably performed at temperature at which oxygen is not released from the oxide insulating film and the oxide semiconductor film, typically, lower than or equal to 250° C., preferably lower than or equal to 200° C.

Addition of oxygen into the metal film by plasma treatment leads to improvement in throughput.

Further, formation of the metal film 109 and oxygen-adding treatment on the metal film 109 can be performed in the same apparatus. Typically, after the metal film 109 is formed by introducing an inert gas into a treatment chamber in a sputtering apparatus and sputtering a target, oxygen is introduced into the treatment chamber, a support base or an electrode on which the substrate 101 is mounted is biased, and oxygen, typically an oxygen ion, is drawn to the metal film, so that oxygen can be added to the metal film to form the metal oxide film and added also to the oxide insulating film 112. Further, alternate switching of gases added to the chamber enables formation of the metal film and addition of oxygen into the metal film to be performed alternately, so that the metal oxide film can be thicker.

Figure 22A:
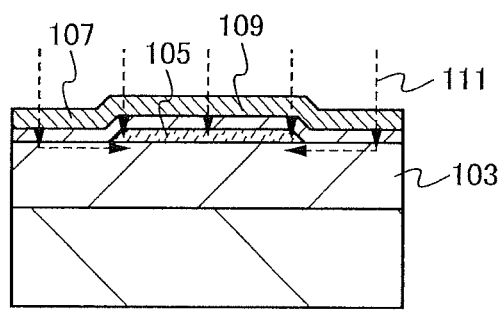
FIGS. 22A and 22B illustrate oxygen addition to a metal film and an oxide insulating film.
Figure 22B:
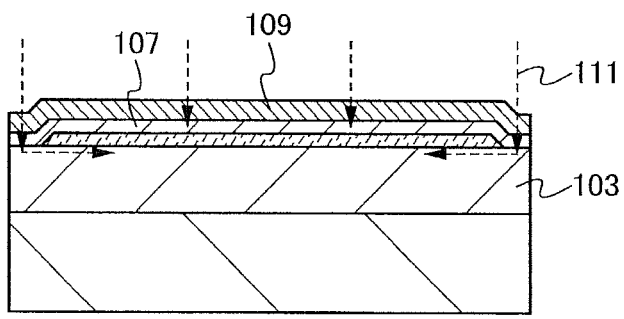

A state of the oxygen addition into the metal film 109 and the oxide insulating film 107 is described here with reference to FIGS. 22A and 22B. FIG. 22A corresponds to FIG. 2C, and FIG. 22B corresponds to FIG. 2D. Oxygen is added to the oxide insulating film 107 and the metal film 109, so that the oxygen 111 is added to the metal film 109 and the oxide insulating film 107 as illustrated in FIGS. 22A and 22B. The oxygen 111 is added to the oxide semiconductor film 105. At this time, by the oxygen addition, oxygen vacancies in the side surface of the oxide semiconductor film 105 are compensated. The oxygen 111 is added to the oxide insulating film 103. The oxygen added to the oxide insulating film 103 is diffused into the oxide insulating film 103 as shown in the horizontal arrows. The diffused oxygen is diffused into the oxide semiconductor film 105, so that oxygen vacancies in the oxide semiconductor film 105 are compensated.

After that, heat treatment may be performed. The heat treatment can make the bond of metal atoms and oxygen in the metal oxide film 113 further strengthened, and oxygen release from the metal oxide film 113 in later heat treatment can be suppressed. The heating temperature at this time is higher than or equal to 300° C. and lower than or equal to 500° C., preferably higher than or equal to 400° C. and lower than or equal to 450° C.

Oxygen may be added to the oxide insulating film 107 before the metal film 109 is formed. As a result of performing oxygen addition plural times, the amount of oxygen in the oxide insulating film 112 to which oxygen is added can be further increased.

Here, as the oxide insulating film 107, a silicon oxynitride film having a thickness of 20 nm is formed by a CVD method. Next, as the metal film 109, an aluminum film having a thickness of 10 nm is formed by a sputtering method. Subsequently, as the oxygen-adding treatment performed on the metal film 109, an inductively coupled plasma method is used. The power of the electrode facing the substrate 101 is 0 W, the power of the electrode on which the substrate 101 is provided is 4500 W, the pressure of the treatment chamber in the plasma generation treatment apparatus is 15 Pa, and the flow rate of oxygen to be introduced into the treatment chamber is 250 sccm, so that oxygen plasma is generated. The metal film 109 is exposed to the oxygen plasma to be oxidized, so that an aluminum oxide film is formed.

As an insulating film in contact with the oxide semiconductor film 105, the oxide insulating film 112 to which oxygen is added is provided. The metal oxide film 113 is provided over the insulating film. The metal oxide film 113 formed using aluminum oxide, aluminum oxynitride, gallium oxide, gallium oxynitride, yttrium oxide, yttrium oxynitride, hafnium oxide, or hafnium oxynitride has a blocking effect against oxygen, hydrogen, water, and the like; thus, oxygen can be efficiently diffused from the oxide insulating film 112 to which oxygen is added to the oxide semiconductor film 105. The oxygen 111 is added to the oxide semiconductor film 105 not by direct addition but by solid-phase diffusion from the oxide insulating film 112 to which oxygen is added; thus, the oxide semiconductor film 105 can be less damaged. In particular, the oxygen vacancies in a side surface of the oxide semiconductor film are compensated by diffusion of the oxygen. As a result, leakage current between the source electrode and the drain electrode flowing through the side surfaces, which are shown by a dashed line 129 in FIG. 1A, of the oxide semiconductor film overlapping with the gate electrode can be reduced.

In a CAAC-OS, oxygen tends to move along the surface where the CAAC-OS is formed or the surface of the CAAC-OS. Thus, oxygen release occurs from the side surface of the oxide semiconductor film 105 that is subjected to element isolation, and oxygen vacancies tend to be formed in the side surface. By forming an oxide insulating film over the oxide semiconductor film 105 and a metal oxide film over the oxide insulating film, oxygen release from the side surface of the oxide semiconductor film 105 can be suppressed. As a result, an increase in conductivity of the side surface of the oxide semiconductor film 105 can be suppressed.

Figure 2G:
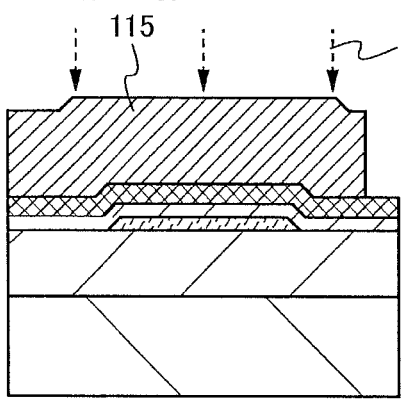
Figure 2H:
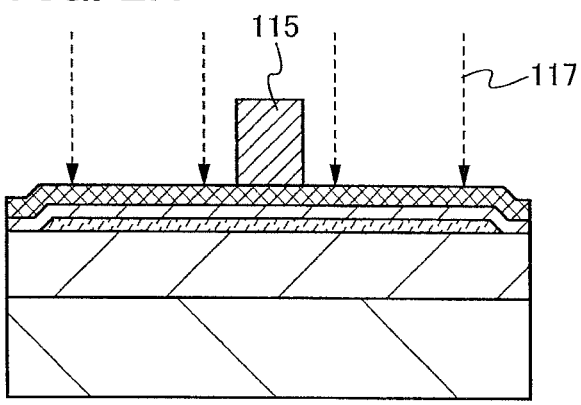

Next, as illustrated in FIGS. 2G and 2H, the gate electrode 115 is formed over the metal oxide film 113.

The gate electrode 115 is formed by forming a conductive film, then forming a mask over the conductive film by a photolithography process, and etching the conductive film with use of the mask.

Although not illustrated, the gate electrode 115 can be formed as follows: an insulating film is formed over a deposited conductive film, and a conductive film is etched with the insulating film that is partly etched as a hard mask.

The conductive film to be the gate electrode 115 is formed by a sputtering method, a CVD method, an evaporation method, or the like. The insulating film used for the hard mask is formed by a sputtering method, a CVD method, an evaporation method, or the like.

A tantalum nitride film with a thickness of 30 nm and a tungsten film with a thickness of 200 nm are formed here by a sputtering method. Next, a mask is formed by a photolithography process and the tantalum nitride film and the tungsten film are dry-etched with use of the mask to form the gate electrode 115.

Figure 3A:
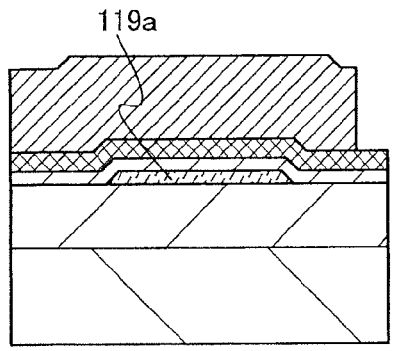
FIGS. 3A to 3F are cross-sectional views illustrating the method for manufacturing the semiconductor device, according to one embodiment of the present invention.
Figure 3B:
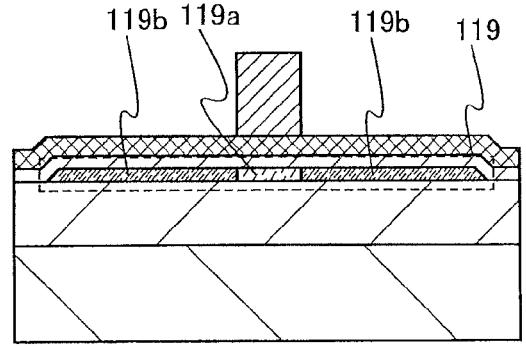

Next, by using the gate electrode 115 as a mask, dopants 117 are added to the oxide semiconductor film 105 (see FIGS. 2G and 2H), so that the pair of second regions 119b containing the dopants is formed as illustrated in FIG. 3B. Since the dopants are added with use of the gate electrode 115 as a mask, the pair of second regions 119b containing the dopants and the first region 119a into which the dopants are not added can be formed in a self-aligned manner (see FIGS. 3A and 3B). The first region 119a overlapping with the gate electrode 115 serves as a channel region. The pair of second regions 119b containing the dopants serves as offset regions, a source region, and a drain region. The first region 119a and the pair of second regions 119b containing the dopants are referred to as the oxide semiconductor film 119.

As a method for adding the dopants to the oxide semiconductor film 119, an ion doping method or an ion implantation method can be used. As the added dopants, at least one of boron, nitrogen, phosphorus, and arsenic can be added. Alternatively, as the dopants, at least one of helium, neon, argon, krypton, and xenon can be added. Still alternatively, as the dopants, at least one of boron, nitrogen, phosphorus, and arsenic and at least one of helium, neon, argon, krypton, and xenon in appropriate combination can be added.

In the embodiment described here, the addition of the dopants into the oxide semiconductor film 119 is conducted in a state where the oxide semiconductor film 119 is covered with the insulating film and the like; alternatively, the addition of the dopants may be conducted in a state where the oxide semiconductor film 119 is exposed.

Alternatively, the dopants can be added by a method other than injection methods such as an ion doping method and an ion implantation method. For example, the dopants can be added in the following manner: plasma is generated under an atmosphere of gas containing an element to be added and plasma treatment is performed on a film to which the dopants are added. A dry etching apparatus, a plasma CVD apparatus, a high-density plasma CVD apparatus, or the like can be used to generate the plasma.

The addition treatment of the dopants may be performed while heat treatment is performed.

By adding the dopants to the oxide semiconductor film 119, the second regions 119b can be amorphous. Since hydrogen tends to be diffused into an amorphous oxide semiconductor, hydrogen in the first region 119a is diffused into the second regions 119b so that the hydrogen concentration in the first region 119a, which is to be a channel region, can be reduced and the second regions 119b can be an n-type (have a low resistance). As a result, on-state current of the transistor can be increased.

Here, phosphorus is added to the oxide semiconductor film 119 by an ion implantation method.

After that, heat treatment may be performed. The heat treatment is performed typically at a temperature higher than or equal to 150° C. and lower than or equal to 450° C., preferably higher than or equal to 250° C. and lower than or equal to 325° C. In the heat treatment, the temperature may be gradually increased from 250° C. to 325° C.

Through the heat treatment, the resistance of the pair of second regions 119b containing dopants can be reduced. In the heat treatment, the pair of second regions 119b containing the dopants may be in either a crystalline state or an amorphous state.

Figure 3C:
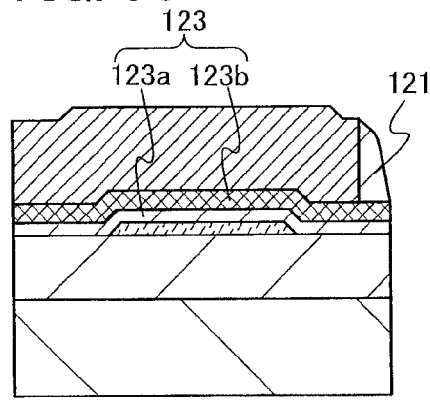
Figure 3D:
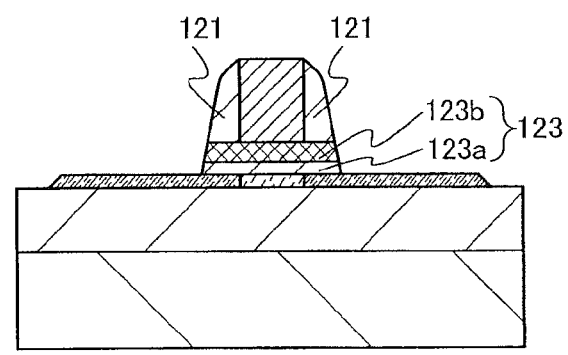

Next, as illustrated in FIGS. 3C and 3D, the sidewalls 121 on the side surfaces of the gate electrode 115 and the gate insulating film 123 are formed. A method for forming the sidewalls 121 is described below.

First, an insulating film that is to be the sidewalls 121 is formed over the metal oxide film 113 and the gate electrode 115. The insulating film is formed by a sputtering method, a CVD method, or the like. In addition, although the thickness of the insulating film is not particularly limited, the thickness is selected as appropriate in consideration of coverage with respect to the shape of the gate electrode 115.

Next, the sidewalls 121 are formed by etching the insulating film. The sidewalls 121 can be formed in a self-aligned manner by performing a highly anisotropic etching step on the insulating film. Here, dry etching is preferably employed as highly anisotropic etching, and a gas including fluorine such as trifluoromethane ($CHF_3$), octafluorocyclobutane ($C_4F_8$), or tetrafluoromethane ($CF_4$) can be used as an etching gas. A rare gas such as helium (He) or argon (Ar) or hydrogen ($H_2$) may be added to the etching gas. In addition, as the dry etching, a reactive ion etching (RIE) method in which high-frequency voltage is applied to a substrate, is preferably used.

Here, a silicon oxynitride film having a thickness of 90 nm is formed by a CVD method. Next, a silicon oxynitride film is dry-etched, so that the sidewalls 121 are formed.

Since, in the cross section, the width of each of the offset regions corresponds to the width of each of the sidewalls 121 and the width of each of the sidewalls 121 corresponds to the thickness of the gate electrode 115, the thickness of the gate electrode 115 is set so that the range of the offset regions is in a desired range.

At the same time that the sidewalls 121 are formed, the oxide insulating film 112 and the metal oxide film 113 are etched by highly anisotropic etching to expose the oxide semiconductor film 119, so that the gate insulating film 123 can be formed.

Figure 3E:
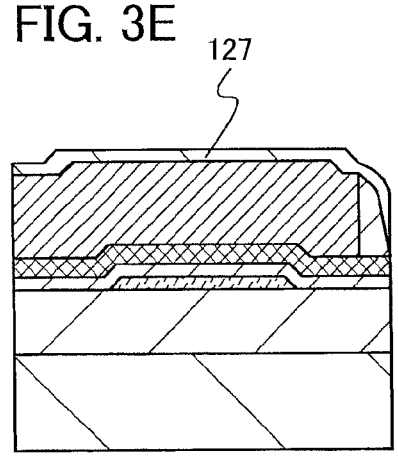
Figure 3F:
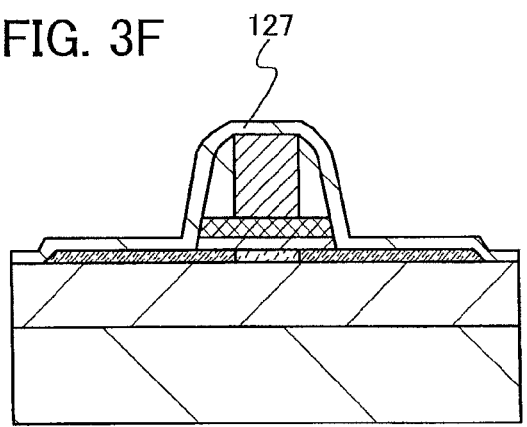

Next, the insulating film 127 is formed as illustrated in FIGS. 3E and 3F.

The insulating film 127 is formed by a sputtering method, a CVD method, a coating method, a printing method, or the like.

Oxygen may be added to the insulating film 127 by an ion implantation method, an ion doping method, a plasma method, or the like.

Here, a silicon oxynitride film having a thickness of 460 nm is formed by a CVD method as the insulating film 127.

After that, heat treatment may be performed. The heat treatment is performed typically at a temperature higher than or equal to 150° C. and lower than the strain point of the substrate, preferably higher than or equal to 250° C. and lower than or equal to 450° C., more preferably higher than or equal to 300° C. and lower than or equal to 450° C.

An electric furnace, an RTA apparatus, or the like can be used for the heat treatment. With use of an RTA apparatus, heat treatment at a temperature higher than or equal to the strain point of the substrate can be performed only for a short time. Thus, time during which hydrogen or water is released from the oxide insulating film can be shortened.

The heat treatment may be performed under an atmosphere of nitrogen, oxygen, ultra-dry air (air in which a water content is 20 ppm or less, preferably 1 ppm or less, more preferably 10 ppb or less), or a rare gas (argon, helium, or the like). The atmosphere of nitrogen, oxygen, ultra-dry air, or a rare gas preferably does not contain hydrogen, water, and the like.

Here, the heating is performed under an oxygen atmosphere at 400° C. for an hour with an electric furnace.

Figure 4A:
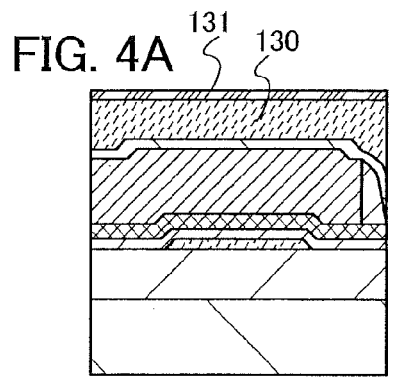
FIGS. 4A to 4H are cross-sectional views illustrating the method for manufacturing the semiconductor device, according to one embodiment of the present invention.
Figure 4B:
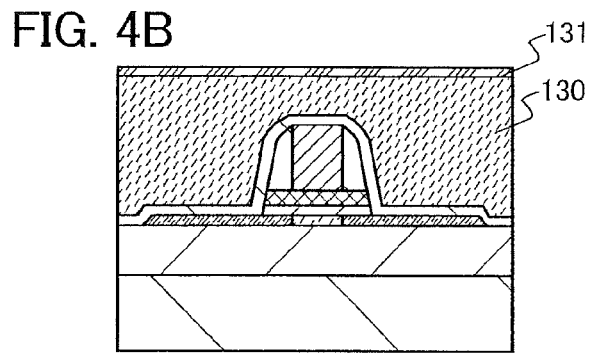

Next, as illustrated in FIGS. 4A and 4B, the interlayer insulating film 130 and the interlayer insulating film 131 are formed over the insulating film 127. The interlayer insulating film 131 functions as an embedded planarization film for the contact plugs 125 (note that the interlayer insulating film whose top surface is planarized is also referred to as a planarization film or a planarization insulating film).

Since a wiring is formed above the interlayer insulating film 130 with the interlayer insulating film 131 interposed therebetween, generation of parasitic capacitance between the wiring and the transistor needs to be prevented. Thus, the interlayer insulating film 130 is preferably an insulating film having a low dielectric constant (low-k film). Since the transistor has a depression and a projection, the interlayer insulating film 130 preferably covers the depression and the projection efficiently. In the case of forming wirings above the transistor, a lot of CMP treatment steps are performed for the wirings in the upper layer; thus, the interlayer insulating film 130 preferably has sufficiently high mechanical strength.

For the interlayer insulating film 130, it is possible to use an insulator such as silicon oxide, silicon oxynitride, silicon nitride oxide, borophosphosilicate glass (BPSG), phosphosilicate glass (PSG), silicon oxide to which carbon is added (SiOC), silicon oxide to which fluorine is added (SiOF), tetraethylorthosilicate (TEOS) which is silicon oxide made from $Si(OC_2H_5)_4$, hydrogen silsesquioxane (HSQ), methyl silsesquioxane (MSQ), organosilicate glass (OSG), or an organic-polymer-based material. In particular, in the case of advancing miniaturization of the semiconductor device, the relative permittivity of silicon oxide (k=4.0 to 4.5) is too high, and thus it is preferable to use a material with k=3.0 or less. As long as needed mechanical strength can be secured, the interlayer insulating film can be made porous to have a lower dielectric constant. The interlayer insulating film 130 is formed by a sputtering method, a CVD method, a coating method including a spin coating method (also referred to as spin on glass (SOG)), or the like.

Further, in order to planarize a surface of the deposited interlayer insulating film 130, chemical mechanical polishing (CMP) treatment is preferably performed. Alternatively, a reflow method performed by heating may be performed instead of CMP treatment. Further alternatively, a reflow method and CMP treatment may be performed in combination.

The interlayer insulating film 131 is used as a protective film against CMP treatment that is performed in a later step on tungsten or the like in order to form the contact plugs 125.

In the case where tungsten is used for the contact plugs 125, for example, the surface of tungsten is oxidized with use of an acid solution into which a hydrogen peroxide solution is mixed, and the tungsten above the interlayer insulating film 131 is removed by abrasive particles contained in slurry. The interlayer insulating film 131 is used for protecting the interlayer insulating film 130 physically and chemically from these solution and abrasive particles. Further, the interlayer insulating film 131 may have a function for preventing impurities from being diffused from the wiring formed in an upper layer.

The interlayer insulating film 131 can be formed using an inorganic insulator such as silicon oxide, silicon oxynitride, silicon nitride oxide, or silicon nitride or a metal oxide such as aluminum oxide, aluminum oxynitride, gallium oxide, gallium oxynitride, yttrium oxide, yttrium oxynitride, hafnium oxide, or hafnium oxynitride. The interlayer insulating film 131 is formed by a sputtering method, a CVD method, or the like.

Figure 4C:
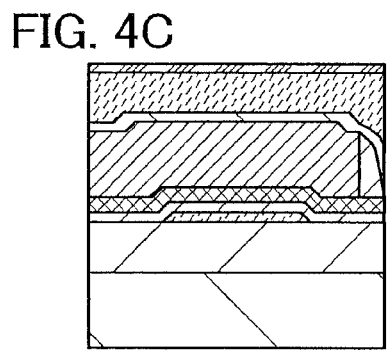
Figure 4D:
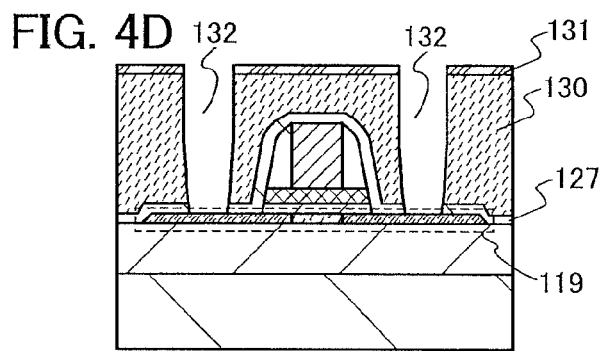

Next, as illustrated in FIGS. 4C and 4D, via holes 132 for forming the contact plugs 125 are formed in the interlayer insulating film 131, the interlayer insulating film 130, and the insulating film 127.

The via holes 132 can be formed in an arbitrary portion with an arbitrary shape by a photolithography method. Here, a pair of columnar via holes is formed to be the source and the drain of the transistor.

Since the via holes 132 preferably have a high aspect ratio, highly anisotropic dry etching is preferably performed. In particular, a reactive ion etching (RIE) method is preferably used. Since the contact plugs 125 electrically connect the oxide semiconductor film 119 to the wiring formed over the interlayer insulating film 131, the etching is performed on the conditions under which the top surface of the oxide semiconductor film 119 is sufficiently exposed.

Figure 4E:
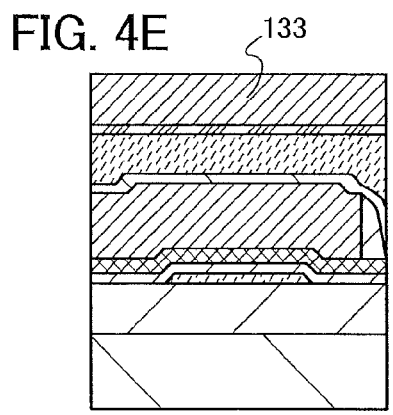
Figure 4F:
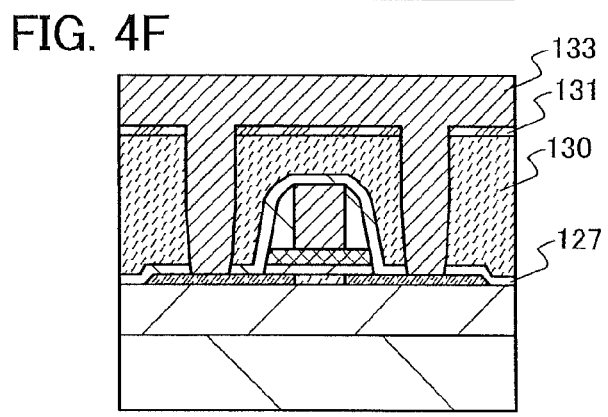

Next, as illustrated in FIGS. 4E and 4F, a conductive material such as tungsten is embedded in the via holes 132 penetrating the interlayer insulating film 131, the interlayer insulating film 130, and the insulating film 127, so that the contact plugs 125 are formed.

First, a barrier film (diffusion prevention film) which is a titanium film, a titanium nitride film, a stacked layer of them, or the like is formed on inner walls of the via holes 132 (that is, side walls of the interlayer insulating film 131, the interlayer insulating film 130, and the insulating film 127 in the via holes) and on a bottom surface of the via holes 132 (that is, the exposed top surface of the oxide semiconductor film 119). The barrier film can be formed using a metal material such as molybdenum or a nitride thereof. The barrier film has functions of improving contact resistance, improving adhesion with the interlayer insulating film or the oxide semiconductor film, preventing diffusion of impurities, or the like. The barrier film may be formed as thin as possible unless the barrier film loses the functions, and a material such as tungsten that is formed in the next step plays the main role in electrical conduction, which is a primary function of a contact plug.

Next, the material 133 such as tungsten or polysilicon doped with phosphorus, or the like is embedded in the via holes in which the barrier film is formed. For example, tungsten can be embedded in the via holes 132 by a blanket CVD method. The material 133 such as tungsten grows not only in the via holes 132 but also the outside of the via holes 132, and grows over the interlayer insulating film 131.

Figure 4G:
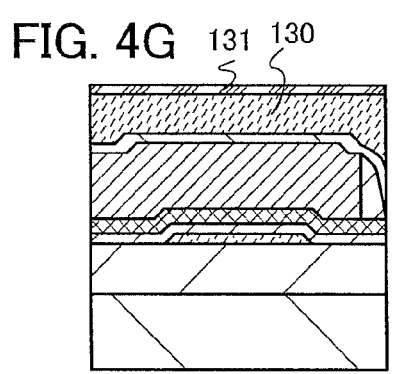
Figure 4H:
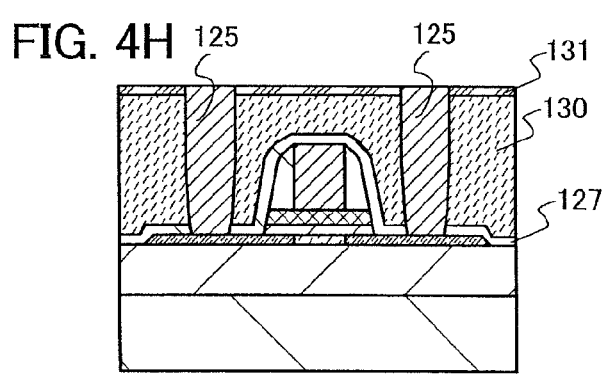

Thus, as illustrated in FIGS. 4G and 4H, an unnecessary part of the material 133 such as tungsten is removed by a CMP method, so that the pair of contact plugs 125 electrically isolated is formed. Note that in planarization treatment by the CMP method, the interlayer insulating film 131 functions as a protective film of the interlayer insulating film 130.

Through the above-described steps, the transistor and the contact plugs connected to the transistor can be manufactured.

According to this embodiment, a metal film is formed over an oxide insulating film, and oxygen can be added to the metal film to form a metal oxide film and added also to the oxide insulating film. The oxide insulating film and the metal oxide film to which oxygen is added are used as a gate insulating film of the transistor including the oxide semiconductor film. Since oxygen is added to the oxide insulating film in contact with the oxide semiconductor film, the oxygen can be diffused (solid-phase diffusion) into the oxide semiconductor film by heat treatment, so that oxygen vacancies in the oxide semiconductor film can be reduced. In particular, oxygen vacancies in a side surface of the oxide semiconductor film are compensated by diffusion of the oxygen, so that generation of a parasitic channel can be suppressed. As a result, leakage current between the source electrode and the drain electrode flowing through the side surface of the oxide semiconductor film overlapping with the gate electrode can be reduced.

The oxide semiconductor film is surrounded by the oxide insulating film in which part of oxygen is released by heating and the oxide insulating film to which oxygen is added. Therefore, in the heat treatment, oxygen contained in the oxide insulating film can be efficiently diffused into the oxide semiconductor film, so that oxygen vacancies in the oxide semiconductor film and the vicinity of the interface between the oxide semiconductor film and the oxide insulating film can be reduced.

Therefore, the negative shift of the threshold voltage of the transistor can be reduced and a leakage current between a source and a drain of the transistor can be reduced; accordingly, electrical characteristics of the transistor can be improved. With such structures of the transistor and the periphery thereof (including the base insulating film), the channel length of the transistor can be less than or equal to 100 nm, e.g., 30 nm. Also in such a case, the off-state current can be several yA/μm to several zA/μm.

Since the metal oxide film is formed by adding oxygen to the metal film, productivity can be improved.

Embodiment 2

In this embodiment, a transistor in which a metal oxide film formed by oxidizing a metal film is used as a gate insulating film and a method for manufacturing the transistor are described with reference to FIGS. 1A to 1C, FIGS. 2A to 2H, FIGS. 3A to 3F, FIGS. 4A to 4H, and FIGS. 5A and 5B. The transistor in this embodiment is different from that in Embodiment 1 in that only the metal oxide film formed by adding oxygen to a metal film is the gate insulating film.

Figure 5A:
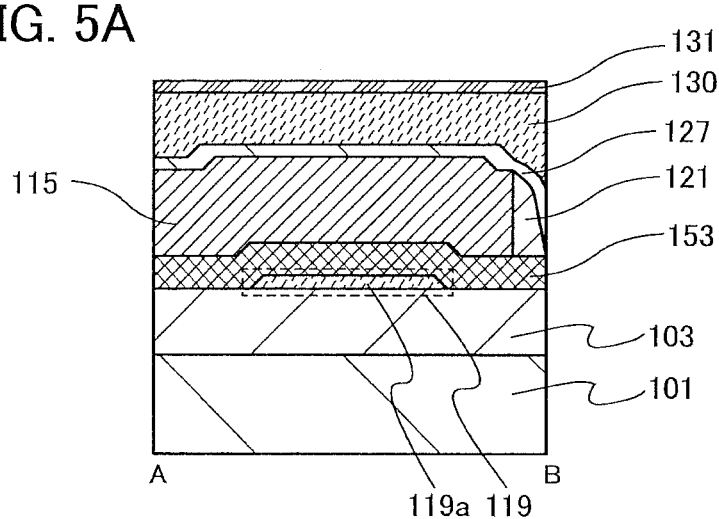
FIGS. 5A and 5B are cross-sectional views illustrating a semiconductor device according to one embodiment of the present invention.
Figure 5B:
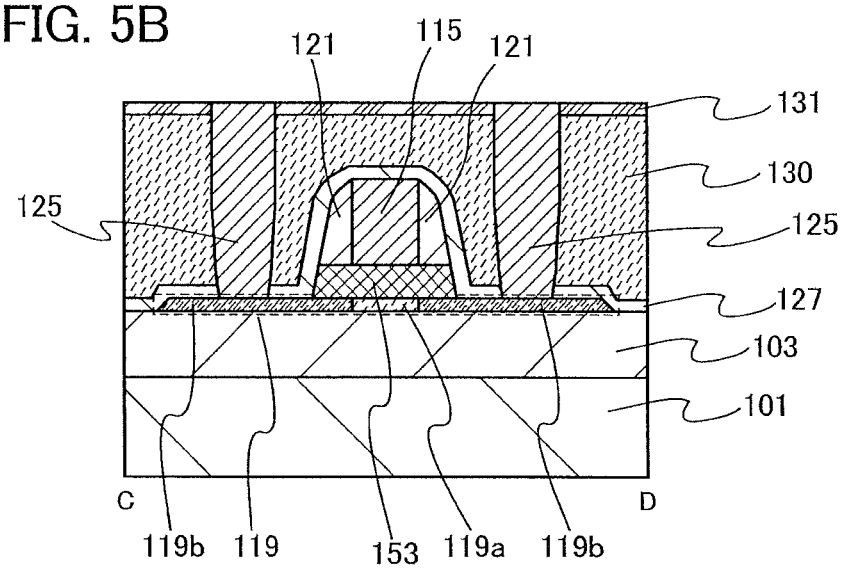

FIGS. 5A and 5B are cross-sectional views of the transistor described in this embodiment. The top view of the transistor illustrated in FIGS. 5A and 5B is similar to that in FIG. 1A described in Embodiment 1, and thus is not illustrated here. FIG. 5A is a cross-sectional view in the channel width direction of the transistor, which corresponds to the dashed-dotted line A-B in FIG. 1A. FIG. 5B is a cross-sectional view in the channel length direction of the transistor, which corresponds to the dashed-dotted line C-D in FIG. 1A.

The transistor illustrated in FIGS. 5A and 5B includes the oxide insulating film 103 over the substrate 101, the oxide semiconductor film 119 over the oxide insulating film 103, the pair of contact plugs 125 that is in contact with the oxide semiconductor film 119 and functions as a source electrode and a drain electrode, a gate insulating film 153 in contact with at least part of the oxide semiconductor film 119, and the gate electrode 115 provided over the gate insulating film 153 to overlap with the oxide semiconductor film 119.

Further, the transistor includes the sidewalls 121 in contact with the side surfaces of the gate electrode 115. The oxide semiconductor film 119 includes the first region 119a overlapping with the gate electrode 115 and the pair of second regions 119b between which the first region 119a is provided and which contains the dopants. The second regions 119b are low-resistance regions. Further, the transistor includes the insulating film 127 over the oxide insulating film 103, the gate electrode 115, and the sidewalls 121. The transistor further includes the interlayer insulating films 130 and 131 over the insulating film 127, and the contact plugs 125 in via holes penetrating the insulating film 127 and the interlayer insulating films 130 and 131.

In the transistor illustrated in FIGS. 5A and 5B, a metal oxide film formed by adding oxygen to a metal film is used as the gate insulating film 153.

Next, a method for manufacturing the transistor illustrated in FIGS. 5A and 5B is described. In the transistor illustrated in FIGS. 5A and 5B, a metal film is formed over the oxide semiconductor film 105 after the step illustrated in FIGS. 2A and 2B described in Embodiment 1. The metal film can be formed as appropriate using a material and a formation method that are similar to those of the metal film 109 described in Embodiment 1.

Next, as in Embodiment 1, oxygen is added to the metal film to oxidize the metal film and added also to the oxide semiconductor film.

Since oxygen is added to the metal film and added also to the oxide insulating film in contact with the oxide semiconductor film, oxygen vacancies in the oxide semiconductor film can be reduced. In particular, oxygen vacancies in a side surface of the oxide semiconductor film are compensated by diffusion of the oxygen, so that generation of a parasitic channel can be suppressed. As a result, leakage current between the source electrode and the drain electrode flowing through the side surfaces, which are shown by the dashed line 129 in FIG. 1A, of the oxide semiconductor film overlapping with the gate electrode can be reduced.

Next, heat treatment may be performed.

Here, a method for forming the metal film and a method of adding oxygen to the metal film can be similar to those in Embodiment 1.

After that, as in Embodiment 1, steps illustrated in FIGS. 2G and 2H, FIGS. 3A to 3F, and FIGS. 4A to 4H are performed, so that the transistor illustrated in FIGS. 5A and 5B can be manufactured.

Through the above-described steps, a transistor in which the negative shift of the threshold voltage is reduced and a leakage current between a source and a drain is reduced and which has excellent electrical characteristics can be manufactured with high productivity.

Embodiment 3

In this embodiment, a transistor in which a metal oxide film formed by oxidizing a metal film is used as a protective film for the transistor and a method for manufacturing the transistor are described with reference to FIGS. 1A to 1C, FIGS. 2A to 2H, and FIGS. 3A to 3D, and FIGS. 6A and 6B.

Figure 6A:
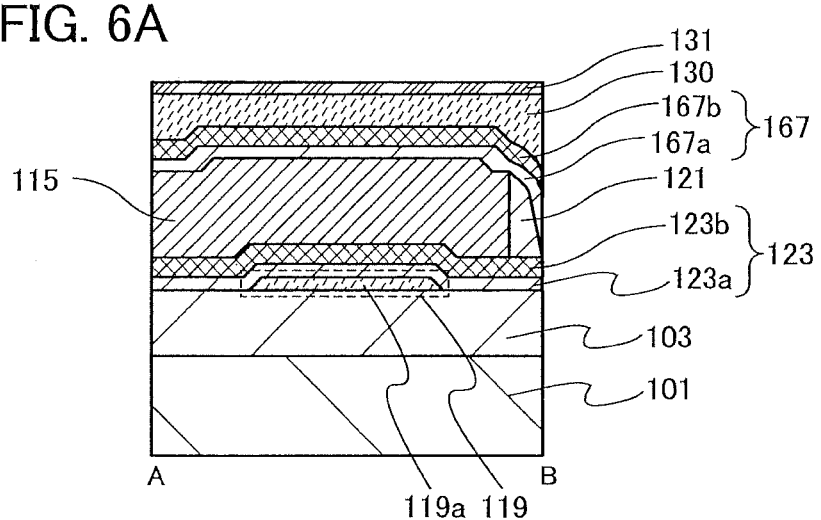
FIGS. 6A and 6B are cross-sectional views illustrating a semiconductor device according to one embodiment of the present invention.
Figure 6B:
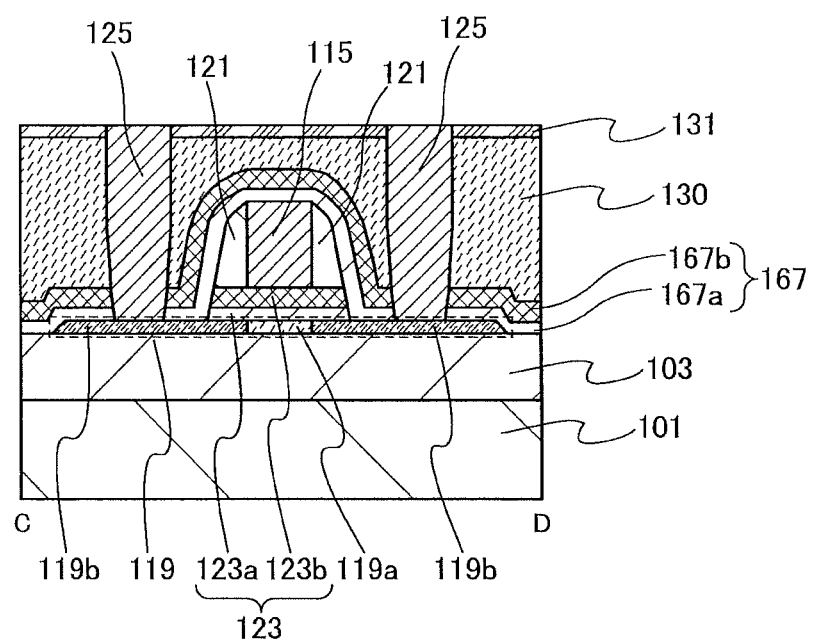

FIGS. 6A and 6B are cross-sectional views of the transistor described in this embodiment. The top view of the transistor illustrated in FIGS. 6A and 6B is similar to that in FIG. 1A described in Embodiment 1, and thus is not illustrated here. FIG. 6A is a cross-sectional view in the channel width direction of the transistor, which corresponds to the dashed-dotted line A-B in FIG. 1A. FIG. 6B is a cross-sectional view in the channel length direction of the transistor, which corresponds to the dashed-dotted line C-D in FIG. 1A.

The transistor illustrated in FIGS. 6A and 6B includes the oxide insulating film 103 over the substrate 101, the oxide semiconductor film 119 over the oxide insulating film 103, the pair of contact plugs 125 that is in contact with the oxide semiconductor film 119 and functions as a source electrode and a drain electrode, the gate insulating film 123 in contact with at least part of the oxide semiconductor film 119, and the gate electrode 115 provided over the gate insulating film 123 to overlap with the oxide semiconductor film 119. Further, the transistor includes the sidewalls 121 in contact with the side surfaces of the gate electrode 115. Moreover, the transistor includes a protective film 167 over the oxide insulating film 103, the gate electrode 115, and the sidewalls 121. The transistor further includes the interlayer insulating films 130 and 131 over the protective film 167, and the contact plugs 125 in via holes provided in the protective film 167 and the interlayer insulating films 130 and 131.

The oxide semiconductor film 119 includes the first region 119a overlapping with the gate electrode 115 and the pair of second regions 119b between which the first region 119a is provided and which contains the dopants. The second regions 119b are low-resistance regions. In the oxide semiconductor film 119, the first region 119a serves as a channel region. In the pair of second regions 119b containing the dopants, regions overlapping with the sidewalls 121 serve as electric-field relaxation regions, and regions not overlapping with the sidewalls 121 including regions in contact with the pair of contact plugs 125 serve as a source region and a drain region.

In the transistor illustrated in FIGS. 6A and 6B, the protective film 167 has a staked-layer structure of an oxide insulating film 167a and a metal oxide film 167b. The oxide insulating film 167a is formed on the gate electrode 115 side. The metal oxide film 167b is in contact with the oxide insulating film 167a, and is a metal oxide film formed by adding oxygen to a metal film.

The gate insulating film 123 has a stacked-layer structure of an oxide insulating film 123a in contact with the oxide semiconductor film 119 and a metal oxide film 123b in contact with the gate electrode 115. The oxide insulating film 123a and the metal oxide film 123b each can be formed using any of the materials and the formation methods described in Embodiment 1 as appropriate.

The gate insulating film 123 having a stacked-layer structure is described here; however, the gate insulating film 123 can have a single-layer structure such as the gate insulating film 153 described in Embodiment 2 and the material and the formation method of the gate insulating film 153 can be used as appropriate. A CVD method or a sputtering method may be applied as appropriate as an alternative to the formation method described in Embodiment 2.

Figure 7A:
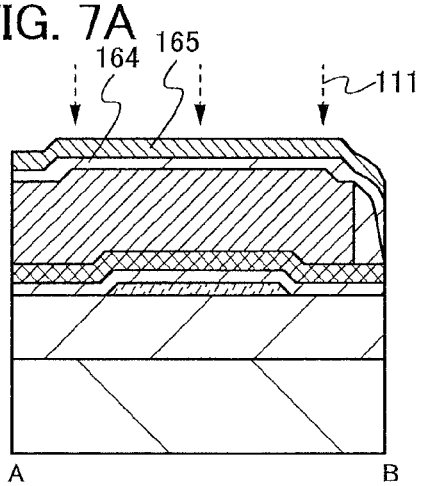
FIGS. 7A to 7D are cross-sectional views illustrating a method for manufacturing the semiconductor device, according to one embodiment of the present invention.
Figure 7B:
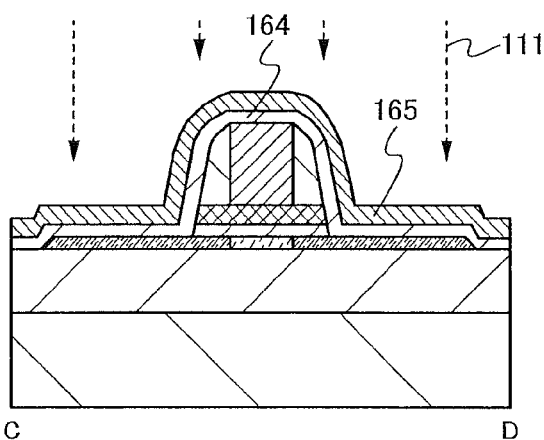

Next, a method for manufacturing the transistor in FIGS. 6A and 6B is described. In the transistor illustrated in FIGS. 6A and 6B, after the steps illustrated in FIGS. 2A to 2H and FIGS. 3A to 3D described in Embodiment 1, an oxide insulating film 164 is formed, and a metal film 165 is formed over the oxide insulating film 164 as illustrated in FIGS. 7A and 7B.

The oxide insulating film 164 may be formed with a single layer or a stack including one or more of silicon oxide, silicon oxynitride, silicon nitride oxide, silicon nitride, aluminum oxide, aluminum oxynitride, aluminum nitride oxide, aluminum nitride, and the like.

The oxide insulating film 164 is formed by a sputtering method, a CVD method, a coating method, a printing method, or the like.

The metal film 165 can be formed as appropriate using a material and a formation method that are similar to those of the metal film 109 described in Embodiment 1.

Figure 7C:
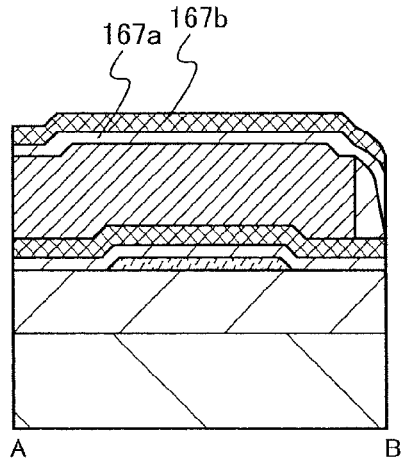
Figure 7D:
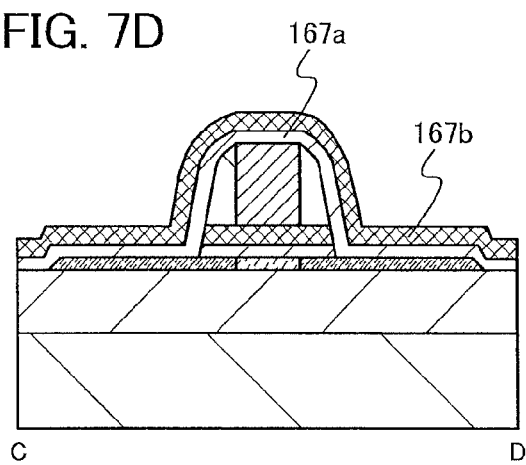

Next, as in Embodiment 1, the oxygen 111 is added to the metal film 165 to oxidize the metal film 165 and added also to the oxide insulating film 164, whereby the oxide insulating film 167a and the metal oxide film 167b to which oxygen is added are formed as illustrated in FIGS. 7C and 7D.

Oxygen may be added to the oxide insulating film 164 before the metal film 165 is formed. As a result of performing oxygen addition plural times, the amount of oxygen in the oxide insulating film 164 to which oxygen is added can be further increased.

Here, as the oxide insulating film 164, a silicon oxynitride film having a thickness of 50 nm is formed by a CVD method. Next, as the metal film 165, an aluminum film having a thickness of 10 nm is formed by a sputtering method. Then, oxygen-adding treatment is performed on the metal film 165 using the similar conditions to Embodiment 1, so that an aluminum oxide film is formed.

After that, heat treatment may be performed. The heating temperature is typically higher than or equal to 150° C. and lower than the strain point of the substrate, preferably higher than or equal to 300° C. and lower than or equal to 500° C., more preferably higher than or equal to 400° C. and lower than or equal to 450° C. As a result of performing oxygen addition plural times, the amount of oxygen in the oxide insulating film 164 to which oxygen is added can be further increased.

An electric furnace, an RTA apparatus, or the like can be used for the heat treatment. With use of an RTA apparatus, heat treatment at a temperature higher than or equal to the strain point of the substrate can be performed only for a short time.

The heat treatment may be performed under an atmosphere of nitrogen, oxygen, ultra-dry air (air in which a water content is 20 ppm or less, preferably 1 ppm or less, more preferably 10 ppb or less), or a rare gas (argon, helium, or the like). The atmosphere of nitrogen, oxygen, ultra-dry air, or a rare gas preferably does not contain hydrogen, water, and the like.

Here, the heat treatment is performed under an oxygen atmosphere at 400° C. for an hour with an electric furnace.

The oxide insulating film 167a to which oxygen is added is provided over the transistor, and the metal oxide film 167b is provided over the oxide insulating film 167a. The metal oxide film functions as an oxygen diffusion prevention film; thus, oxygen contained in the oxide insulating film 103 can be efficiently diffused into the oxide semiconductor film in heat treatment. Further, oxygen in the oxide insulating film 167a can be efficiently diffused into the oxide semiconductor film through the oxide insulating film 103. The metal oxide film also functions as a film for preventing entry of hydrogen, water, and the like; thus, entry of hydrogen, water, and the like from the outside to the oxide semiconductor film in the transistor can be suppressed. Thus, leakage current of the transistor can be reduced.

After that, an interlayer insulating film and contact plugs are formed by above-described methods, so that the transistor illustrated in FIGS. 6A and 6B can be manufactured.

Through the above-described steps, a transistor in which the negative shift of the threshold voltage is reduced and a leakage current between a source and a drain is reduced and which has excellent electrical characteristics can be manufactured with high productivity.

Embodiment 4

In this embodiment, a transistor in which a metal oxide film formed by oxidizing a metal film is used as a protective film of the transistor and a method for manufacturing the transistor are described with reference to FIGS. 1A to 1C, FIGS. 2A to 2H, and FIGS. 3A to 3D, and FIGS. 8A and 8B. The transistor in this embodiment is different from that in Embodiment 3 in that only the metal oxide film formed by adding oxygen to a metal film is the protective film of the transistor.

Figure 8A:
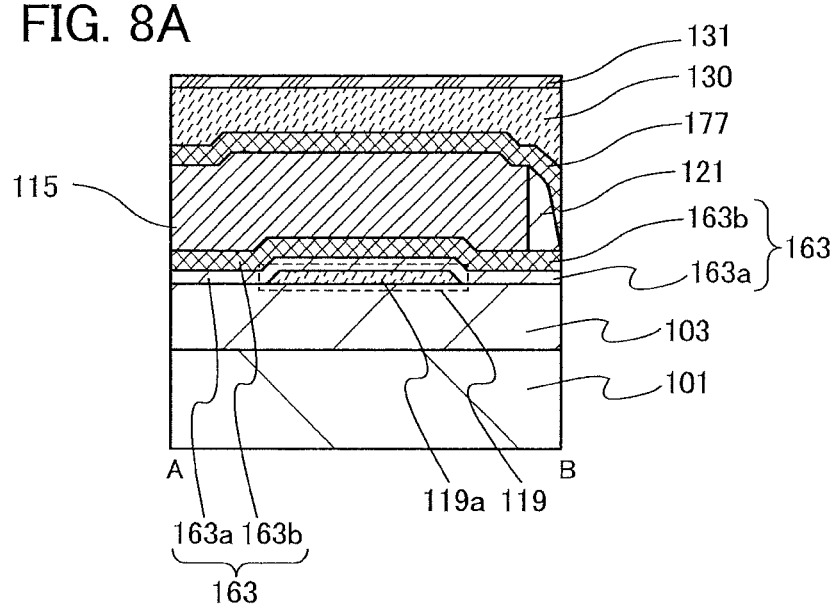
FIGS. 8A and 8B are cross-sectional views illustrating a semiconductor device according to one embodiment of the present invention.
Figure 8B:
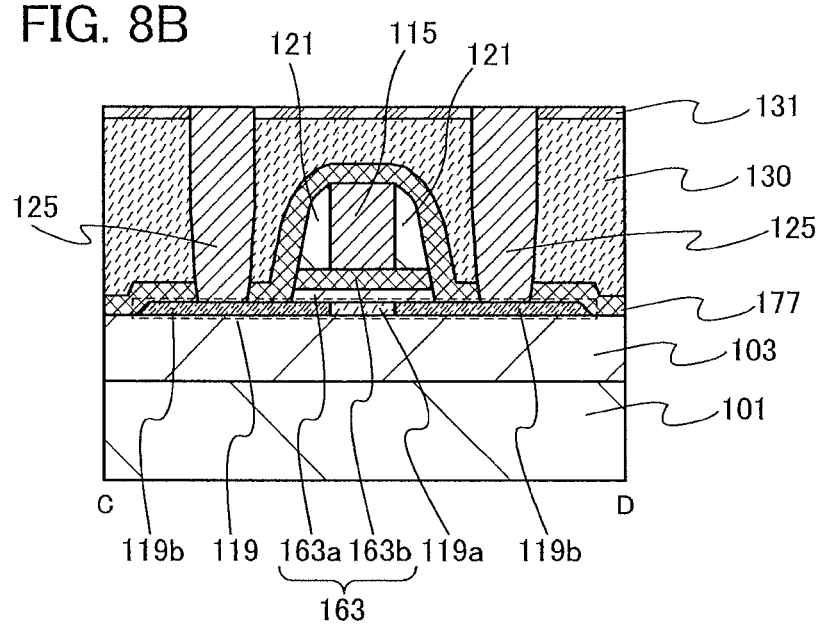

FIGS. 8A and 8B are cross-sectional views of the transistor described in this embodiment. The top view of the transistor illustrated in FIGS. 8A and 8B is similar to that in FIG. 1A described in Embodiment 1, and thus is not illustrated here. FIG. 8A is a cross-sectional view in the channel width direction of the transistor, which corresponds to the dashed-dotted line A-B in FIG. 1A. FIG. 8B is a cross-sectional view in the channel length direction of the transistor, which corresponds to the dashed-dotted line C-D in FIG. 1A.

The transistor illustrated in FIGS. 8A and 8B includes the oxide insulating film 103 over the substrate 101, the oxide semiconductor film 119 over the oxide insulating film 103, the pair of contact plugs 125 that is in contact with the oxide semiconductor film 119 and functions as a source electrode and a drain electrode, a gate insulating film 163 (here, a stack of gate insulating films 163a and 163b) in contact with at least part of the oxide semiconductor film 119, and the gate electrode 115 provided over the gate insulating film 163 to overlap with the oxide semiconductor film 119. Further, the transistor includes the sidewalls 121 in contact with the side surfaces of the gate electrode 115. Further, the transistor includes a protective film formed of a metal oxide film 177 over the oxide insulating film 103, the gate electrode 115, and the sidewalls 121.

The oxide semiconductor film 119 includes the first region 119a overlapping with the gate electrode 115 and the pair of second regions 119b between which the first region 119a is provided and which contains dopants. The second regions 119b are low-resistance regions. In the oxide semiconductor film 119, the first region 119a serves as a channel region. In the pair of second regions 119b containing the dopants, regions overlapping with the sidewalls 121 serve as electric-field relaxation regions, and regions not overlapping with the sidewalls 121 including regions in contact with the pair of contact plugs 125 serve as a source region and a drain region.

In the transistor illustrated in FIGS. 8A and 8B, the metal oxide film 177 has a single-layer structure and is a metal oxide film formed by adding oxygen to a metal film.

Next, a method for manufacturing the transistor illustrated in FIGS. 8A and 8B is described. In the transistor illustrated in FIGS. 8A and 8B, a metal film is formed over the gate electrode 115 and the sidewalls 121 after the steps illustrated in FIGS. 2A to 2H and FIGS. 3A to 3D described in Embodiment 1. The metal film can be formed as appropriate using a material and a formation method that are similar to those of the metal film 109 described in Embodiment 1.

Next, as in Embodiment 1, oxygen is added to the metal film to form the metal oxide film 177 by oxidizing the metal film and added also to the oxide semiconductor film. After that, heat treatment may be performed.

Here, as in Embodiment 1, a metal film is formed and oxygen-adding treatment is performed, so that the metal oxide film 177 is formed.

After that, heat treatment may be performed as in Embodiment 3.

Here, the heat treatment is performed under an oxygen atmosphere at 400° C. for an hour with an electric furnace.

The gate insulating film 163a to which oxygen is added is provided over the oxide semiconductor film 119, and the metal oxide film 177 is provided over the gate insulating film 163a. The metal oxide film functions as an oxygen diffusion prevention film; thus, oxygen contained in the oxide insulating film 103 can be efficiently diffused into the oxide semiconductor film in the heat treatment. Further, oxygen in the gate insulating film 163a can be diffused into the oxide semiconductor film efficiently through the oxide insulating film 103. The metal oxide film also functions as a film for preventing entry of hydrogen, water, and the like; thus, entry of hydrogen, water, and the like from the outside to the oxide semiconductor film in the transistor can be suppressed. Thus, leakage current of the transistor can be reduced.

After that, an interlayer insulating film and contact plugs are formed by above-described methods, so that the transistor illustrated in FIGS. 8A and 8B can be manufactured.

Through the above-described steps, a transistor in which the negative shift of the threshold voltage is reduced and a leakage current between a source and a drain is reduced and which has excellent electrical characteristics can be manufactured with high productivity.

Embodiment 5

In this embodiment, a method for lowering the resistance of a source region and a drain region of an oxide semiconductor film is described with reference to FIGS. 2A to 2H, FIGS. 3A to 3F, and FIGS. 9A to 9C. In this embodiment, description is made using Embodiment 1; however, this embodiment can also be applied to Embodiments 2 to 4 as appropriate.

Figure 9A:
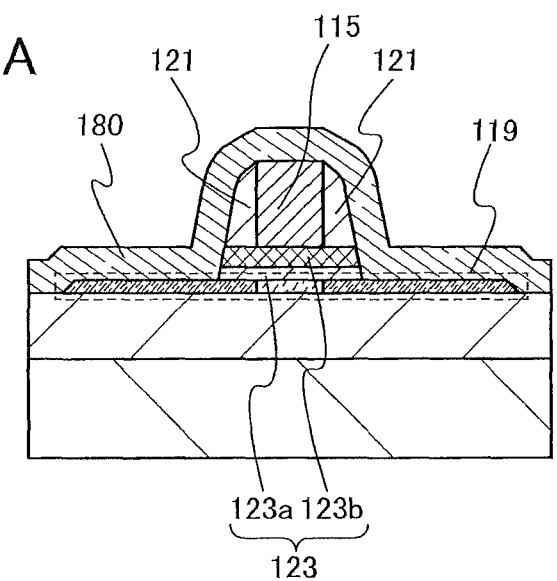
FIGS. 9A to 9C are cross-sectional views illustrating a method for manufacturing a semiconductor device, according to one embodiment of the present invention.

After the steps illustrated in FIGS. 2A to 2H and FIGS. 3A to 3D as in Embodiment 1, a metal film 180 is formed over the oxide semiconductor film 119, the sidewalls 121, and the gate insulating film 123 that are illustrated in FIG. 9A.

For the metal film 180, a metal film containing one or more metal elements selected from aluminum, indium, titanium, tin, molybdenum, tungsten, zinc, hafnium, tantalum, lanthanum, barium, magnesium, zirconium, and nickel can be used.

The metal film 180 is formed by a CVD method, a sputtering method, an evaporation method, or the like. The thickness of the metal film 180 may be greater than or equal to 1 nm and less than or equal to 30 nm, more preferably greater than or equal to 2 nm and less than or equal to 5 nm.

Next, heat treatment is performed under an oxygen atmosphere, a nitrogen atmosphere, an inert gas atmosphere, or a reduced-pressure atmosphere. The heating temperature at this time may be set to be higher than or equal to 100° C. and lower than or equal to 700° C., preferably higher than or equal to 200° C. and lower than or equal to 400° C.

By the heat treatment, in a region where the metal film 180 is in contact with the oxide semiconductor film 119, metal elements in the metal film 180 are diffused into the oxide semiconductor film 119 and oxygen contained in the oxide semiconductor film 119 is diffused into the metal film 180, so that oxygen vacancies are formed in the oxide semiconductor film 119.

Figure 9B:
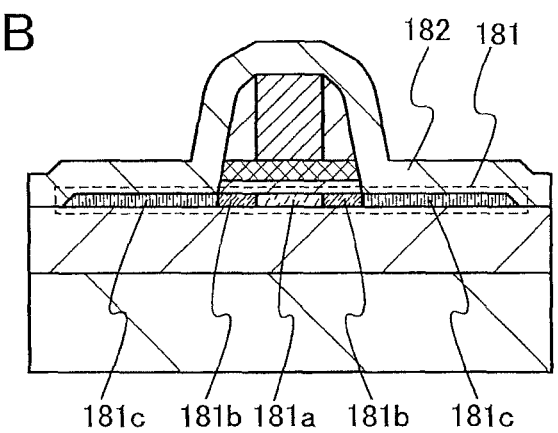

As a result, as illustrated in FIG. 9B, an oxide semiconductor film 181 is formed. The oxide semiconductor film 181 includes a first region 181a overlapping with the gate electrode 115, a pair of second regions 181b which contains the dopants and between which the first region 181a is provided, and third regions 181c which contains the dopants and metal elements and between which the pair of second regions 181b is provided. Note that the second regions 181b have a lower resistance than the first region 181a functioning as a channel region. Since the third regions 181c which contains the dopants and metal elements and in which oxygen vacancies are formed, the third regions 181c have a lower resistance than the second regions 181b.

In the conditions of the above heat treatment, the metal film 180 is oxidized to be a metal oxide film in some cases. In FIG. 9B, a metal oxide film 182 formed by oxidizing the metal film is illustrated.

Figure 9C:
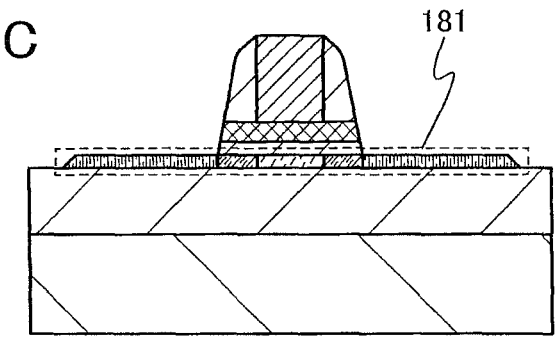

Next, the metal oxide film 182 is removed, so that the third regions 181c in the oxide semiconductor film 181 are exposed as illustrated in FIG. 9C. Depending on the conditions of the heat treatment, the metal film 180 is not oxidized in some cases, in which case the metal film 180 is also removed.

After that, steps illustrated in FIGS. 3E and 3F are performed, so that the transistor including the third regions having a lower resistance than the second regions described in Embodiment 1 in the oxide semiconductor film functioning as the source region and the drain region can be manufactured. As a result, a transistor with high on-state current can be manufactured.

Embodiment 6

In this embodiment, a semiconductor device that includes a transistor including a first semiconductor material in a lower portion and a transistor including a second semiconductor material in an upper portion and in which the transistor including the first semiconductor material includes a semiconductor substrate is described with reference to FIG. 10, FIG. 11, FIG. 12, and FIG. 13.

Figure 10:
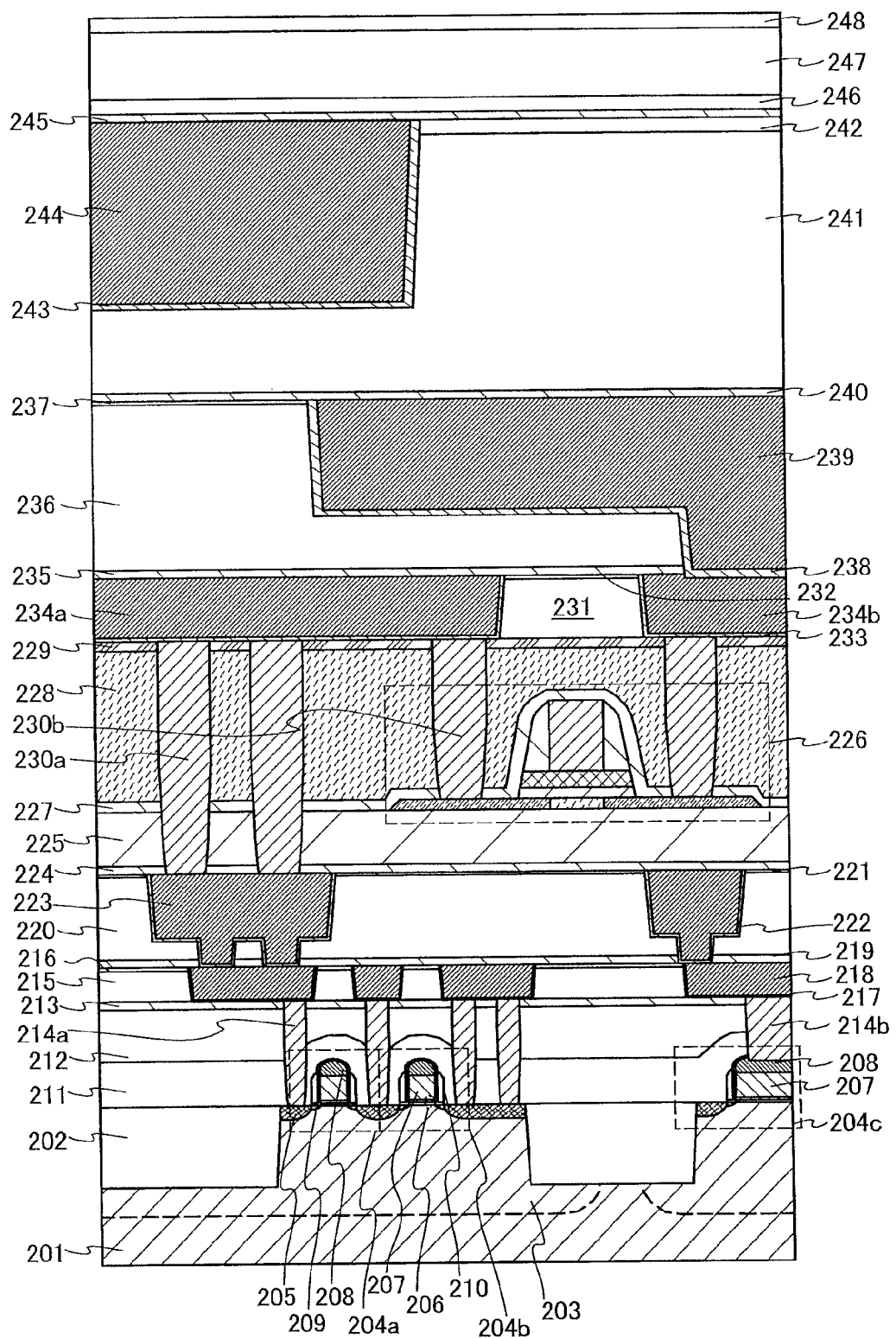
FIG. 10 is a cross-sectional view illustrating a semiconductor device according to one embodiment of the present invention.

FIG. 10 illustrates an example of a cross-sectional structure of the semiconductor device that includes the transistor including the first semiconductor material in the lower portion and the transistor including the second semiconductor material in the upper portion. Here, the first semiconductor material and the second semiconductor material are different from each other. For example, a semiconductor material other than an oxide semiconductor can be used as the first semiconductor material, and an oxide semiconductor can be used as the second semiconductor material. The semiconductor material other than an oxide semiconductor may be, for example, silicon, germanium, silicon germanium, silicon carbide, gallium arsenide, or the like and is preferably a single crystal semiconductor. A transistor formed using a single crystal semiconductor can operate at high speed easily. In contrast, a transistor formed using an oxide semiconductor can be used for a circuit utilizing characteristics of sufficiently low off-state current, which is approximately several yA/μm to several zA/μm. Thus, a logic circuit with low power consumption can be formed using the semiconductor device illustrated in FIG. 10. Alternatively, an organic semiconductor material or the like may be used as the first semiconductor material.

Either an n-channel transistor (NMOSFET) or a p-channel transistor (PMOSFET) can be used as each of transistors 204a, 204b, and 204c. In the example illustrated in FIG. 10, the transistors 204a and 204b in one island are electrically isolated from other elements by a shallow trench isolation (STI) 202. On the other hand, the transistor 204c in another island is electrically isolated from the transistors 204a and 204b by the STI 202. The use of the STI 202 can reduce the generation of a bird's beak in an element isolation region, which is caused in an LOCOS element isolation method, and can reduce the size of the element isolation region. On the other hand, in a semiconductor device that is not required to be structurally miniaturized or downsized, the STI 202 is not necessarily formed, and an element isolation means such as LOCOS can be used. A well 203 is preferably formed inside the STI 202.

The transistors 204a, 204b, and 204c in FIG. 10 each include a channel formation region provided in a substrate 201, impurity regions 205 (also referred to as a source region and a drain region) provided such that the channel formation region is provided therebetween, a gate insulating film 206 provided over the channel formation region, and gate electrodes 207 and 208 provided over the gate insulating film 206 so as to overlap with the channel formation region. A gate electrode can have, but is not limited to, a stacked structure of the gate electrode 207 including a first material for increasing processing accuracy and the gate electrode 208 including a second material for decreasing the resistance as a wiring; the material, the number of stacked layers, the shape, or the like can be adjusted as appropriate for required specifications. Note that a transistor whose source electrode and drain electrode are not illustrated in a drawing may also be referred to as a transistor for the sake of convenience.

Further, contact plugs 214a are connected to the impurity regions 205 provided in the substrate 201. Here, the contact plugs 214a also function as a source electrode and a drain electrode of the transistor 204a or the like. In addition, impurity regions which are different from the impurity regions 205 are provided between the impurity regions 205 and the channel formation region. The impurity regions function as LDD regions or extension regions for controlling the distribution of an electric field in the vicinity of the channel formation region, depending on the concentration of an impurity introduced thereto. Sidewalls 210 are provided at side surfaces of the gate electrodes 207 and 208 with an insulating film 209 provided therebetween. By using the insulating film 209 and the sidewalls 210, the LDD regions or extension regions can be formed.

The transistors 204a, 204b, and 204c are covered with an interlayer insulating film 211. The interlayer insulating film 211 can function as a protective film and can prevent impurities from entering the channel formation region from the outside. In addition, when the interlayer insulating film 211 is formed using a material such as silicon nitride by a CVD method, in the case where single crystal silicon is used for the channel formation region, dehydrogenation can be performed by heat treatment. When an insulating film having tensile stress or compressive stress is used as the interlayer insulating film 211, distortion can be caused in the semiconductor material in the channel formation region. By subjecting a silicon material in the channel formation region to tensile stress in the case of an n-channel transistor or subjecting a silicon material in the channel formation region to compressive stress in the case of a p-channel transistor, the mobility of the transistor can be improved.

A transistor 226 illustrated in FIG. 10 includes an oxide semiconductor film provided over an oxide insulating film 225. Any of the transistors described in Embodiments 1 to 5 can be used as the transistor 226 as appropriate.

The transistor 226 including the second semiconductor material is electrically connected to a transistor including the first semiconductor material in a lower layer, such as the transistor 204a, depending on a needed circuit configuration. FIG. 10 illustrates an example structure in which a source or a drain of the transistor 226 is electrically connected to a source or a drain of the transistor 204a.

One of the source and the drain of the transistor 226 including the second semiconductor material is connected to a wiring 234a formed above the transistor 226 through a contact plug 230b penetrating an insulating film 227, an interlayer insulating film 228, and an interlayer insulating film 229 that are provided over the transistor 226. For the insulating film 227, the interlayer insulating film 228, the interlayer insulating film 229, and the contact plugs 230b, any of the structures and materials described in Embodiments 1 to 5 can be used as appropriate.

The wiring 234a is embedded in an interlayer insulating film 231. For the wiring 234a, it is preferable to use a low-resistance conductive material such as copper or aluminum. By using a low-resistance conductive material, RC delay of signals transmitted through the wiring 234a can be reduced. In the case of using copper for the wiring 234a, a barrier film 233 is formed in order to prevent copper from diffusing into the channel formation region. The barrier films can each be formed using a film of tantalum nitride, a stacked-layer film of tantalum nitride and tantalum, a film of titanium nitride, a stacked-layer film of titanium nitride and titanium, or the like for example, but are not limited to the films of these materials as long as their function of preventing diffusion of a wiring material and their adhesion to the wiring material, a base film, or the like are secured. The barrier film 233 may be formed as a layer that is separate from the wiring 234a, or may be formed in such a manner that a barrier film material contained in a wiring material is separated out by heat treatment to the inner walls of the openings provided in the interlayer insulating film 231.

For the interlayer insulating film 231, it is possible to use an insulator such as silicon oxide, silicon oxynitride, silicon nitride oxide, borophosphosilicate glass (BPSG), phosphosilicate glass (PSG), silicon oxide to which carbon is added (SiOC), silicon oxide to which fluorine is added (SiOF), tetraethylorthosilicate (TEOS) which is silicon oxide made from $Si(OC_2H_5)_4$, hydrogen silsesquioxane (HSQ), methyl silsesquioxane (MSQ), organosilicate glass (OSG), or an organic-polymer-based material. In particular, in the case of advancing miniaturization of the semiconductor device, parasitic capacitance between wirings is significant and signal delay is increased. Therefore, the relative permittivity of silicon oxide (k=4.0 to 4.5) is too high, and it is preferable to use a material with k=3.0 or less. In addition, since CMP treatment is performed after the wirings are embedded in the interlayer insulating films, the interlayer insulating films need to have high mechanical strength. As long as their mechanical strength can be secured, the interlayer insulating films can be made porous to have a lower dielectric constant. The interlayer insulating film 231 are formed by a sputtering method, a CVD method, a coating method including a spin coating method (also referred to as spin on glass (SOG)), or the like. The same applies to interlayer insulating films 212, 215, 220, 236, and 241.

An interlayer insulating film 232 may be provided over the interlayer insulating film 231. The interlayer insulating film 232 functions as etching stoppers when planarization treatment by CMP or the like is performed after the wiring material is embedded in the interlayer insulating film 231. The same applies to the interlayer insulating films 213, 216, 221, 237, and 242.

A barrier film 235 is provided over the wiring 234a in order to prevent diffusion of the wiring material such as copper. The barrier film 235 may be formed not only over the wiring 234a but also over the interlayer insulating films 231 and 232. The barrier film 235 can be formed using an insulating material such as silicon nitride, SiC, or SiBON. Note that in the case where the barrier film 235 has a large thickness, which causes an increase in capacitance between wirings, it is preferable to select a material having barrier properties and a low dielectric constant.

The wiring 234a is connected to a wiring 223 provided in a lower layer than the oxide insulating film 225 through contact plugs 230a. The contact plugs 230a are electrically connected to the wiring 223 through the insulating film 227, the oxide insulating film 225, and a barrier film 224, which is different from the contact plugs 230b. Thus, the contact plug 230a has a larger height than the contact plug 230b. In the case where the diameter of the contact plug 230a is the same as that of the contact plug 230b, the aspect ratio of the contact plug 230a is larger than that of the contact plug 230b. The diameter of the contact plug 230a may be different from that of the contact plug 230b. The contact plug 230a is illustrated like a continuous plug faulted using one material; however, a contact plug penetrating a barrier film 224 and the oxide insulating film 225 and a contact plug penetrating the insulating film 227 and the interlayer insulating films 228 and 229 may be separately formed.

In a manner similar to that of the wiring 234a and a wiring 234b, the wiring 223 is covered with a barrier film 222 and the barrier film 224 and embedded in the interlayer insulating film 220. As illustrated in FIG. 10, the wiring 223 includes an upper wiring portion and a lower via hole portion. The lower via hole portion is connected to a wiring 218 in a lower layer. The wiring 223 having this structure can be formed by a so-called dual damascene method or the like. Wirings in upper and lower layers may be connected using a contact plug instead of the dual damascene method.

The barrier films 222 and 224 and the wiring 223 can be formed to have a similar structure to those of the above-described wiring layers above the transistor 226. The same applies to the wiring 218 provided with a barrier film 217 and the barrier film 219, a wiring 239 provided with barrier films 238 and 240, and a wiring 244 provided with barrier films 243 and 245.

The wiring 218 electrically connected to the wiring 223 can also be formed to have a similar structure to that of the above-described wiring layer above transistor 226. The transistor 204a including the first semiconductor material, such as silicon, in a channel formation region is connected to the wiring 218 through the contact plugs 214a. A gate of the transistor 204c is connected to the wiring 218 through a contact plug 214b.

A plurality of protective films, e.g., protective films 246, 247, and 248, can be stacked in the upper portion of the semiconductor device. These protective films can be formed using silicon oxide, silicon oxynitride, silicon nitride oxide, or the like.

As described above, through a plurality of contact plugs and a plurality of wirings, the transistor 204a, which includes the first semiconductor material and is provided in the lower portion of the semiconductor device, is electrically connected to the transistor 226, which includes the second semiconductor material and is provided in the upper portion of the semiconductor device. With the above-described structure in which the transistor including the first semiconductor material and being capable of operating at high speed is combined with the transistor including the second semiconductor material and having significantly low off-state current, a semiconductor device including a logic circuit capable of operating at high speed with low power consumption can be manufactured.

Such a semiconductor device is not limited to the above structure and can be changed as desired unless they deviate from the spirit of the present invention. For example, in the above description, two wiring layers are provided between the transistor including the first semiconductor material and the transistor including the second semiconductor material, but one wiring layer or three or more wiring layers may be provided, or without wirings, the transistors may be directly connected through only a contact plug. In this case, a through-silicon via (TSV) technique can also be used, for example. In addition, in the above description, a material such as copper is embedded in an interlayer insulating film as a wiring, but a wiring having a three-layer structure of a barrier film\a wiring material layer\a barrier film, for example, may be obtained by patterning through a photolithography process.

In the case where a copper wiring is formed in a tier between the transistors 204a and 204b including the first semiconductor material and the transistor 226 including the second semiconductor material, it is particularly necessary to take into consideration the influence of heat treatment performed in the process for manufacturing the transistor 226 including the second semiconductor material. In other words, it is necessary to take care that the temperature of heat treatment performed in the process for manufacturing the transistor 226 including the second semiconductor material is appropriate to the properties of the wiring material. This is because, in the case where high-temperature heat treatment is performed on a component of the transistor 226 for example, thermal stress is caused in case of using the copper wiring, leading to a problem such as stress migration.

Figure 11:
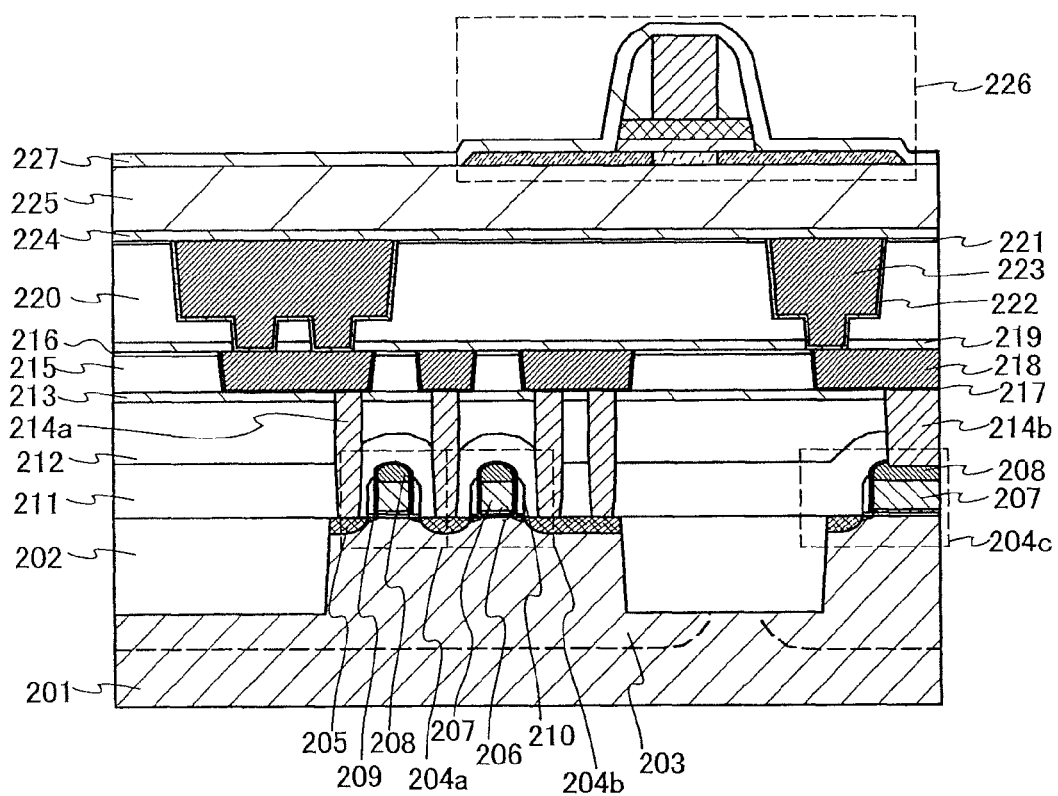
FIG. 11 is a cross-sectional view illustrating a method for manufacturing the semiconductor device, according to one embodiment of the present invention.
Figure 12:
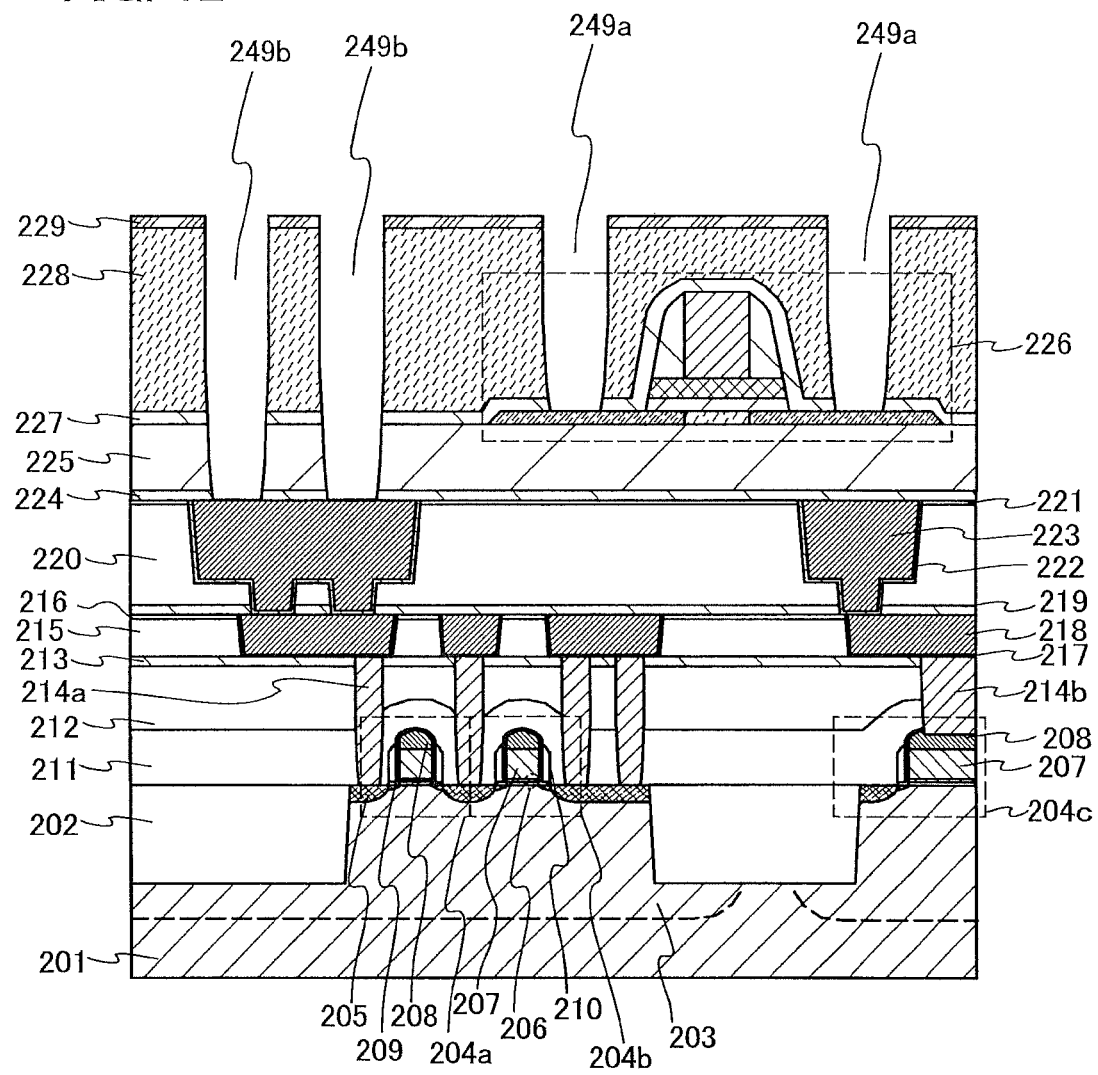
FIG. 12 is a cross-sectional view illustrating the method for manufacturing the semiconductor device, according to one embodiment of the present invention.
Figure 13:
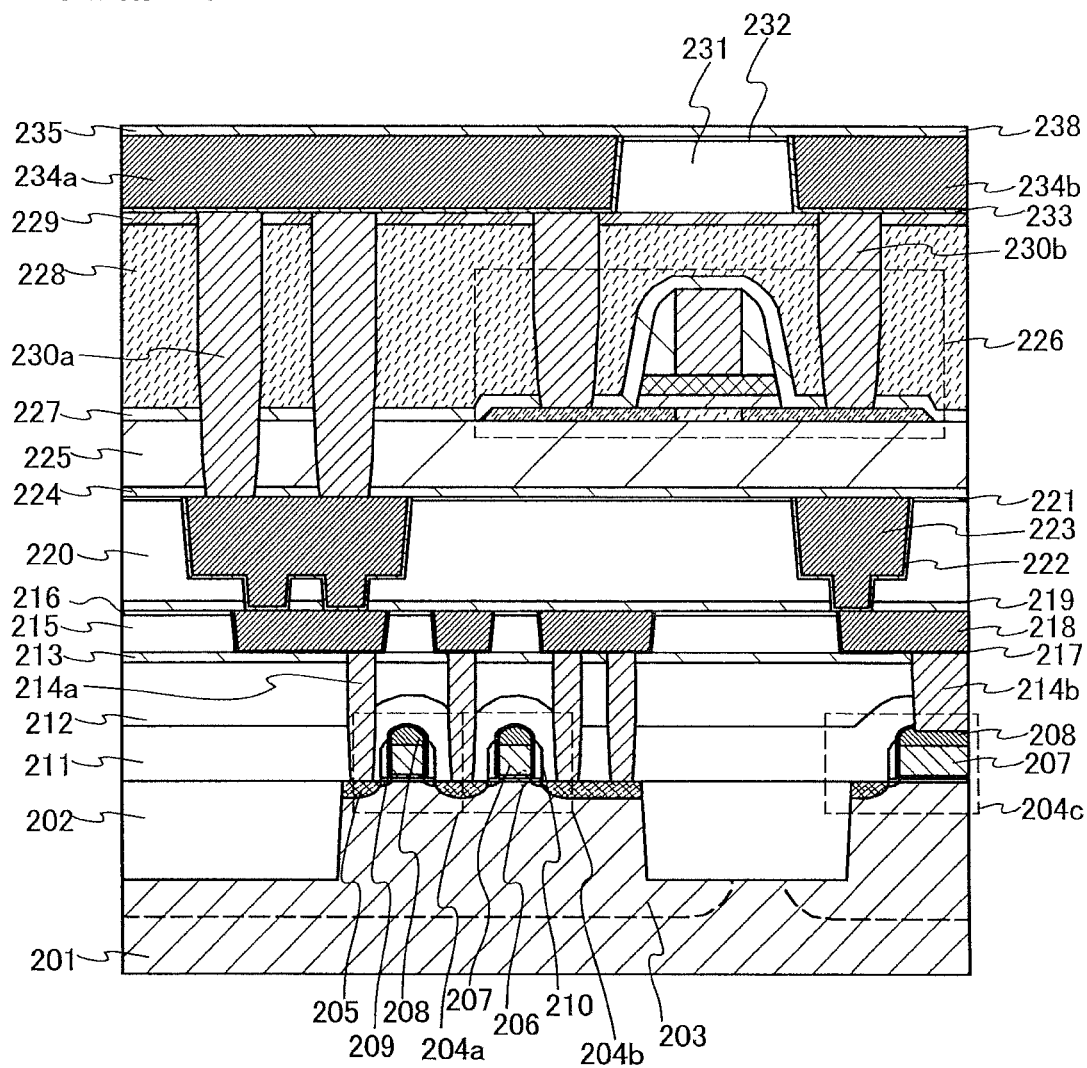
FIG. 13 is a cross-sectional view illustrating the method for manufacturing the semiconductor device, according to one embodiment of the present invention.

Next, an example of a method for manufacturing the semiconductor device is described with reference to FIG. 11, FIG. 12, and FIG. 13.

After the transistor including the first semiconductor material is formed and one or more wirings are formed above the transistor, the oxide insulating film 225 is formed thereover. After the oxide insulating film 225 is formed, the transistor 226 is formed and then covered with the insulating film 227 (see FIG. 11).

Next, the interlayer insulating films 228 and 229 are formed over the insulating film 227. The interlayer insulating film 228 preferably has high planarity, and a top surface of the interlayer insulating film 228 is preferably planarized or smoothed by CMP treatment or etching back. Accordingly, a plurality of wirings can be provided above the interlayer insulating films 228 and 229. The interlayer insulating film 229 can function as a protective film in planarizing a top surface of a contact plug to be formed later.

After that, via holes (openings) 249a and 249b for embedding the contact plugs are formed in the insulating films. Here, the via holes 249a for connecting the transistor 226 to the wirings 234a and 234b to be formed later are formed so that a top surface of the oxide semiconductor layer of the transistor is exposed. On the other hand, the via holes 249b for connecting the wiring 223 to the wiring 234a to be formed later are formed so that a top surface of the wiring 223 is exposed (see FIG. 12).

Next, a conductive material is embedded in the via holes 249a and 249b to form the contact plugs 230a and 230b. After that, a wiring layer including the wirings 234a and 234b, the interlayer insulating film 231, and the like is formed over the contact plugs 230a and 230b and the interlayer insulating films 228 and 229 (see FIG. 13).

Through the above manufacturing process, the semiconductor device in which the transistor including the first semiconductor material and the transistor including the second semiconductor material are electrically connected to each other can be manufactured.

The methods and structures described in this embodiment can be combined as appropriate with any of the methods and structures described in the other embodiments.

Embodiment 7

Figure 14:
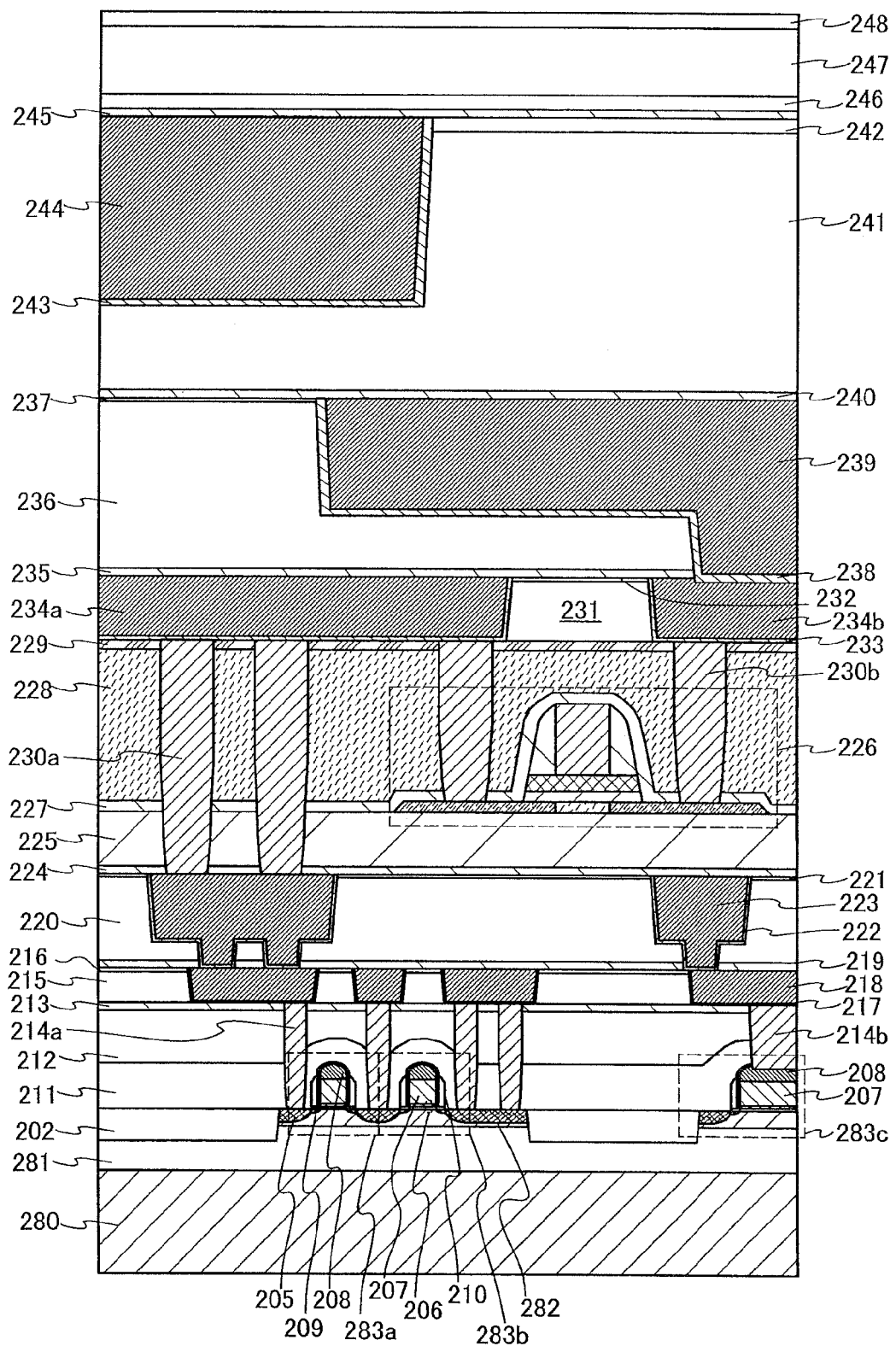
FIG. 14 is a cross-sectional view illustrating a semiconductor device according to one embodiment of the present invention.

In this embodiment, a semiconductor device that includes a transistor including a first semiconductor material in a lower portion and a transistor including a second semiconductor material in an upper portion and in which the transistor including the first semiconductor material includes an SOI substrate is described with reference to FIG. 14. That is, this embodiment is different from Embodiment 6 in that an SOI substrate is used in the transistor including the first semiconductor material instead of a semiconductor substrate in Embodiment 6.

The semiconductor device illustrated in FIG. 14 includes the semiconductor-on-insulator (SOI) substrate (also referred to as an SOI wafer) including a semiconductor substrate 280 formed of single crystal silicon, an embedded oxide film (also referred to as a buried oxide (BOX) layer) 281, and a semiconductor film (hereinafter referred to as an SOI layer) 282 including the first semiconductor material. As the SOI substrate, any of the following substrates can be used as appropriate: a SIMOX (Separation by IMplanted OXgen (a registered trademark of SUMCO TECHXIV Corporation) substrate in which a BOX layer and an SOI layer are formed by implanting oxygen ions to a predetermined depth of a silicon substrate and performing high-temperature treatment; an ELTRAN (Epitaxial Layer TRANsfer (a registered trademark of Canon Inc.) substrate formed using a porous silicon layer by anodization; a UNIBOND (a registered trademark of Soitec) substrate in which an SOI layer is formed by implanting hydrogen ions into a substrate (device wafer) provided with a thermal oxide film to form a weakened layer, bonding the substrate to another silicon substrate (handle wafer), and then separating the handle wafer from the weakened layer through heat treatment; and the like.

Note that the SOI substrate generally refers to a substrate in which an SOI layer made of a silicon thin film is provided over a silicon substrate with a BOX layer provided therebetween, but without limitation to silicon, another single crystal semiconductor material may be used. In addition, the SOI substrate includes, in its category, a substrate having a structure in which a semiconductor layer is provided over an insulating substrate such as a glass substrate with an insulating layer provided therebetween.

In this embodiment, the SOI layer is used for a channel region of a transistor including the first semiconductor material, e.g., transistors 283a, 283b, and 283c. Compared with a transistor formed using a bulk silicon substrate, a transistor formed using an SOI substrate has many advantages such as small parasitic capacitance, low probability of soft errors caused by incidence of α rays or the like, no occurrence of latch-up caused by formation of a parasitic transistor, and easy element isolation due to the presence of a BOX layer.

The SOI layer 282 includes a single crystal semiconductor such as silicon. Therefore, when the SOI layer is used for the transistors 283a, 283b, and 283c, the operation speed of the semiconductor device can be increased.

Impurity elements may be added to a region of the SOI layer to be a channel formation region of the transistor in order to control the threshold voltage of the transistor. For example, impurity elements imparting conductivity are added so that the threshold voltage of the transistor becomes positive. When the semiconductor material is silicon, examples of the impurity imparting conductivity are boron, aluminum, gallium, and the like.

The SOI layer 282 is surrounded by the shallow trench isolation (STI) 202 to be electrically isolated from other elements. The use of the STI 202 can reduce the generation of a bird's beak in an element isolation region, which is caused in an LOCOS element isolation method, and can reduce the size of the element isolation region. On the other hand, in a semiconductor device which is not required to be structurally miniaturized or downsized, the STI is not necessarily formed, and an element isolation means such as LOCOS can be used.

A structure of the transistor including an SOI electrically isolated by the STI 202 used as a channel region and a stacked-layer structure of layers above the transistor may be formed by the methods described in Embodiment 6.

As the transistor 226 used in this embodiment, any of the transistors described in Embodiments 1 to 5 may be used as appropriate.

The methods and structures described in this embodiment can be combined as appropriate with any of the methods and structures described in the other embodiments.

Embodiment 8

In this embodiment, an example of a semiconductor device that includes any of the transistors described in this specification, is capable of holding stored data even when not powered, and does not have a limitation on the number of write cycles is described with reference to drawings. Note that here, a memory device is described as an example of a semiconductor device.

FIGS. 15A and 15B illustrate an example of a structure of a semiconductor device. FIG. 15A is a cross-sectional view of the semiconductor device, and FIG. 15B is a circuit diagram of the semiconductor device.

The semiconductor device illustrated in FIG. 15A includes a transistor 360 including a first semiconductor material in a lower portion, and a transistor 362 including a second semiconductor material in an upper portion. The transistor 362 is an example having a similar structure to that of any of the transistors described in Embodiments 1 to 5 as appropriate.

Here, the first semiconductor material and the second semiconductor material are preferably materials having different band gaps. For example, the first semiconductor material may be a semiconductor material other than an oxide semiconductor (e.g., silicon) and the second semiconductor material may be an oxide semiconductor. A transistor including a material other than an oxide semiconductor can operate at high speed easily. On the other hand, charge can be held in a transistor including an oxide semiconductor for a long time owing to its characteristics.

Although all the transistors are n-channel transistors here, it is needless to say that p-channel transistors can be used. Any of the transistors described in Embodiments 1 to 5, which includes an oxide semiconductor film, is used so that data can be held. A specific structure of the semiconductor device, such as a material of the semiconductor device or a structure of the semiconductor device, is not limited to the structure described here.

The transistor 360 in FIG. 15A includes a channel region provided in a substrate 300 containing a semiconductor material (e.g., silicon), impurity regions provided so that the channel region is sandwiched therebetween, the gate insulating film 303 provided over the channel region, and a gate electrode provided over a gate insulating film 303. Although not illustrated, an intermetallic compound region may be formed in part or all of the impurity regions. Note that a transistor whose source electrode and drain electrode are not illustrated in a drawing may be referred to as a transistor for the sake of convenience. Further, in such a case, in description of a connection of a transistor, a source region and a source electrode are collectively referred to as a "source electrode," and a drain region and a drain electrode are collectively referred to as a "drain electrode". That is, in this specification, the term "source electrode" may include a source region.

Further, an STI 301 is provided in the substrate 300 to surround the transistor 360, whereby the transistor 360 is electrically isolated from other elements. An interlayer insulating film 306 and an interlayer insulating film 307 are provided to cover the transistor 360. Note that another method such as LOCOS can be used for the element isolation as well as STI. Further, in the transistor 360, sidewalls may be formed on side surfaces of the gate electrode, and the impurity regions may include regions having different impurity concentrations.

A capacitor 364 including an impurity region 302 provided in the substrate 300 as a lower electrode and upper electrodes 304 and 305 formed using the same material as the gate electrode is formed. As a dielectric film of the capacitor, an insulating film formed from the same layer as the gate insulating film in the transistor 360 can be used. Alternatively, a dielectric film of the capacitor 364 may be additionally provided.

The transistor 360 in which the substrate 300 is formed using, for example, single crystal silicon can operate at high speed. Thus, when the transistor is used as a reading transistor, data can be read at a high speed.

In this embodiment, the interlayer insulating film 306 is formed using a silicon nitride film, and an oxide insulating film 320 is formed using an oxide insulating film from which part of oxygen is released by heating described in Embodiment 1, typically a silicon oxide film. With such a structure, hydrogen contained in the silicon nitride film is diffused into the substrate 300 including a semiconductor material, specifically into the channel region, in a later heating step so that the vacancies of the region can be hydrogenated, and oxygen contained in the silicon oxide film is diffused into an oxide semiconductor film in the transistor 362 so that oxygen vacancies in the oxide semiconductor film can be reduced.

Any of the transistors described in Embodiments 1 to 5, which includes an oxide semiconductor in a channel region, can be used as the transistor 362 illustrated in FIG. 15A as appropriate. The transistor 362 has a short channel length. The length is set greater than or equal to 5 nm and smaller than 60 nm, preferably greater than or equal to 10 nm and smaller than or equal to 40 nm. Since the transistor 362 includes an oxide semiconductor film in a channel region, the transistor 362 does not have a short channel effect or has less short channel effect, and shows favorable electrical characteristics as a switching element.

Since the off-state current of the transistor 362 is small, stored data can be held for a long time owing to the transistor. In other words, power consumption can be sufficiently reduced because a semiconductor device in which refresh operation is unnecessary or the frequency of refresh operation is extremely low can be provided.

The transistor 362 may be formed over the transistor 360 and the capacitor 364 in a similar way as in Embodiment 6. Further, for interlayer insulating films 310, 311, 315, 316, 322, 323, 325, and 326, barrier films 312, 314, 317, 327, and 329, and the like, any of the above-described embodiments can be referred to.

A wiring 313 is provided over the transistor 360 and the capacitor 364. The upper electrodes 304 and 305 of the capacitor are electrically connected to the wiring 313 through a contact plug 309a penetrating the interlayer insulating films 306, 307 and 308. The gate electrode of the transistor 360 is electrically connected to the wiring 313 through a contact plug 309b penetrating the interlayer insulating films 306, 307, and 308. On the other hand, the one of the source and the drain of the transistor 362 including the oxide semiconductor film for the channel is electrically connected to a wiring 328a in an upper layer through a contact plug 324b penetrating the insulating film and the interlayer insulating films, and the wiring 328a is electrically connected to a wiring 318 through contact plugs 324a penetrating the interlayer insulating films 323, 322, and 316, an insulating film 321, the oxide insulating film 320, and a barrier film 319. The wiring 318 in the interlayer insulating films 315 and 311 and the barrier film 314 is electrically connected to the wiring 313 in a lower layer. Accordingly, the one of the source and the drain of the transistor 362 is electrically connected to the upper electrode of the capacitor 364 and the gate electrode of the transistor 360. Further, the other of the source and the drain of the transistor 362 is electrically connected to a wiring 328b through a contact plug 324c.

Note that the electrical connection between wirings using a contact plug may be established using a plurality of contact plugs, like the connection between the wiring 318 and the wiring 328a, or may be established using a wall-shaped contact plug, like the connection between the upper electrodes 304 and 305 and the wiring 313 as illustrated in FIG. 15A.

The above electrical connections are mere examples, and elements may be connected using a wiring different from the above wirings. For example, in FIG. 15A, two wiring layers are provided between the transistor 362, and the transistor 360 and the capacitor 364, but one wiring layer or three or more wiring layers may be provided. Alternatively, without wirings, elements may be directly and electrically connected to each other through a plurality of plugs connected vertically. Furthermore, in FIG. 15A, the wirings 313 and 318 are each formed by a damascene method (the wiring 318 is formed by a so-called dual damascene method), but may be formed by another method.

Note that the capacitor 364 may be omitted in the case where a capacitor is not needed. Furthermore, the capacitor 364 may be separately provided above the transistor 360 or above the transistor 362.

Although not illustrated, a metal oxide film of aluminum oxide, aluminum oxynitride, gallium oxide, gallium oxynitride, yttrium oxide, yttrium oxynitride, hafnium oxide, hafnium oxynitride, or the like which has a blocking effect against oxygen, hydrogen, water, or the like is preferably provided between the oxide insulating film 320 and the barrier film 319 which functions as an impurity diffusion prevention film for the wiring 318.

In FIG. 15A, the transistor 360 and the transistor 362 are provided so as to at least partly overlap with each other. The source region or the drain region of the transistor 360 is preferably provided so as to overlap with part of an oxide semiconductor film 363. Furthermore, the transistor 362 may be overlapped with the capacitor 364. With such a planar layout, the area occupied by the semiconductor device can be reduced; thus, higher integration can be achieved.

Next, an example of a circuit configuration corresponding to FIG. 15A is illustrated in FIG. 15B.

In FIG. 15B, a first wiring (1st line) is electrically connected to a source electrode of the transistor 360. A second wiring (2nd line) is electrically connected to a drain electrode of the transistor 360. A third wiring (3rd line) is electrically connected to one of a source electrode and a drain electrode of the transistor 362, and a fourth wiring (4th line) is electrically connected to a gate electrode of the transistor 362. A gate electrode of the transistor 360 and the other of the source electrode and the drain electrode of the transistor 362 are electrically connected to the one electrode of the capacitor 364. A fifth line (5th line) is electrically connected to the other electrode of the capacitor 364.

The semiconductor device in FIG. 15B utilizes a characteristic in which the potential of the gate electrode of the transistor 360 can be held, and thus can write, hold, and read data as follows.

Writing and holding of data is described. First, the potential of the fourth line is set to a potential at which the transistor 362 is turned on, so that the transistor 362 is turned on. Accordingly, the potential of the third line is supplied to the gate electrode of the transistor 360 and the capacitor 364. That is, predetermined charge is given to the gate electrode of the transistor 360 (writing). Here, charge for supply of a potential level or charge for supply of a different potential level (hereinafter referred to as Low level charge and High level charge) is given. After that, the potential of the fourth line is set to a potential at which the transistor 362 is turned off, so that the transistor 362 is turned off. Thus, the charge given to the gate electrode of the transistor 360 is held (holding).

Since the off-state current of the transistor 362 is extremely low, the charge of the gate electrode of the transistor 360 is held for a long time.

Next, reading of data is described. By supplying an appropriate potential (reading potential) to the fifth line while a predetermined potential (constant potential) is supplied to the first line, the potential of the second line varies depending on the amount of charge held in the gate electrode of the transistor 360. This is because in general, when the transistor 360 is an re-channel transistor, an apparent threshold voltage $V_{th\_H}$ in the case where a high-level charge is given to the gate electrode of the transistor 360 is lower than an apparent threshold voltage $V_{th\_L}$ in the case where a low-level charge is given to the gate electrode of the transistor 360. Here, an apparent threshold voltage refers to the potential of the fifth line, which is needed to turn on the transistor 360. Thus, the potential of the fifth line is set to a potential $V_0$ that is between $V_{th\_H}$ and $V_{th\_L}$, whereby charge given to the gate electrode of the transistor 360 can be determined. For example, in the case where a high-level charge is given in writing, when the potential of the fifth wiring is set to $V_0$ ($>V_{th\_H}$), the transistor 360 is turned on. In the case where a low level charge is given in writing, even when the potential of the fifth wiring is set to $V_0$ ($V_{th\_L}$), the transistor 360 remains in an off state. Therefore, the held data can be read by the potential of the second line.

Note that in the case where memory cells are arrayed to be used, only data of desired memory cells needs to be read. In the case where such reading is not performed, a potential at which the transistor 360 is turned off regardless of the state of the gate electrode of the transistor 360, that is, a potential smaller than $V_{th\_H}$ may be given to the fifth wiring. Alternatively, a potential which allows the transistor 360 to be turned on regardless of a state of the gate electrode, that is, a potential higher than $V_{th\_L}$ may be applied to the fifth line.

When a transistor including an oxide semiconductor film in a channel region and having extremely small off-state current is applied to the semiconductor device in this embodiment, the semiconductor device can hold stored data for an extremely long period. In other words, power consumption can be adequately reduced because refresh operation becomes unnecessary or the frequency of refresh operation can be extremely low. Moreover, stored data can be held for a long period even when power is not supplied (note that a potential is preferably fixed).

Furthermore, in the semiconductor device described in this embodiment, high voltage is not needed for writing data and there is no problem of deterioration of elements. For example, unlike a conventional non-volatile memory, it is not necessary to inject and extract electrons into and from a floating gate, and thus a problem such as deterioration of a gate insulating film does not occur at all. In other words, the semiconductor device according to one embodiment of the present invention does not have a limit on the number of times of writing which is a problem in a conventional non-volatile memory, and reliability thereof is drastically improved. Furthermore, data is written depending on the on state and the off state of the transistor, whereby high-speed operation can be easily realized.

As described above, a miniaturized and highly-integrated semiconductor device having stable and excellent electrical characteristics and a method for manufacturing the semiconductor device can be provided.

The methods and structures described in this embodiment can be combined as appropriate with any of the methods and structures described in the other embodiments.

Embodiment 9

In this embodiment, a semiconductor device which includes the transistor described in Embodiment 1 to 7, which can hold stored data even when not powered, which does not have a limitation on the number of write cycles, and which has a structure different from the structure described in Embodiment 8 is described with reference to FIGS. 16A and 16B and FIG. 17. Note that here, a memory device is described as an example of a semiconductor device.

Figure 16A:
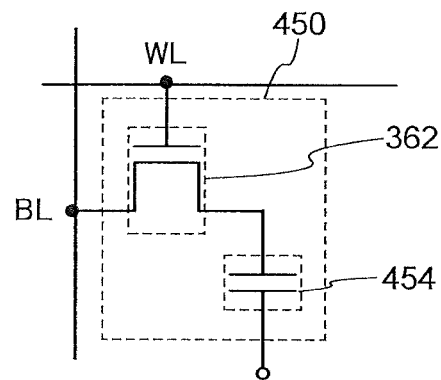
FIGS. 16A and 16B are a circuit diagram and a perspective view illustrating a semiconductor device according to one embodiment of the present invention.
Figure 16B:
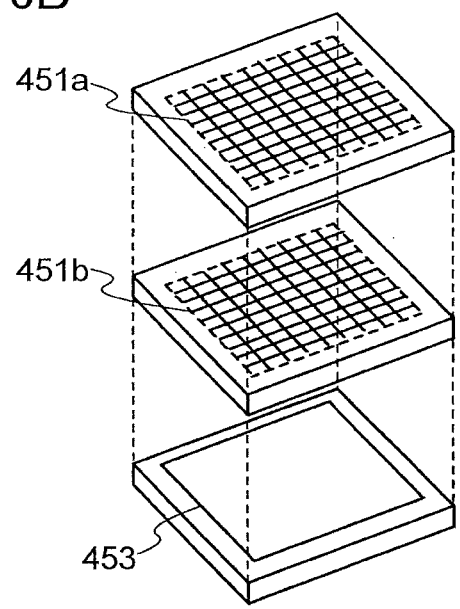

FIG. 16A illustrates an example of a circuit configuration of a semiconductor device, and FIG. 16B is a conceptual diagram illustrating an example of a semiconductor device. First, the semiconductor device illustrated in FIG. 16A is described, and then, the semiconductor device illustrated in FIG. 16B is described.

In the semiconductor device illustrated in FIG. 16A, a bit line BL is electrically connected to a source electrode or a drain electrode of the transistor 362, a word line WL is electrically connected to a gate electrode of the transistor 362, and the source electrode or the drain electrode of the transistor 362 is electrically connected to a first terminal of a capacitor 454.

Next, writing and holding of data in the semiconductor device (a memory cell 450) illustrated in FIG. 16A will be described.

First, the potential of the word line WL is set to a potential at which the transistor 362 is turned on, so that the transistor 362 is turned on. Accordingly, the potential of the bit line BL is supplied to the first terminal of the capacitor 454 (writing). After that, the potential of the word line WL is set to a potential at which the transistor 362 is turned off, so that the transistor 362 is turned off. Thus, the potential of the first terminal of the capacitor 454 is held (holding).

Off current is extremely small in the transistor 362 including an oxide semiconductor film. For that reason, the potential of the first terminal of the capacitor 454 (or a charge accumulated in the capacitor 454) can be held for an extremely long period by turning off the transistor 362.

Next, reading of data is described. When the transistor 362 is turned on, the bit line BL which is in a floating state and the capacitor 454 are electrically connected to each other, and the charge is redistributed between the bit line BL and the capacitor 454. As a result, the potential of the bit line BL is changed. The amount of change in potential of the bit line BL varies depending on the potential of the first terminal of the capacitor 454 (or the charge accumulated in the capacitor 454).

For example, the potential of the bit line BL obtained after charge redistribution is (CB×B0+C×V)/(CB+C), where V is the potential of the first terminal of the capacitor 454, C is the capacitance of the capacitor 454, CB is the capacitance of the bit line BL (hereinafter also referred to as bit line capacitance), and VB0 is the potential of the bit line BL obtained before the charge redistribution. Therefore, it can be found that assuming that the memory cell 450 is in either of two states in which the potentials of the first terminal of the capacitor 454 are V1 and V0 (V1>V0), the potential of the bit line BL in the case of holding the potential V1 (=(CB×VB0+C×V1)/(CB+C)) is higher than the potential of the bit line BL in the case of holding the potential V0 (=(CB×VB0+C×V0)/(CB+C)).

Then, by comparing the potential of the bit line BL with a predetermined potential, data can be read.

As described above, the semiconductor device illustrated in FIG. 16A can hold charge that is accumulated in the capacitor 454 for a long time because the off-state current of the transistor 362 is extremely small. In other words, power consumption can be adequately reduced because refresh operation becomes unnecessary or the frequency of refresh operation can be extremely low. Moreover, stored data can be held for a long time even when power is not supplied.

Next, the semiconductor device illustrated in FIG. 16B is described.

The semiconductor device illustrated in FIG. 16B includes memory cell arrays 451a and 451b including a plurality of memory cells 450 illustrated in FIG. 16A as memory circuits in an upper portion, and a peripheral circuit 453 in a lower portion which is necessary for operating memory cell arrays 451a and 451b. Note that the peripheral circuit 453 is electrically connected to the memory cell arrays 451a and 451b.

In the structure illustrated in FIG. 16B, the peripheral circuit 453 can be provided directly under the memory cell arrays 451a and 451b. Thus, the size of the semiconductor device can be decreased.

It is preferable that a semiconductor material of the transistor provided in the peripheral circuit 453 is different from that of the transistor 362. For example, silicon, germanium, silicon germanium, silicon carbide, gallium arsenide, or the like can be used, and one of such single crystal semiconductors as described in Embodiments 6 and 7 is preferably used. Alternatively, an organic semiconductor material or the like may be used. A transistor including such a semiconductor material can operate at sufficiently high speed. Therefore, a variety of circuits (e.g., a logic circuit or a driver circuit) which needs to operate at high speed can be favorably achieved by using the transistor.

Note that FIG. 16B illustrates, as an example, the semiconductor device in which the two memory cell arrays 451a and 451b are stacked; however, the number of memory cell arrays to be stacked is not limited thereto. Three or more memory cell arrays may be stacked.

Next, a specific structure of the memory cell 450 illustrated in FIG. 16A is described with reference to FIG. 17.

Figure 17:
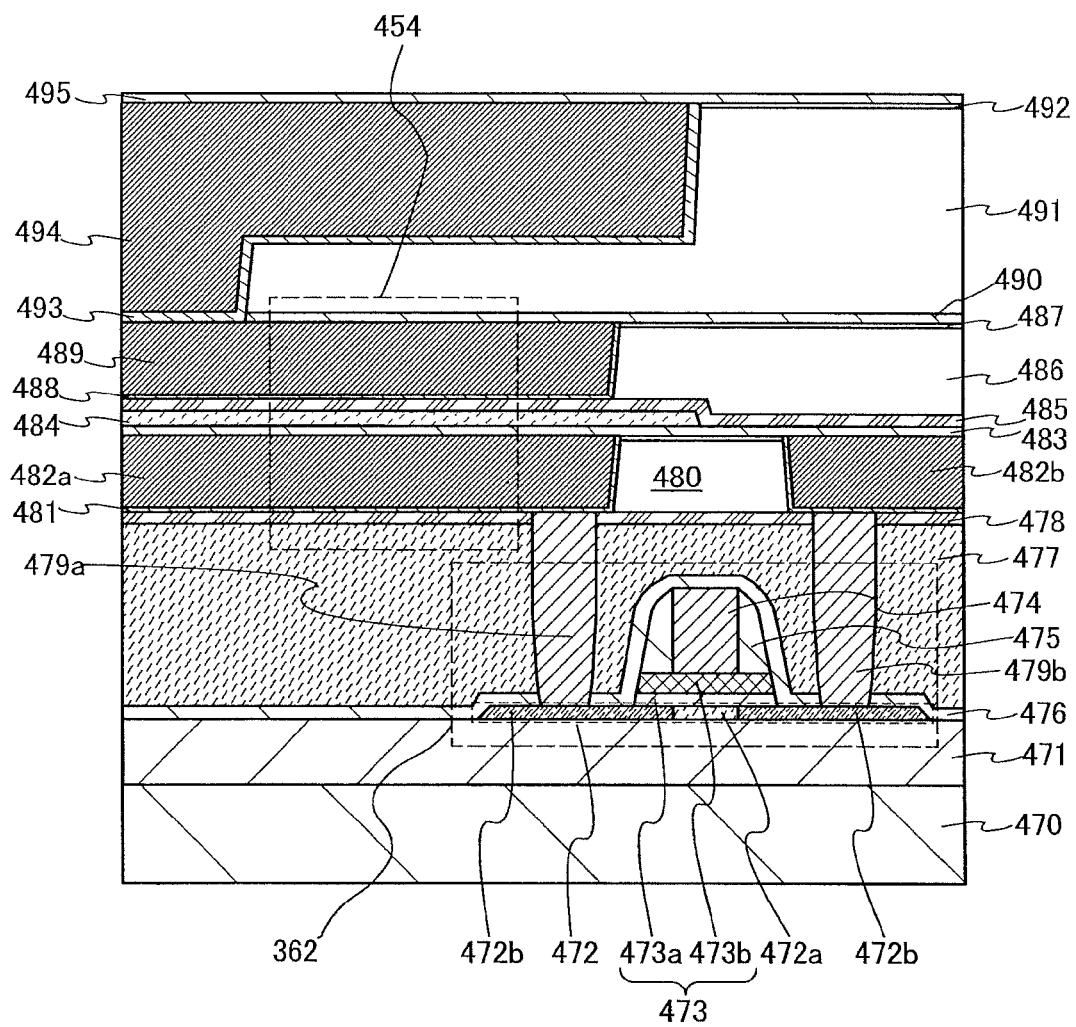
FIG. 17 is a cross-sectional view illustrating a semiconductor device according to one embodiment of the present invention.

FIG. 17 illustrates a cross-sectional view of an example of the structure of the memory cell 450.

The transistor 362 illustrated in FIG. 17 can have a structure similar to that of the transistor described in Embodiment 1 to 5. That is, the transistor 362 includes an oxide semiconductor film 472 including a region 472a and regions 472b, a gate insulating film 473 including gate insulating films 473a and 473b, and a gate electrode 474. Further, sidewalls 475 are provided on side surfaces of the gate electrode 474. For interlayer insulating films 480, 486, 487, 491, and 492, barrier films 488, 490, 493, and 495, and the like, any of the above-described embodiments can be referred to.

Over the transistor 362 provided over an insulating film 470 with an oxide insulating film 471 provided therebetween, an insulating film 476, an interlayer insulating film 477, and an interlayer insulating film 478 are provided. A wiring 482a to be a lower electrode is provided over the interlayer insulating film 478, a high dielectric film 484 and an insulating film 485 are provided over the wiring 482a, and a wiring 489 to be an upper electrode is provided over the insulating film 485; thus, the capacitor 454 including the wiring 482a, the high dielectric film 484, the insulating film 485, and the wiring 489 is formed.

The bottom portion and the side portion of the wiring 482a to be the lower electrode is covered with a barrier film 481, and the top surface of the wiring 482a is also covered with a barrier film 483. The wiring 489 to be the upper electrode is similarly covered with the barrier film. In the case where copper is used as a material for the wiring 482a or the wiring 489, the wirings are preferably formed by the above-described damascene method; however, in the case where another material is used for the wirings, the wiring structure is not limited to the above, and an upper electrode and a lower electrode can be formed by another method for forming a wiring.

The high dielectric film 484 is preferably formed using a material having high relative dielectric constant, such as silicon nitride or tantalum oxide. Alternatively, a stacked-layer such as silicon oxide\silicon nitride\silicon oxide can be used. The high dielectric film 484 is provided at least a region used for the formation of the capacitor 454, and can be covered with the insulating film 485. In this case, the insulating film 485 also functions as part of the dielectric film of the capacitor.

The wiring 482a to be the lower electrode of the capacitor 454 is electrically connected to a source or a drain of the transistor 362 through the barrier film 481 and a contact plug 479a. On the other hand, the wiring 489 to be the upper electrode of the capacitor is electrically connected to a wiring 494 as illustrated in FIG. 17. Alternatively, the wiring 489 may be functionally connected to other components without being electrically connected to a wiring in an upper layer.

The other of the source and the drain of the transistor 362 is electrically connected to a wiring 482b, which corresponds to a bit line illustrated in FIG. 16A, through a contact plug 479b.

In FIG. 17, the contact plug 479b of the transistor 362 can also function as a source electrode of a transistor included in an adjacent memory cell. With such a planar layout, the area occupied by the semiconductor device can be reduced; thus, higher integration can be achieved.

The capacitor 454 is formed above the transistor 362 in FIG. 17, but may be formed below the transistor 362. In particular, in the case where a transistor different from the transistor 362 including the oxide semiconductor film and the semiconductor substrate, which is described in Embodiments 6 and 7, is formed, a structure may be used in which a trench capacitor is formed in the semiconductor substrate and the trench capacitor is connected to the transistor 362 through a contact plug.

As described above, the plurality of memory cells formed in multiple layers in the upper portion is each formed with a transistor including an oxide semiconductor film. Since the transistor including an oxide semiconductor film has low off-state current, stored data can be held for a long time by using the transistor. In other words, the frequency of refresh operation can be extremely lowered, which leads to a sufficient reduction in power consumption.

A semiconductor device having a novel feature can be obtained by being provided with both a peripheral circuit including the transistor including a material other than an oxide semiconductor (in other words, a transistor capable of operating at sufficiently high speed) and a memory circuit including the transistor including an oxide semiconductor (in a broader sense, a transistor whose off-state current is sufficiently small). In addition, the use of a structure where the peripheral circuit and the memory circuit are stacked leads to an increase in the degree of integration of the semiconductor device.

As described above, a miniaturized and highly-integrated semiconductor device having stable and excellent electrical characteristics and a method for manufacturing the semiconductor device can be provided.

This embodiment can be implemented in appropriate combination with any of the structures described in the other embodiments.

Embodiment 10

As examples of the semiconductor device described in any of the above embodiments, a central processing unit, a microprocessor, a microcomputer, a memory device such as a random access memory, an image sensor, an electro-optical device, a light-emitting display device, a power transistor, a converter, a thyristor, and the like can be given. The semiconductor device can be applied to a variety of electronic devices. Examples of the electronic devices are as follows: display devices, lighting devices, personal computers, word processors, image reproducing devices, portable compact disc (CD) players, radio receivers, tape recorders, headphone stereos, stereos, clocks, cordless phone handsets, transceivers, portable wireless devices, cellular phones, smart phones, electronic books, car phones, portable game machines, calculators, portable information terminals, e-book readers, electronic translators, audio input devices, cameras such as video cameras or digital still cameras, toys, electric shavers, high-frequency heating appliances, electric rice cookers, electric washing machines, electric vacuum cleaners, water heaters, electric fans, hair dryers, air conditioners, humidifiers, dehumidifiers, air-conditioning systems, dishwashing machines, dish drying machines, clothes dryers, futon dryers, electric refrigerators, electric freezers, electric refrigerator-freezers, freezers for preserving DNA, flashlights, electric power tools, smoke detectors, medical equipments, guide lights, traffic lights, belt conveyors, elevators, escalators, industrial robots, power storage systems, electric vehicles, hybrid electric vehicles, plug-in hybrid electric vehicles, tracked vehicles, motorized bicycles, motorcycles, electric wheelchairs, golf carts, boats, ships, submarines, helicopters, aircrafts, rockets, artificial satellites, space probes, planetary probes, and spacecrafts. In this embodiment, examples of application of the semiconductor device described in any of the above embodiments to portable devices such as cellular phones, smartphones, or e-book readers are described with reference to FIGS. 18A and 18B, FIG. 19, FIG. 20, and FIG. 21.

In portable electronic devices such as mobile phones, smartphones, and e-book readers, an SRAM or a DRAM is used to store image data temporarily. This is because response speed of a flash memory is low and thus a flash memory is not suitable for image processing. On the other hand, an SRAM or a DRAM has the following characteristics when used for temporary storage of image data.

Figure 18A:
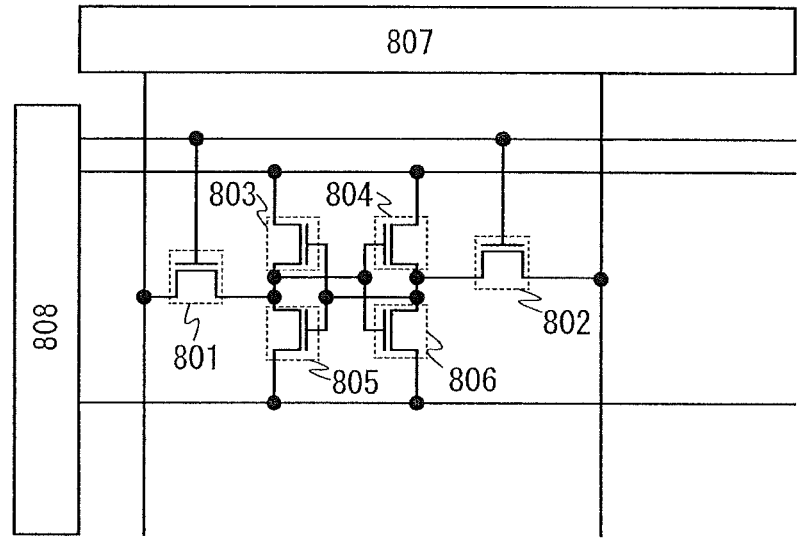
FIGS. 18A and 18B are circuit diagrams each illustrating one embodiment of a semiconductor device.

In a normal SRAM, as illustrated in FIG. 18A, one memory cell includes six transistors, which are a transistor 801, a transistor 802, a transistor 803, a transistor 804, a transistor 805, and a transistor 806, and they are driven by an X decoder 807 and a Y decoder 808. The transistors 803 and 805 and the transistors 804 and 806 each serve as an inverter, and high-speed driving can be performed therewith. However, an SRAM has a disadvantage of large cell area because one memory cell includes six transistors. Provided that the minimum feature size of a design rule is F, the area of a memory cell in an SRAM is generally 100 $F^2$ to 150 $F^2$. Therefore, a price per bit of an SRAM is the most expensive among a variety of memory devices.

Figure 18B:
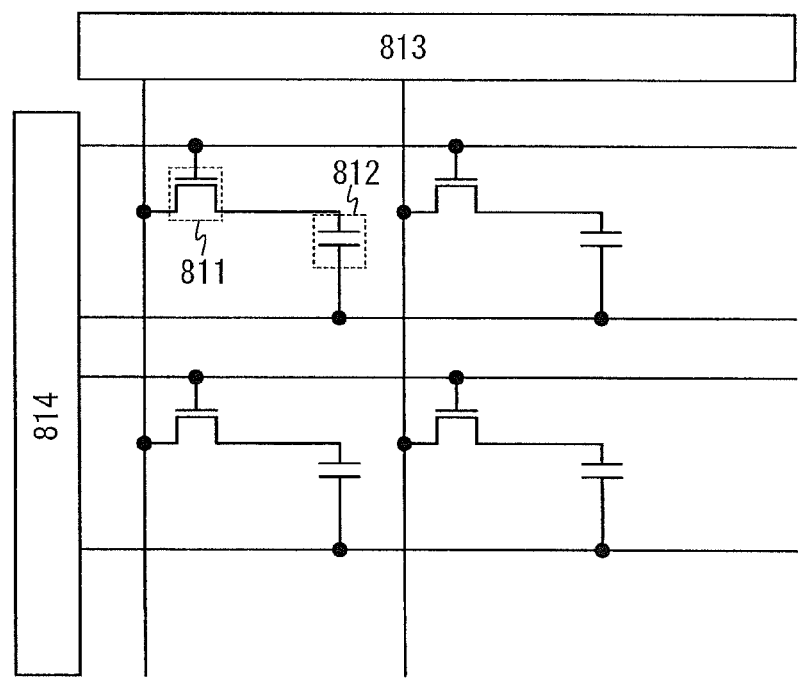

On the other hand, as illustrated in FIG. 18B, a memory cell in a DRAM includes a transistor 811 and a storage capacitor 812, and is driven by an X decoder 813 and a Y decoder 814. One cell includes one transistor and one capacitor and thus the area of a memory cell is small. The area of a memory cell of a DRAM is generally less than or equal to 10 $F^2$. Note that in the case of a DRAM, a refresh operation is always necessary and power is consumed even when a rewriting operation is not performed.

However, the area of the memory cell of the semiconductor device described in the above embodiments is about 10 $F^2$ and frequent refreshing is not needed. Therefore, the area of the memory cell is reduced, and the power consumption can be reduced.

Figure 19:
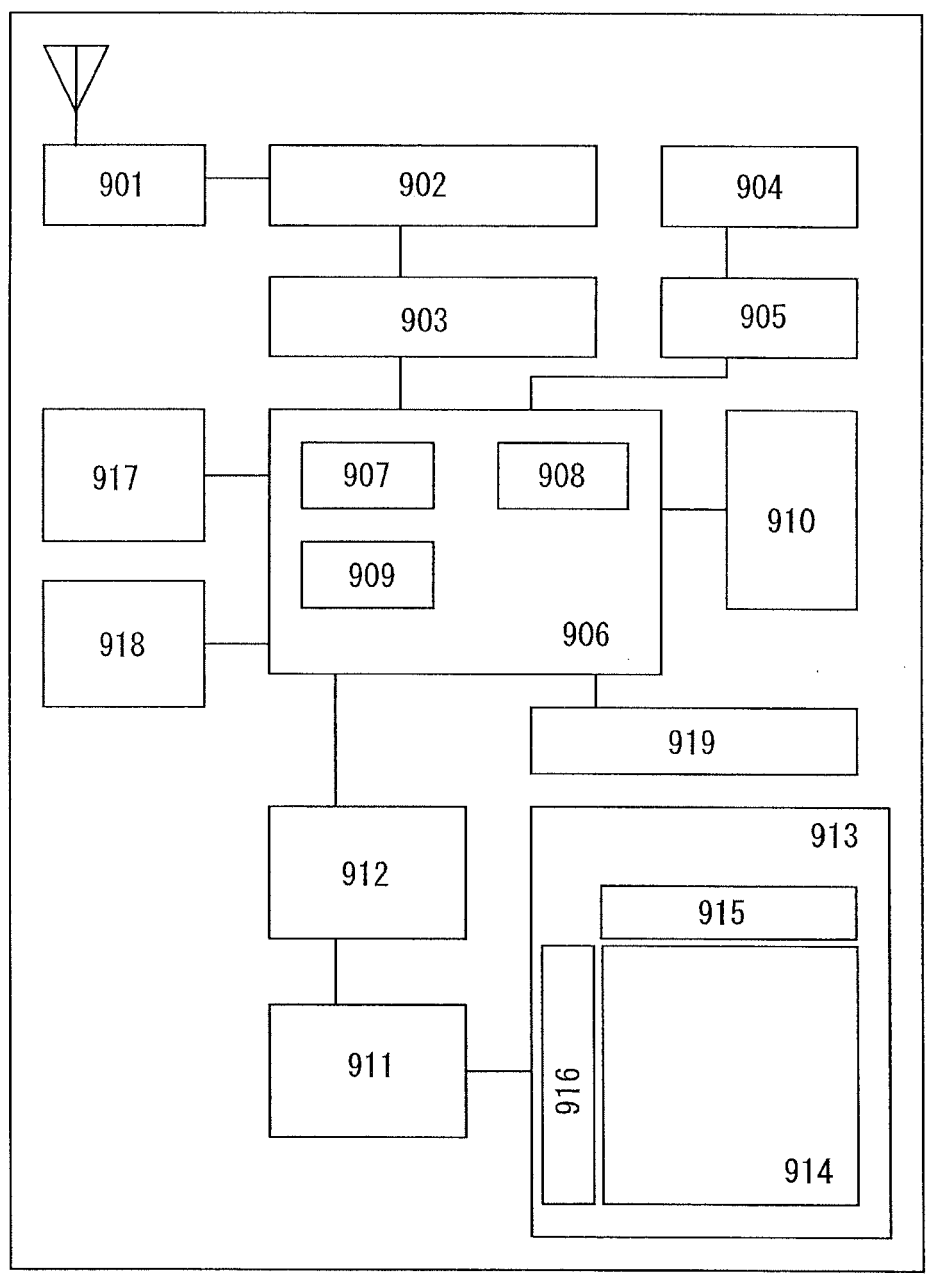
FIG. 19 is a block diagram illustrating one embodiment of a semiconductor device.

Next, a block diagram of a portable device is illustrated in FIG. 19. A portable device illustrated in FIG. 19 includes an RF circuit 901, an analog baseband circuit 902, a digital baseband circuit 903, a battery 904, a power supply circuit 905, an application processor 906, a flash memory 910, a display controller 911, a memory circuit 912, a display 913, a touch sensor 919, an audio circuit 917, a keyboard 918, and the like. The display 913 includes a display portion 914, a source driver 915, and a gate driver 916. The application processor 906 includes a central processing unit (CPU) 907, a DSP 908, and an interface (IF) 909. In general, the memory circuit 912 includes an SRAM or a DRAM; by employing the semiconductor device described in any of the above embodiments for the memory circuit 912, writing and reading of data can be performed at high speed, data can be held for a long time, and power consumption can be sufficiently reduced. Further, the power consumption of the CPU 907 can be sufficiently reduced by employing the semiconductor device described in any of the above embodiments for a main memory device for storing data or an instruction or a buffer memory device capable of high-speed writing and reading of data, such as a register or a cache, which is included in the CPU.

Figure 20:
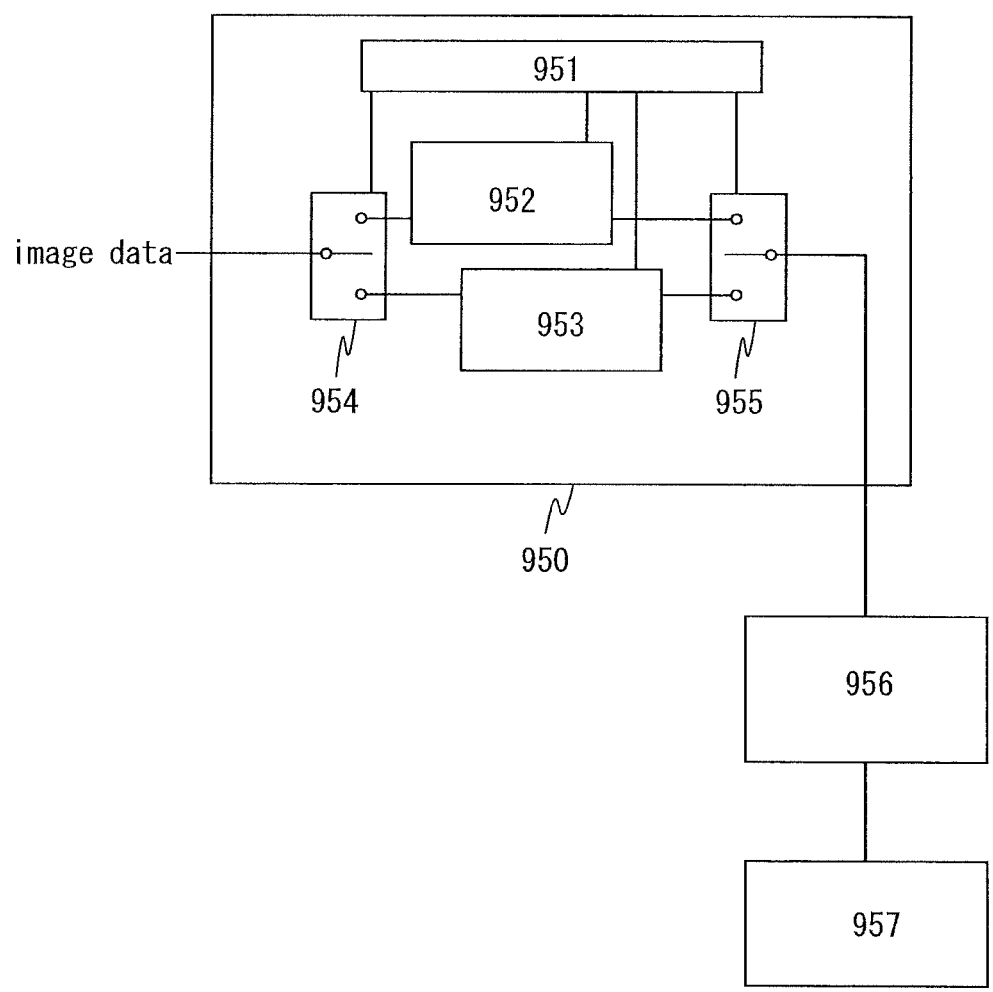
FIG. 20 is a block diagram illustrating one embodiment of a semiconductor device.

Next, FIG. 20 shows an example in which the semiconductor device described in any of the above embodiments is used for a memory circuit 950 in a display. The memory circuit 950 illustrated in FIG. 20 includes a memory 952, a memory 953, a switch 954, a switch 955, and a memory controller 951. Furthermore, the memory circuit is connected to a display controller 956 which reads and controls image data input through a signal line (input image data) and data stored in the memories 952 and 953 (stored image data), and is also connected to a display 957 which displays an image based on a signal input from the display controller 956.

First, image data (input image data A) is formed by an application processor (not shown). The input image data A is stored in the memory 952 though the switch 954. The image data (stored image data A) held in the memory 952 is transmitted and displayed to the display 957 through the switch 955 and the display controller 956.

In the case where the input image data A is not changed, the stored image data A is read from the memory 952 through the switch 955 by the display controller 956 at a frequency of 30 Hz to 60 Hz in general.

Next, for example, when data displayed on the screen is rewritten by a user (that is, in the case where the input image data A is changed), new image data (input image data B) is formed by the application processor. The input image data B is held in the memory 953 through the switch 954. The stored image data A is read periodically from the memory 952 through the switch 955 even during that time. After the completion of storing the new image data (the stored image data B) in the memory 953, from the next frame for the display 957, the stored image data B starts to be read, transmitted to the display 957 through the switch 955 and the display controller 956, and displayed on the display 957. This reading operation is continued until another new image data is held in the memory 952.

By alternately writing and reading image data to and from the memory 952 and the memory 953 as described above, images are displayed on the display 957. Note that the memory 952 and the memory 953 are not limited to separate memories, and a single memory may be divided and used. By employing the semiconductor device described in any of the above embodiments for the memory 952 and the memory 953, data can be written and read at high speed and held for a long time, and power consumption can be sufficiently reduced.

Figure 21:
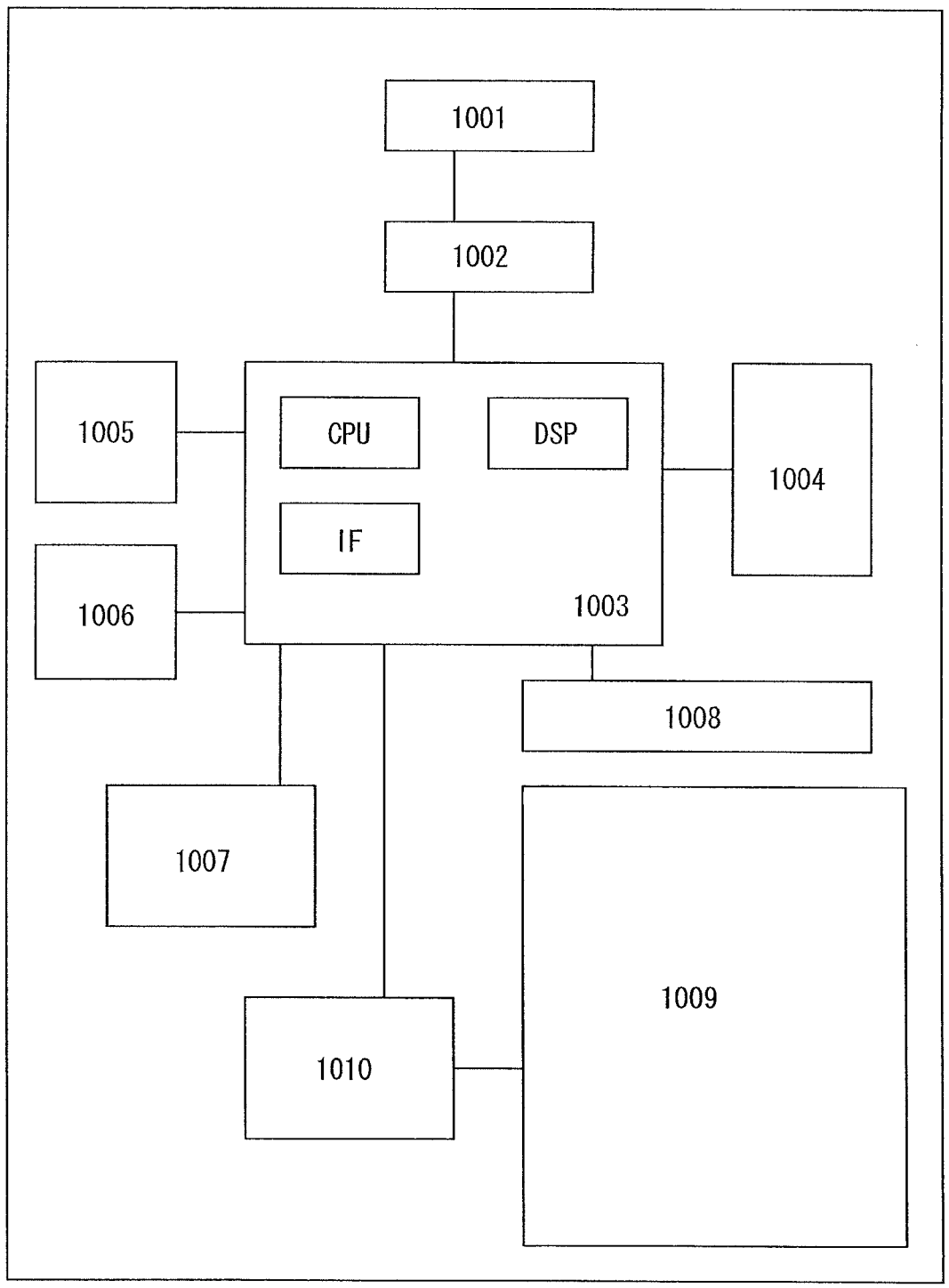
FIG. 21 is a block diagram illustrating one embodiment of a semiconductor device.

Next, FIG. 21 is a block diagram of an e-book reader. FIG. 21 includes a battery 1001, a power supply circuit 1002, a microprocessor 1003, a flash memory 1004, an audio circuit 1005, a keyboard 1006, a memory circuit 1007, a touch panel 1008, a display 1009, and a display controller 1010.

Here, the semiconductor device described in any of the above embodiments can be used for the memory circuit 1007 in FIG. 21. The memory circuit 1007 has a function of temporarily holding the contents of a book. For example, users may use a highlight function. When users read an e-book reader, they sometimes want to mark a specified place. This marking refers to a highlight function, and users can make difference from other places by, for example, changing the color of a letter displayed, underlining a word, making a letter bold, or changing the font type of a letter. That is, there is a function of storing and holding information of a place specified by users. In order to save information for a long time, the information may be copied into the flash memory 1004. Even in such a case, by employing the semiconductor device described in any of the above embodiments, writing and reading of data can be performed at high speed, data can be held for a long time, and power consumption can be sufficiently reduced.

As described above, the semiconductor device in any of the above embodiments is mounted on each of the portable devices described in this embodiment. Therefore, a portable device in which writing and reading of data are performed at high speed, data is held for a long time, and power consumption is sufficiently reduced, can be obtained.

The structures, methods, and the like described in this embodiment can be combined as appropriate with any of the structures, methods, and the like described in the other embodiments.

This application is based on Japanese Patent Application serial no. 2012-024010 filed with Japan Patent Office on Feb. 7, 2012, the entire contents of which are hereby incorporated by reference.

What is claimed is:

1. A method for manufacturing a semiconductor device comprising the steps of:
    forming an oxide semiconductor film over an oxide insulating film;
    forming a film over the oxide semiconductor film;
    adding oxygen to the film;
    forming a gate electrode over the film;
    forming an first insulating film comprising an aluminum oxide over the oxide semiconductor film, the film added the oxygen, and the gate electrode;
    etching the first insulating film to form a sidewall in contact with side surfaces of the gate electrode and to expose portions of the oxide semiconductor film; and
    forming a second insulating film comprising silicon nitride over the gate electrode, the sidewall, and the exposed oxide semiconductor film.

2. The method for manufacturing the semiconductor device, according to claim 1,
    wherein the film is metal film, and
    wherein a material of the metal film is one of aluminum, gallium, hafnium, and yttrium.

3. The method for manufacturing the semiconductor device, according to claim 1,
    wherein the film is a first oxide insulating film and a metal film over the first oxide insulating film, and
    wherein a material of the metal film is one of aluminum, gallium, hafnium, and yttrium.

4. The method for manufacturing the semiconductor device, according to claim 1, wherein oxygen is added to the oxide semiconductor film when the step of adding oxygen to the film is performed.

5. The method for manufacturing the semiconductor device, according to claim 1, wherein the step of adding oxygen to the film is performed by one of an ion implantation method, an ion doping method, a plasma immersion ion implantation method, and plasma treatment.

6. The method for manufacturing the semiconductor device, according to claim 1, wherein the oxide semiconductor film comprises one or more elements selected from In, Ga, Sn, and Zn.

7. The method for manufacturing the semiconductor device, according to claim 1, further comprising the steps of:
forming a transistor over a semiconductor substrate;
forming a planarization insulating film over the transistor;
forming a first wiring electrically connected to the transistor through an opening in the planarization insulating film;
forming the oxide insulating film over the planarization insulating film and the first wiring; and
electrically connecting the first wiring to the oxide semiconductor film by a second wiring.

8. The method for manufacturing the semiconductor device, according to claim 1, wherein the semiconductor device is a central processing unit, a microprocessor, a random access memory, a converter, a power transistor, a thyristor, an image sensor, an electro-optical device, or a light-emitting display device.

9. A method for manufacturing a semiconductor device comprising the steps of:
forming an oxide semiconductor film over an oxide insulating film;
forming a film over the oxide semiconductor film;
adding oxygen to the film;
forming a gate electrode over the film;
adding dopants to the oxide semiconductor film with use of the gate electrode as a mask to form low-resistance regions in the oxide semiconductor film;
forming an first insulating film comprising an aluminum oxide over the oxide semiconductor film, the film added the oxygen, and the gate electrode;
etching the first insulating film to form a sidewall in contact with side surfaces of the gate electrode and to expose portions of the oxide semiconductor film; and
forming a second insulating film comprising silicon nitride over the gate electrode, the sidewall, and the exposed oxide semiconductor film.

10. The method for manufacturing the semiconductor device, according to claim 9,
wherein the film is metal film, and
wherein a material of the metal film is one of aluminum, gallium, hafnium, and yttrium.

11. The method for manufacturing the semiconductor device, according to claim 9,
wherein the film is a first oxide insulating film and a metal film over the first oxide insulating film, and
wherein a material of the metal film is one of aluminum, gallium, hafnium, and yttrium.

12. The method for manufacturing the semiconductor device, according to claim 9, wherein oxygen is added to the oxide semiconductor film when the step of adding oxygen to the film is performed.

13. The method for manufacturing the semiconductor device, according to claim 9, wherein the step of adding oxygen to the film is performed by one of an ion implantation method, an ion doping method, a plasma immersion ion implantation method, and plasma treatment.

14. The method for manufacturing the semiconductor device, according to claim 9, wherein the oxide semiconductor film comprises one or more elements selected from In, Ga, Sn, and Zn.

15. The method for manufacturing the semiconductor device, according to claim 9, further comprising the steps of:
forming a transistor over a semiconductor substrate;
forming a planarization insulating film over the transistor;
forming a first wiring electrically connected to the transistor through an opening in the planarization insulating film;
forming the oxide insulating film over the planarization insulating film and the first wiring; and
electrically connecting the first wiring to the oxide semiconductor film by a second wiring.

16. The method for manufacturing the semiconductor device, according to claim 9, wherein the semiconductor device is a central processing unit, a microprocessor, a random access memory, a converter, a power transistor, a thyristor, an image sensor, an electro-optical device, or a light-emitting display device.

17. The method for manufacturing the semiconductor device, according to claim 9, wherein the dopants are at least one of helium, neon, argon, krypton, and xenon.

18. A method for manufacturing a semiconductor device comprising the steps of:
forming an oxide semiconductor film over an oxide insulating film;
forming a film over the oxide semiconductor film;
adding oxygen to the film;
etching the film to expose portions of the oxide semiconductor film;
forming a gate electrode over the film; and
forming an insulating film over the gate electrode and the exposed oxide semiconductor film,
wherein the insulating film is in contact with the exposed oxide semiconductor film.

19. The method for manufacturing the semiconductor device, according to claim 18,
wherein the film is metal film, and
wherein a material of the metal film is one of aluminum, gallium, hafnium, and yttrium.

20. The method for manufacturing the semiconductor device, according to claim 18,
wherein the film is a first oxide insulating film and a metal film over the first oxide insulating film, and
wherein a material of the metal film is one of aluminum, gallium, hafnium, and yttrium.

21. The method for manufacturing the semiconductor device, according to claim 18, wherein oxygen is added to the oxide semiconductor film when the step of adding oxygen to the film is performed.

22. The method for manufacturing the semiconductor device, according to claim 18, wherein the step of adding oxygen to the film is performed by one of an ion implantation method, an ion doping method, a plasma immersion ion implantation method, and plasma treatment.

23. The method for manufacturing the semiconductor device, according to claim 18, wherein the oxide semiconductor film comprises one or more elements selected from In, Ga, Sn, and Zn.

24. The method for manufacturing the semiconductor device, according to claim 18, wherein the insulating film comprises silicon nitride.

25. The method for manufacturing the semiconductor device, according to claim 18, wherein the step of etching the film is performed after the step of forming the gate electrode.

* * * * *